(12) United States Patent
Kubo et al.

(10) Patent No.: US 12,094,943 B2
(45) Date of Patent: Sep. 17, 2024

(54) THREE-DIMENSIONAL MEMORY DEVICE INCLUDING HAMMERHEAD-SHAPED WORD LINES AND METHODS OF MANUFACTURING THE SAME

(71) Applicant: SANDISK TECHNOLOGIES LLC, Addison, TX (US)

(72) Inventors: Tomohiro Kubo, Yokkaichi (JP); Yuki Kasai, Kuwana (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 381 days.

(21) Appl. No.: 17/587,518

(22) Filed: Jan. 28, 2022

(65) Prior Publication Data
US 2023/0246085 A1    Aug. 3, 2023

(51) Int. Cl.
*H01L 21/00* (2006.01)
*H01L 21/28* (2006.01)
*H01L 29/423* (2006.01)
*H10B 43/27* (2023.01)

(52) U.S. Cl.
CPC .... *H01L 29/4234* (2013.01); *H01L 29/40117* (2019.08); *H10B 43/27* (2023.02)

(58) Field of Classification Search
CPC ........... H01L 29/4234; H01L 29/40117; H10B 43/27
See application file for complete search history.

(56) References Cited

U.S. PATENT DOCUMENTS

| | | | |
|---|---|---|---|
| 8,658,499 B2 | 2/2014 | Makala et al. | |
| 9,356,031 B2 | 5/2016 | Lee et al. | |
| 9,397,093 B2 | 7/2016 | Makala et al. | |
| 9,419,012 B1 | 8/2016 | Shimabukuro et al. | |
| 9,576,975 B2 | 2/2017 | Zhang et al. | |
| 9,613,977 B2 | 4/2017 | Sharangpani et al. | |
| 9,659,955 B1 | 5/2017 | Sharangpani et al. | |
| 9,659,956 B1 | 5/2017 | Pachamuthu et al. | |

(Continued)

OTHER PUBLICATIONS

Rajashekhar, A. et al., "Three-Dimensional Memory Device Including Hammerhead-Shaped Word Lines and Methods of Manufacturing the Same," U.S. Appl. No. 17/587,470, filed Jan. 28, 2022.

(Continued)

*Primary Examiner* — Richard A Booth
(74) *Attorney, Agent, or Firm* — THE MARBURY LAW GROUP PLLC

(57) ABSTRACT

A semiconductor structure includes an alternating stack of insulating layers and electrically conductive layers, a memory opening vertically extending through the alternating stack, and a memory opening fill structure located in the memory opening and including a vertical semiconductor channel, a memory film in contact with the vertical semiconductor channel, and a vertical stack of tubular dielectric spacers laterally surrounding the memory film. The tubular dielectric spacers may include tubular graded silicon oxynitride portions having a composition gradient such that an atomic concentration of nitrogen decreases with a lateral distance from an outer sidewall of the memory film, or may include tubular composite dielectric spacers including a respective tubular silicon oxide spacer and a respective tubular dielectric metal oxide spacer. Each of the electrically conductive layers has a hammerhead-shaped vertical cross-sectional profile.

14 Claims, 50 Drawing Sheets

(56) References Cited

U.S. PATENT DOCUMENTS

| | | | |
|---|---|---|---|
| 9,691,884 | B2 | 6/2017 | Makala et al. |
| 9,875,929 | B1 | 1/2018 | Shukla et al. |
| 9,893,081 | B1 | 2/2018 | Kanakamedala et al. |
| 10,283,513 | B1 | 5/2019 | Zhou et al. |
| 10,373,969 | B2 | 8/2019 | Zhang et al. |
| 10,438,964 | B2 | 10/2019 | Makala et al. |
| 10,516,025 | B1 | 12/2019 | Nishikawa et al. |
| 10,804,282 | B2 | 10/2020 | Baraskar et al. |
| 10,861,869 | B2 | 12/2020 | Nakamura et al. |
| 10,998,331 | B2 | 5/2021 | Zhou et al. |
| 11,049,807 | B2 | 6/2021 | Li et al. |
| 11,101,289 | B1 | 8/2021 | Ueda et al. |
| 11,114,462 | B1 | 9/2021 | Cui et al. |
| 11,177,280 | B1 | 11/2021 | Rajashekhar et al. |
| 2013/0252391 | A1 | 9/2013 | Lee et al. |
| 2014/0225181 | A1 | 8/2014 | Makala et al. |
| 2016/0043093 | A1 | 2/2016 | Lee et al. |
| 2016/0086972 | A1 | 3/2016 | Zhang et al. |
| 2016/0379989 | A1 | 12/2016 | Sharangpani et al. |
| 2017/0125436 | A1 | 5/2017 | Sharangpani et al. |
| 2018/0040627 | A1 | 2/2018 | Kanakamedala et al. |
| 2018/0374866 | A1 | 12/2018 | Makala et al. |
| 2019/0139973 | A1 | 5/2019 | Zhou et al. |
| 2019/0214395 | A1 | 7/2019 | Zhang et al. |
| 2019/0386108 | A1 | 12/2019 | Nishikawa et al. |
| 2020/0006375 | A1 | 1/2020 | Zhou et al. |
| 2020/0020715 | A1 | 1/2020 | Nakamura et al. |
| 2020/0388627 | A1 | 12/2020 | Hopkins et al. |
| 2021/0143171 | A1 | 5/2021 | Kim et al. |
| 2021/0159167 | A1 | 5/2021 | Tsutsumi et al. |
| 2021/0265372 | A1 | 8/2021 | Kanakamedala et al. |
| 2021/0265385 | A1 | 8/2021 | Rajashekhar et al. |
| 2021/0327889 | A1 | 10/2021 | Makala et al. |
| 2021/0327890 | A1 | 10/2021 | Makala et al. |
| 2021/0327897 | A1 | 10/2021 | Kasai et al. |
| 2021/0335805 | A1 | 10/2021 | Kai et al. |
| 2021/0335999 | A1 | 10/2021 | Kai et al. |
| 2023/0034157 | A1* | 2/2023 | Kim ............... H10B 43/27 |
| 2023/0246084 | A1* | 8/2023 | Rajashekhar ........ H10B 41/27 257/324 |

OTHER PUBLICATIONS

Gaind, A.K. et al., "Physicochemical Properties of CVD Silicon Oxynitride from a SiH4—CO2—NH3—H2 System," J. Electrochem. Soc., vol. 125, No. 1, pp. 139-145, (1978).

Notification of Transmittal of the International Search Report and Written Opinion of the International Searching Authority for International Patent Application No. PCT/US2022/030506, mailed Oct. 27, 2022, 10 pages.

Endoh et al., "Novel Ultra High-Density Memory with a Stacked-Surrounding Gate Transistor (S-SGT) Structured Cell," IEDM Proc. (2001) 33-36.

U.S. Appl. No. 17/064,834, filed Oct. 7, 2020, SanDisk Technologies LLC.

U.S. Appl. No. 17/169,987, filed Feb. 8, 2021, SanDisk Technologies LLC.

U.S. Appl. No. 17/189,153, filed Mar. 1, 2021, SanDisk Technologies LLC.

U.S. Appl. No. 17/192,463, filed Mar. 4, 2021, SanDisk Technologies LLC.

U.S. Appl. No. 17/192,603, filed Mar. 4, 2021, SanDisk Technologies LLC.

U.S. Appl. No. 17/192,668, filed Mar. 4, 2021, SanDisk Technologies LLC.

U.S. Appl. No. 17/244,186, filed Apr. 29, 2021, SanDisk Technologies LLC.

U.S. Appl. No. 17/345,831, filed Jun. 11, 2021, SanDisk Technologies LLC.

U.S. Appl. No. 17/345,860, filed Jun. 11, 2021, SanDisk Technologies LLC.

U.S. Appl. No. 17/351,756, filed Jun. 18, 2021, SanDisk Technologies LLC.

U.S. Appl. No. 17/351,789, filed Jun. 18, 2021, SanDisk Technologies LLC.

U.S. Appl. No. 17/351,811, filed Jun. 18, 2021, SanDisk Technologies LLC.

U.S. Appl. No. 17/378,196, filed Jul. 16, 2021, SanDisk Technologies LLC.

U.S. Appl. No. 17/406,493, filed Aug. 19, 2021, SanDisk Technologies LLC.

U.S. Appl. No. 17/523,418, filed Nov. 10, 2021, SanDisk Technologies LLC.

U.S. Appl. No. 17/523,447, filed Nov. 10, 2021, SanDisk Technologies LLC.

U.S. Appl. No. 17/523,487, filed Nov. 10, 2021, SanDisk Technologies LLC.

U.S. Appl. No. 17/543,987, filed Dec. 7, 2021, SanDisk Technologies LLC.

* cited by examiner

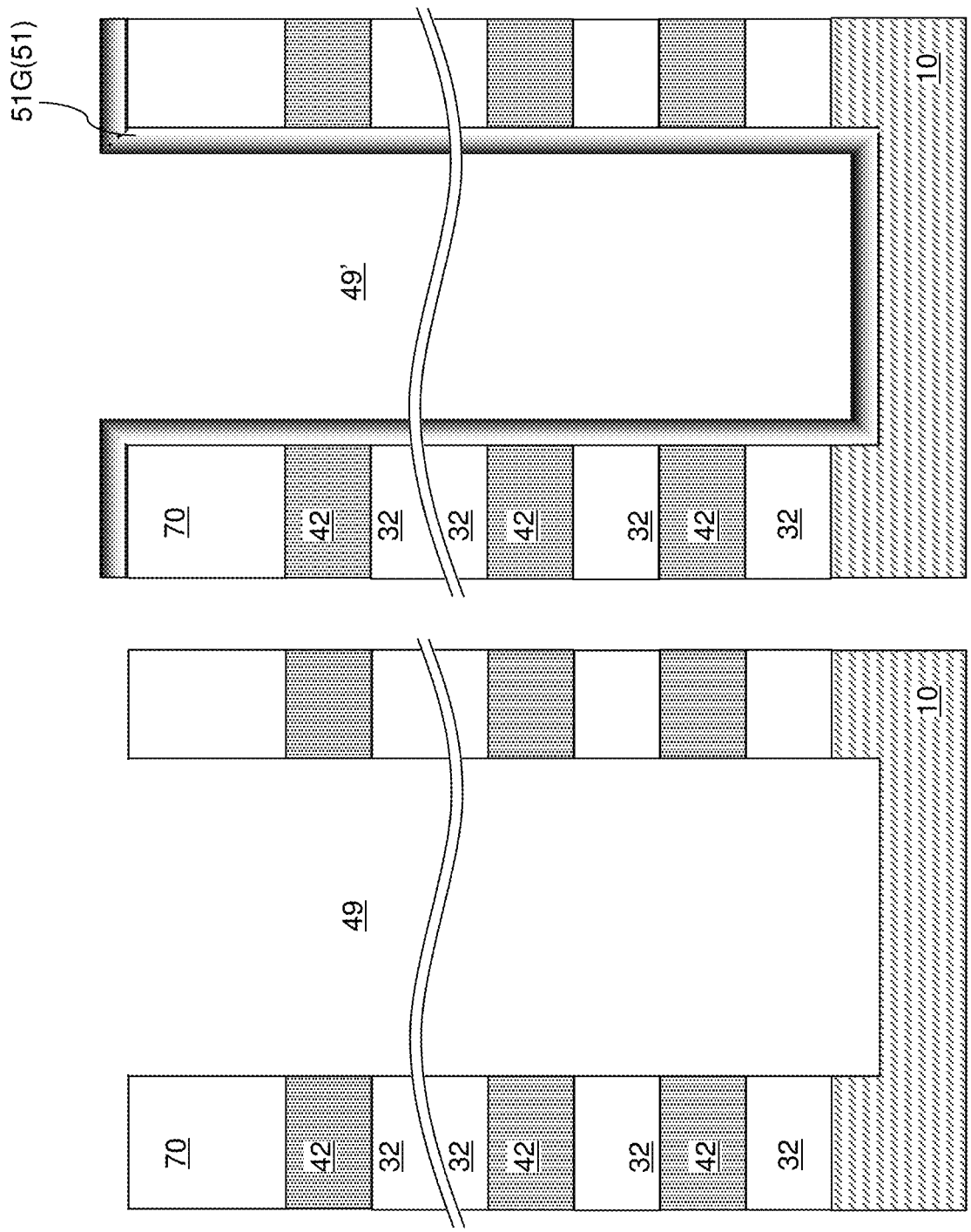

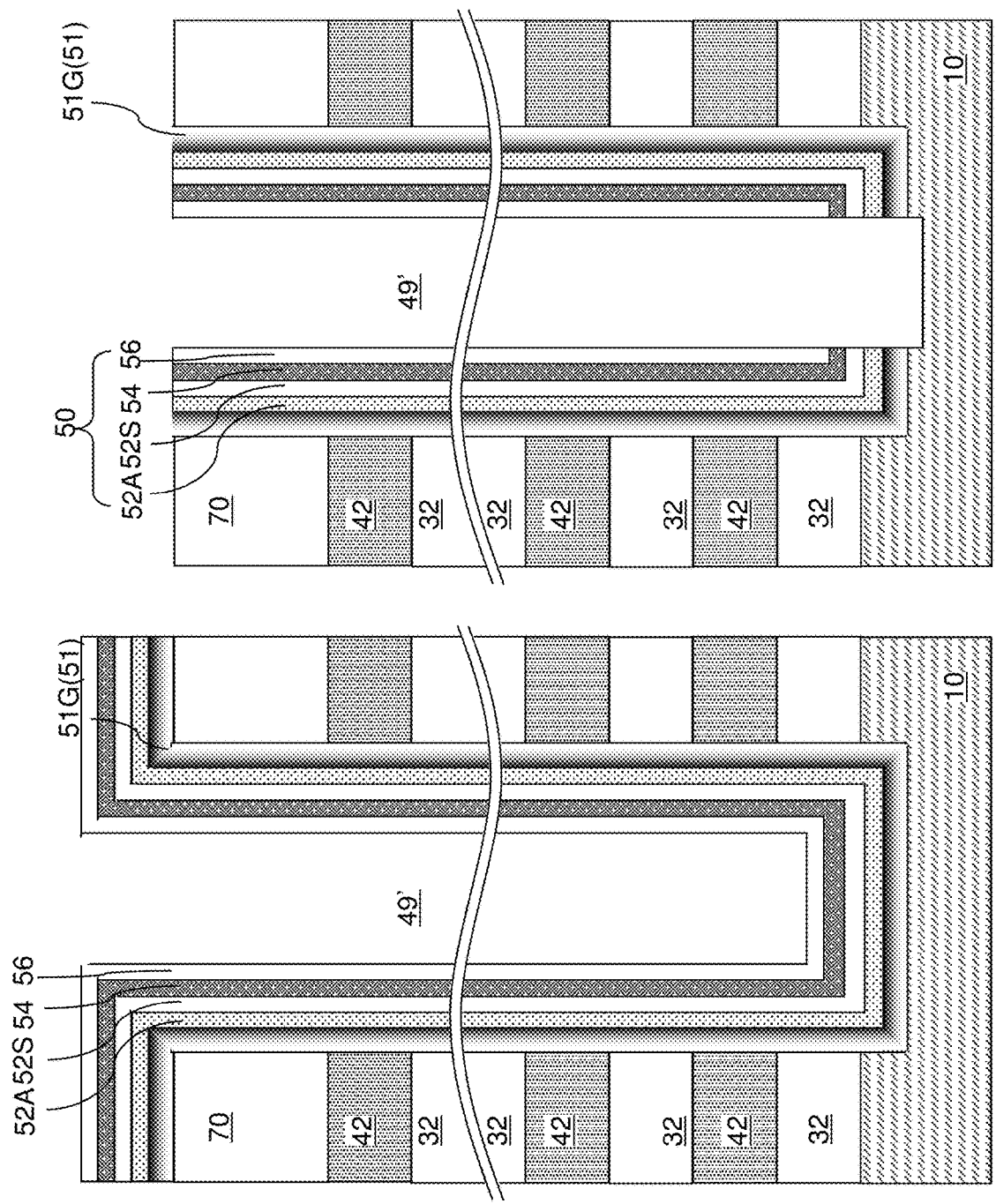

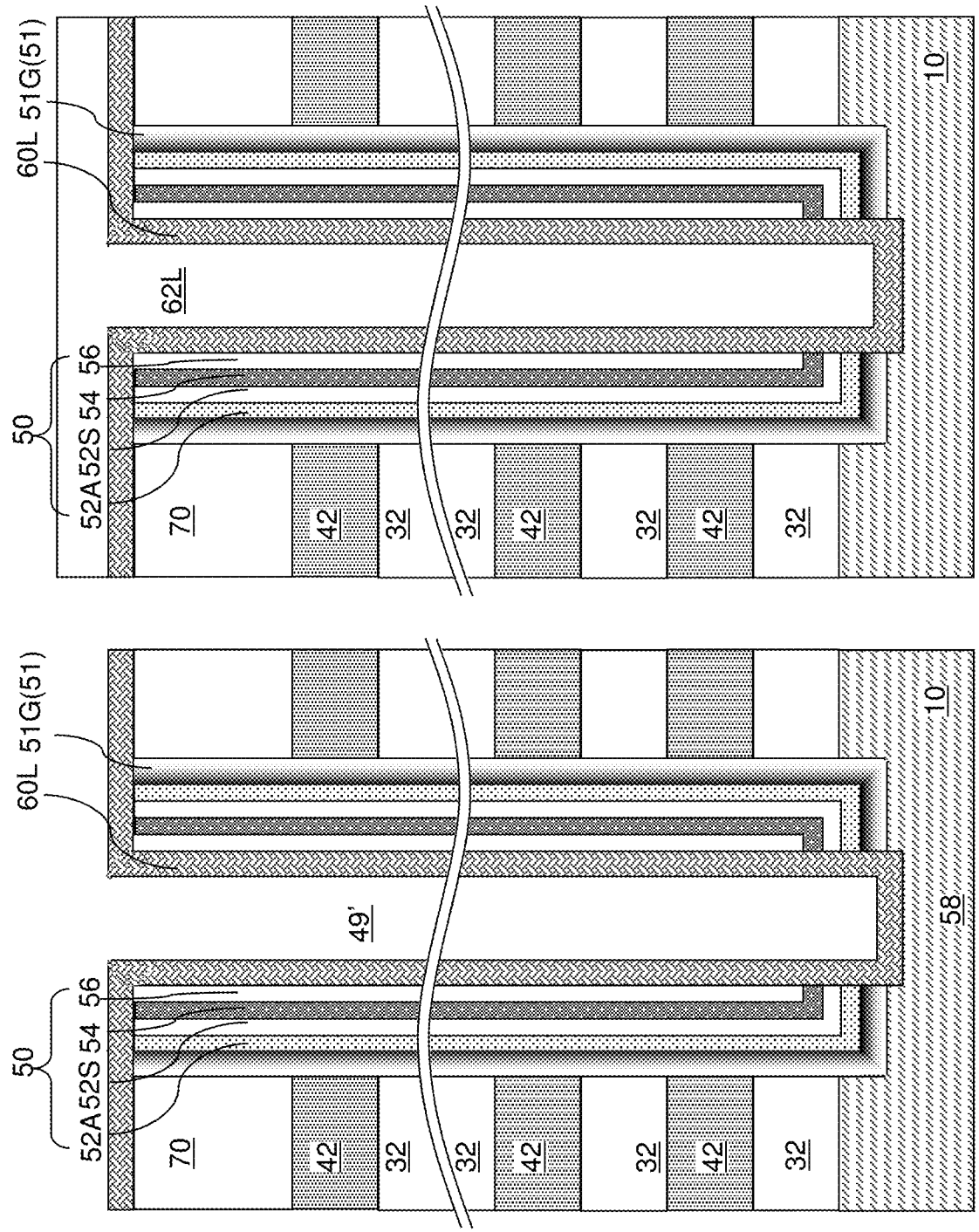

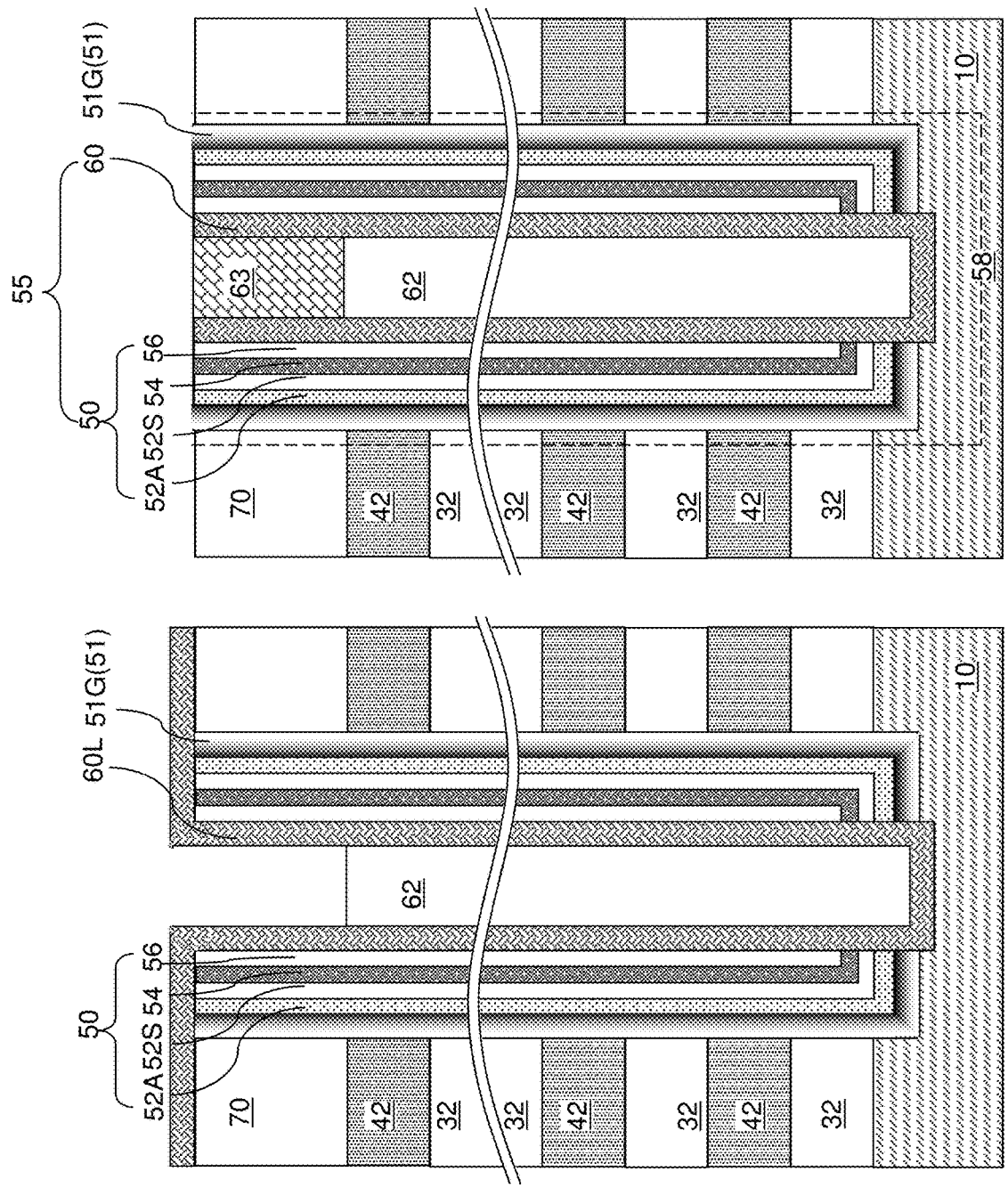

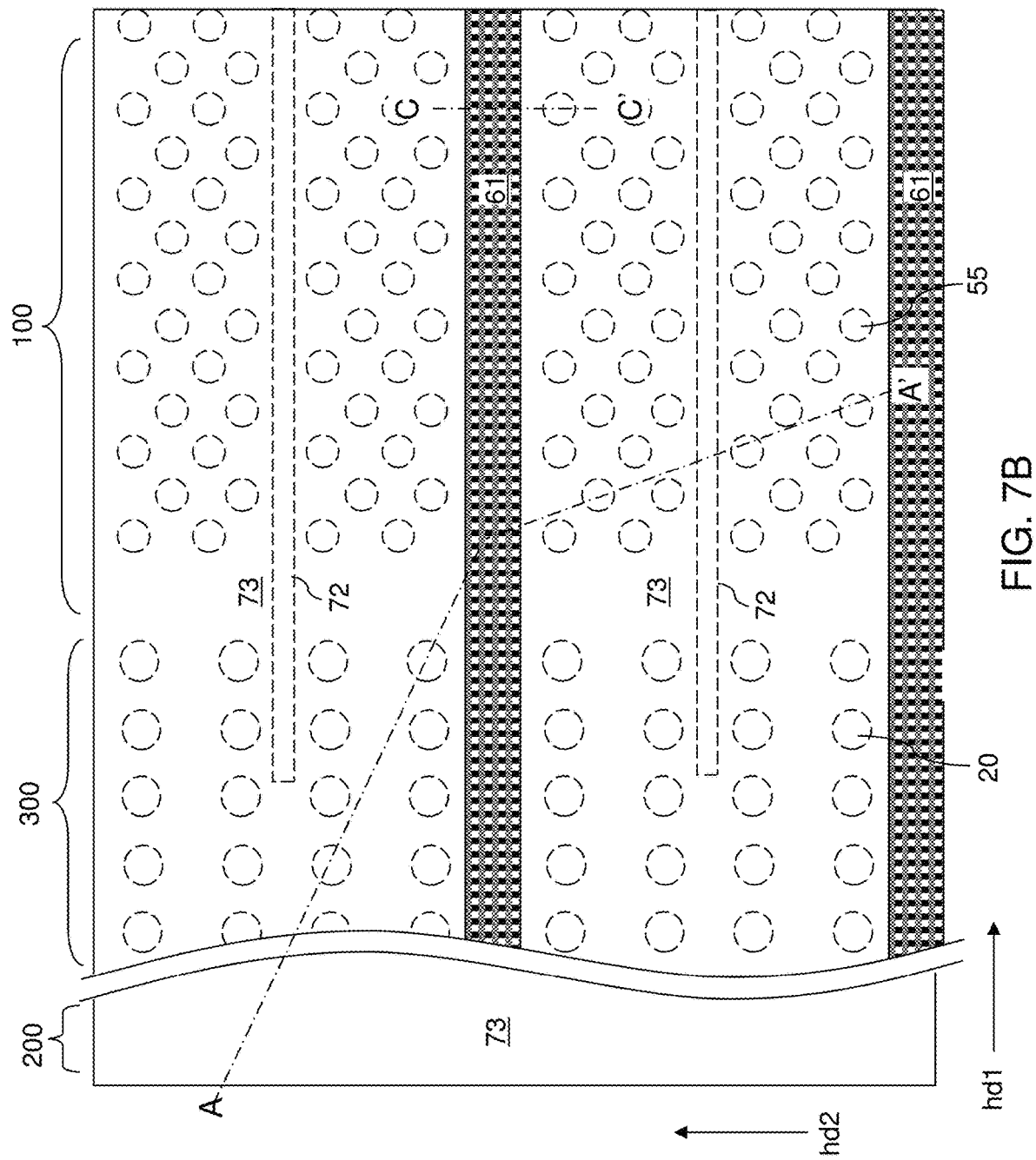

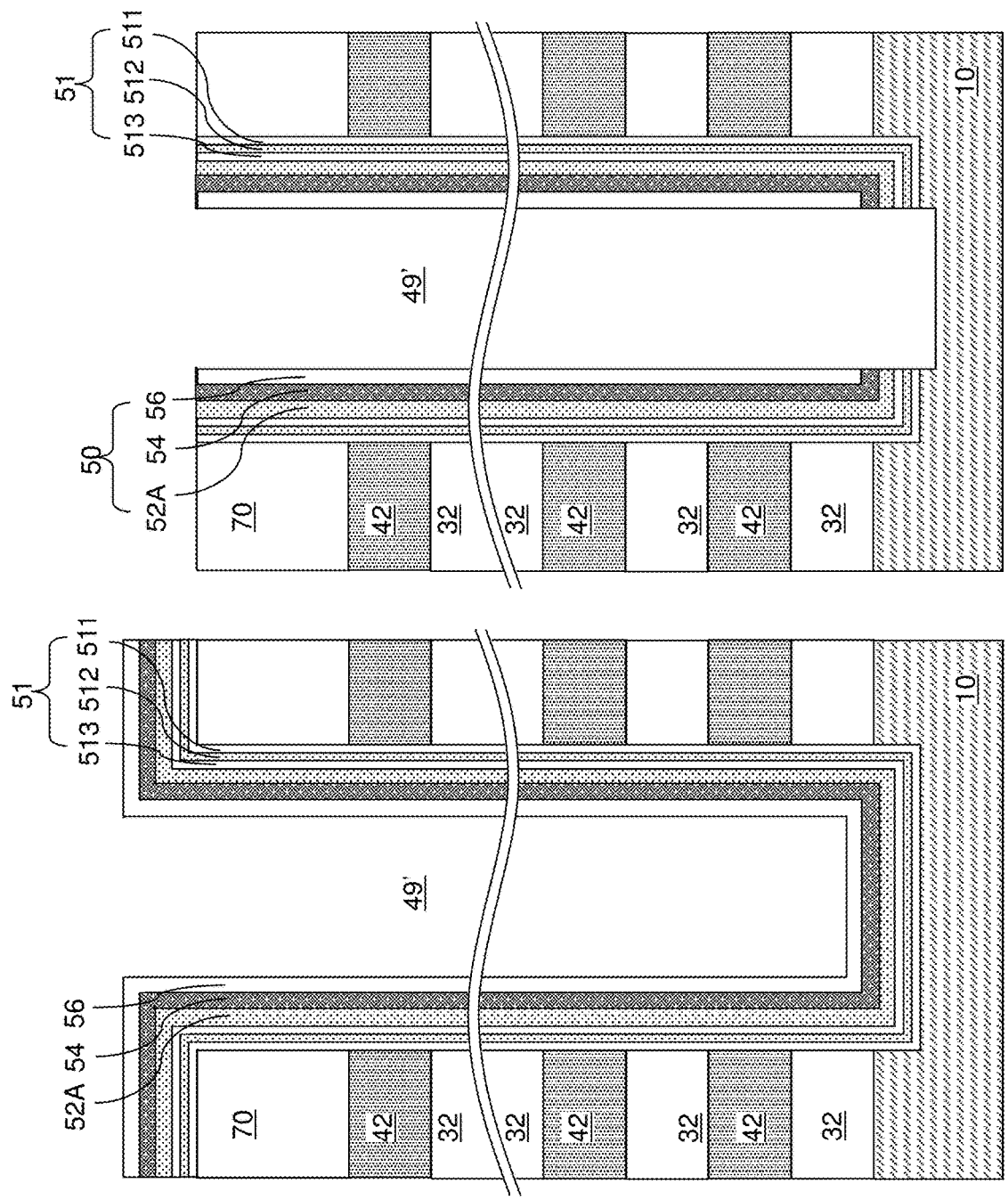

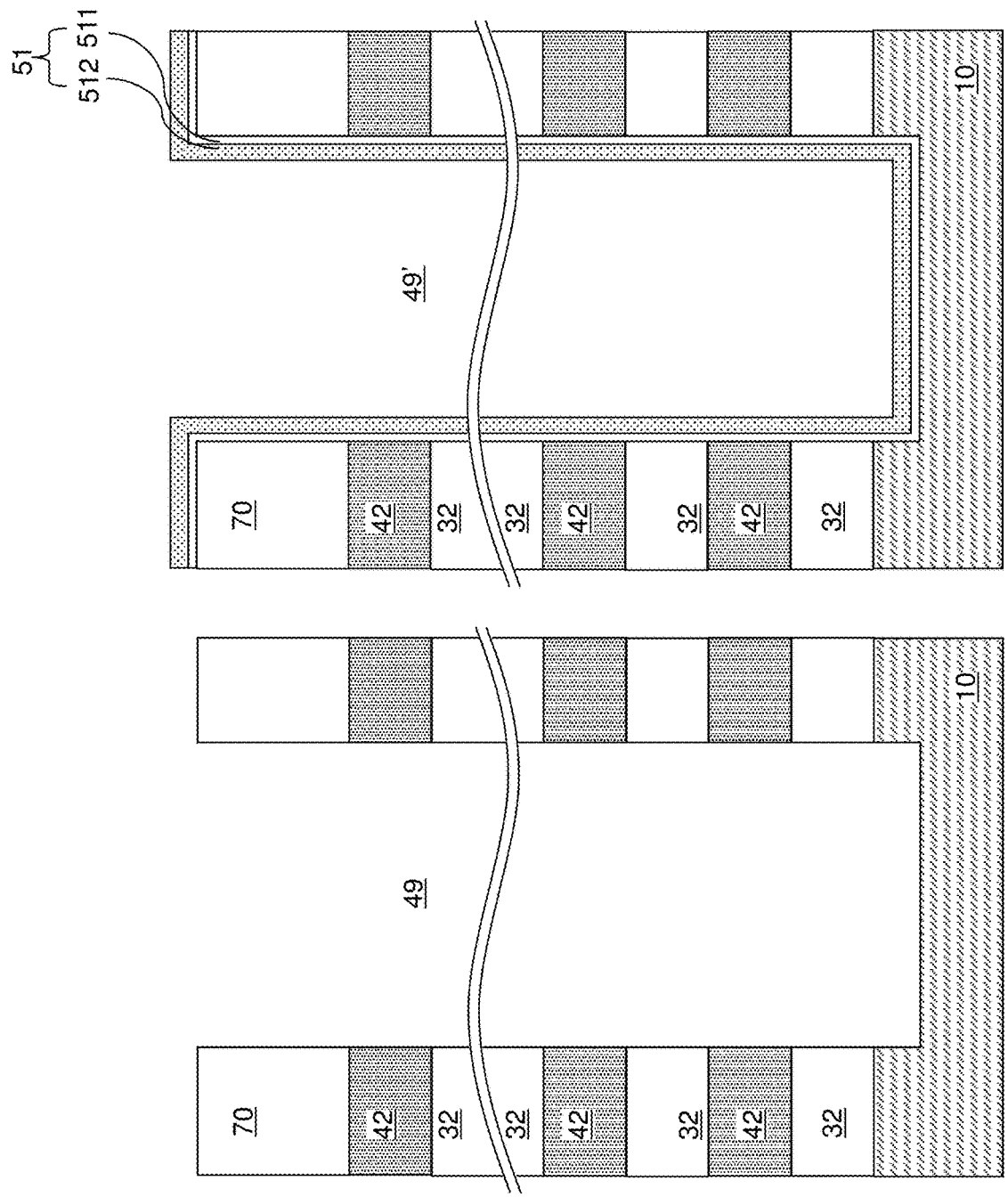

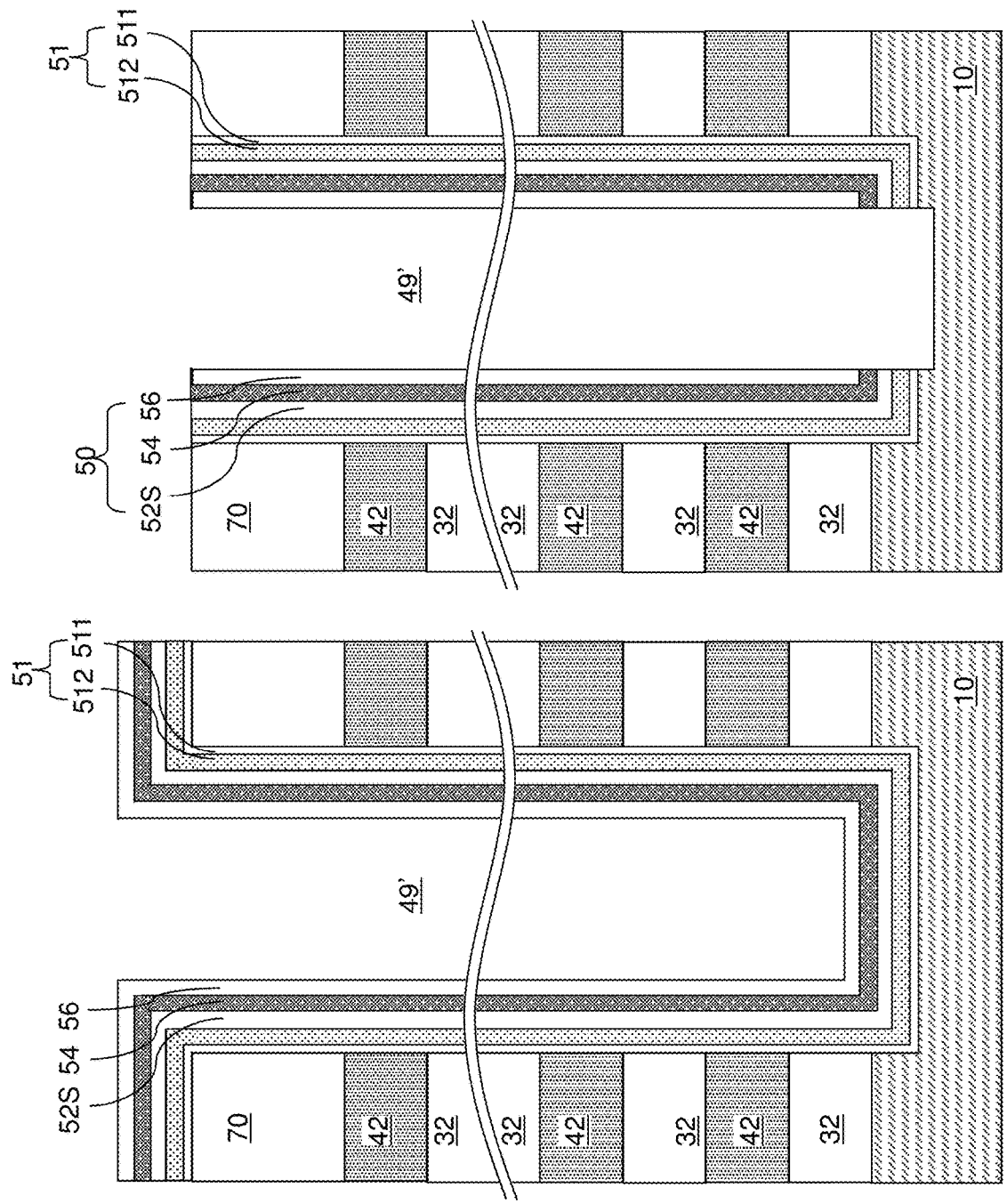

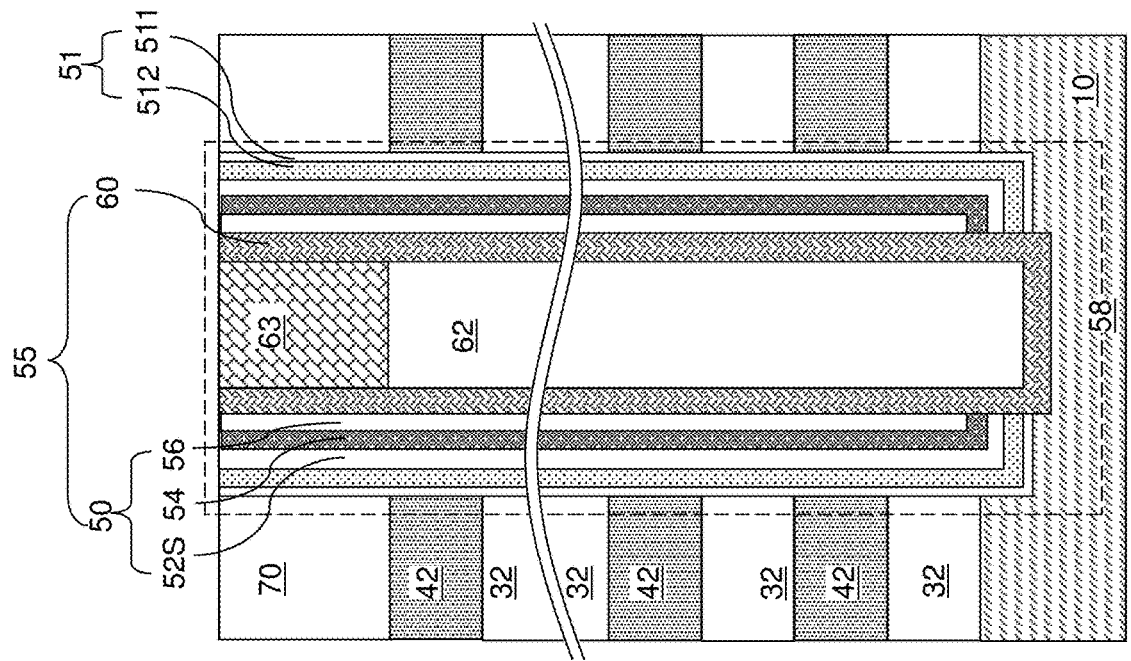
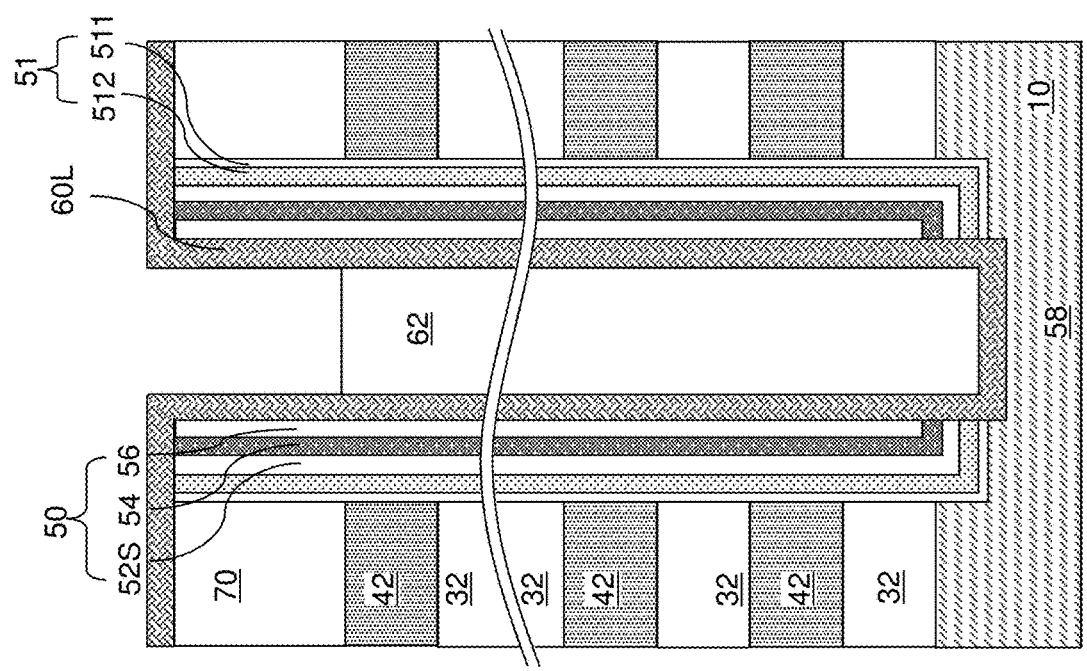

THREE-DIMENSIONAL MEMORY DEVICE INCLUDING HAMMERHEAD-SHAPED WORD LINES AND METHODS OF MANUFACTURING THE SAME

FIELD

The present disclosure relates generally to the field of semiconductor devices, and particularly to a three-dimensional memory device including hammerhead-shaped word lines and methods of manufacturing the same.

BACKGROUND

Three-dimensional vertical NAND strings having one bit per cell are disclosed in an article by T. Endoh et al., titled "Novel Ultra High-Density Memory with A Stacked-Surrounding Gate Transistor (S-SGT) Structured Cell", IEDM Proc. (2001) 33-36. The shaped of word lines adjacent to memory stack structures can affect performance of a three-dimensional memory array.

SUMMARY

According to an aspect of the present disclosure, a semiconductor structure is provided, which comprises: an alternating stack of insulating layers and electrically conductive layers; a memory opening vertically extending through the alternating stack; and a memory opening fill structure located in the memory opening and comprising a vertical semiconductor channel, a memory film in contact with the vertical semiconductor channel, and a vertical stack of tubular graded silicon oxynitride portions laterally surrounding the memory film and having a composition gradient such that an atomic concentration of nitrogen decreases with a lateral distance from an outer sidewall of the memory film. Each of the electrically conductive layers has a hammerhead-shaped vertical cross-sectional profile such that a vertical extent of each of the electrically conductive layers has a local minimum within a cylindrical volume laterally bounded by outer sidewall segments of the memory opening fill structure.

According to another aspect of the present disclosure, a method of forming a semiconductor structure, which comprises: forming an alternating stack of insulating layers and sacrificial material layers over a substrate; forming a memory opening through the alternating stack; forming a memory opening fill structure located in the memory opening, wherein the memory opening fill structure comprises a graded silicon oxynitride layer, a memory film, and a vertical semiconductor channel; forming backside recesses by removing the sacrificial material layers selective to the insulating layers and the graded silicon oxynitride layer; performing a first isotropic etch process that etches silicon oxide at a higher etch rate than silicon nitride, and a second isotropic etch process that etches silicon nitride at a higher etch rate than silicon oxide, whereby the backside recesses are expanded through the composite dielectric spacer layer around the memory film; and forming electrically conductive layers in the backside recesses.

According to yet another aspect of the present disclosure, a semiconductor structure is provided, which comprises: an alternating stack of insulating layers and electrically conductive layers; a memory opening vertically extending through the alternating stack; and a memory opening fill structure located in the memory opening and comprising a vertical semiconductor channel, a memory film in contact with the vertical semiconductor channel, and a vertical stack of tubular composite dielectric spacers laterally surrounding the memory film, wherein: each of the tubular composite dielectric spacers comprises a respective tubular silicon oxide spacer and a respective tubular dielectric metal oxide spacer; and each of the electrically conductive layers has a hammerhead-shaped vertical cross-sectional profile such that a vertical extent of each of the electrically conductive layers has a local minimum within a cylindrical volume laterally bounded by outer sidewall segments of the memory opening fill structure.

According to still another aspect of the present disclosure, a method of forming a semiconductor structure is provided. The method comprises: forming an alternating stack of insulating layers and sacrificial material layers over a substrate; forming a memory opening through the alternating stack; forming a memory opening fill structure located in the memory opening, wherein the memory opening fill structure comprises a composite dielectric spacer layer, a memory film, and a vertical semiconductor channel, the composite dielectric spacer layer comprising a stack of a silicon oxide spacer layer and a dielectric metal oxide spacer layer; forming backside recesses by removing the sacrificial material layers selective to the insulating layers and the composite dielectric spacer layer; performing a first isotropic etch process that etches portions of the silicon oxide spacer layer around the backside recesses, and a second isotropic etch process that etches portions of the dielectric metal oxide spacer layer around the backside recesses, whereby the backside recesses are expanded into the composite dielectric spacer layer around the memory film; and forming electrically conductive layers in the backside recesses.

BRIEF DESCRIPTION OF THE DRAWINGS

FIGS. 5A-5H are sequential schematic vertical cross-sectional views of a memory opening within the first exemplary structure during formation of a memory opening fill structure therein according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIGS. 15A-15H are sequential schematic vertical cross-sectional views of a memory opening within a second exemplary structure during formation of a memory opening fill structure therein according to a second embodiment of the present disclosure.

FIGS. 17A-17H are sequential schematic vertical cross-sectional views of a memory opening within a third exemplary structure during formation of a memory opening fill structure therein according to a third embodiment of the present disclosure.

DETAILED DESCRIPTION

Figure 1:
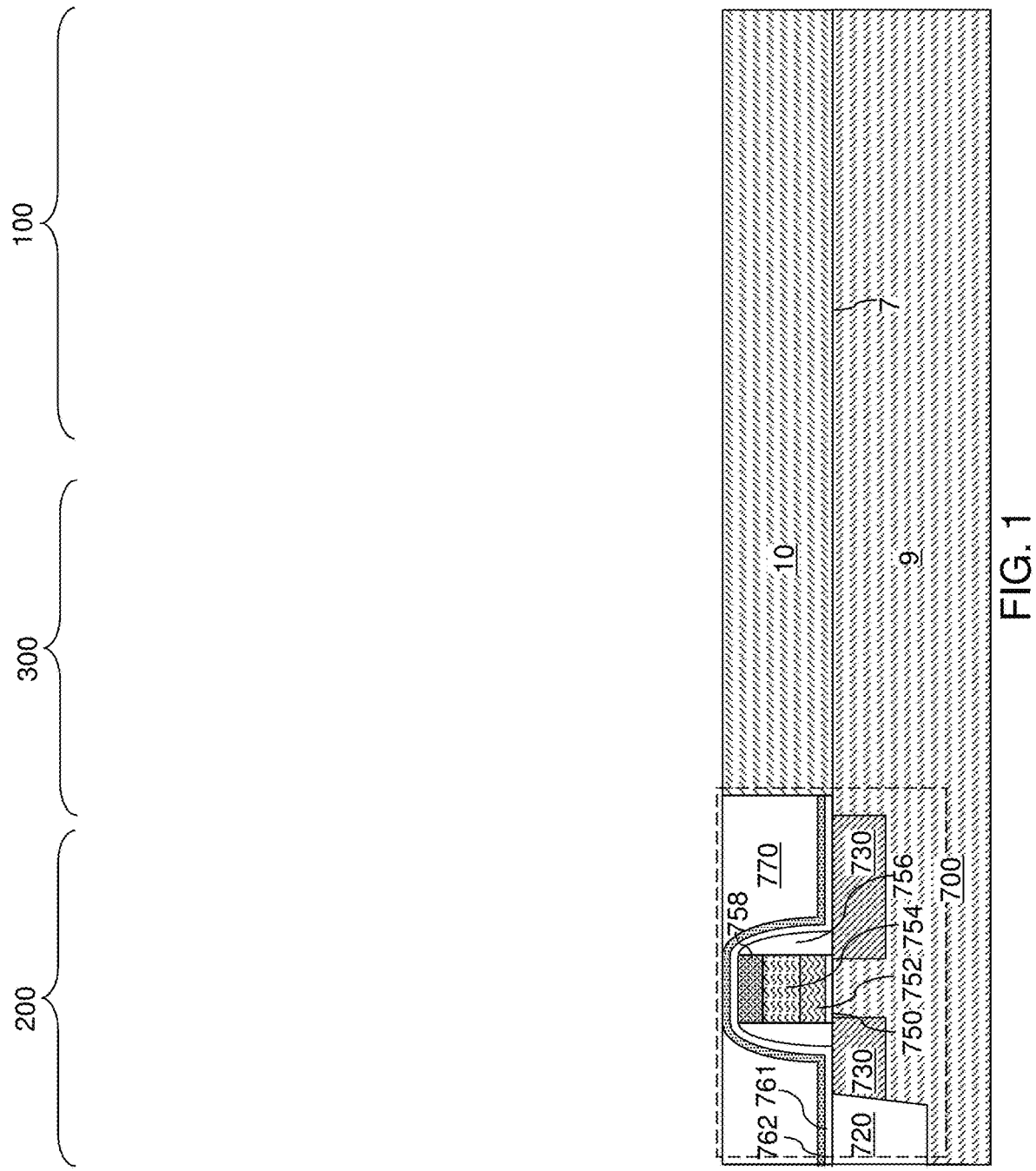
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices including hammerhead-shaped word lines and methods of making thereof, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
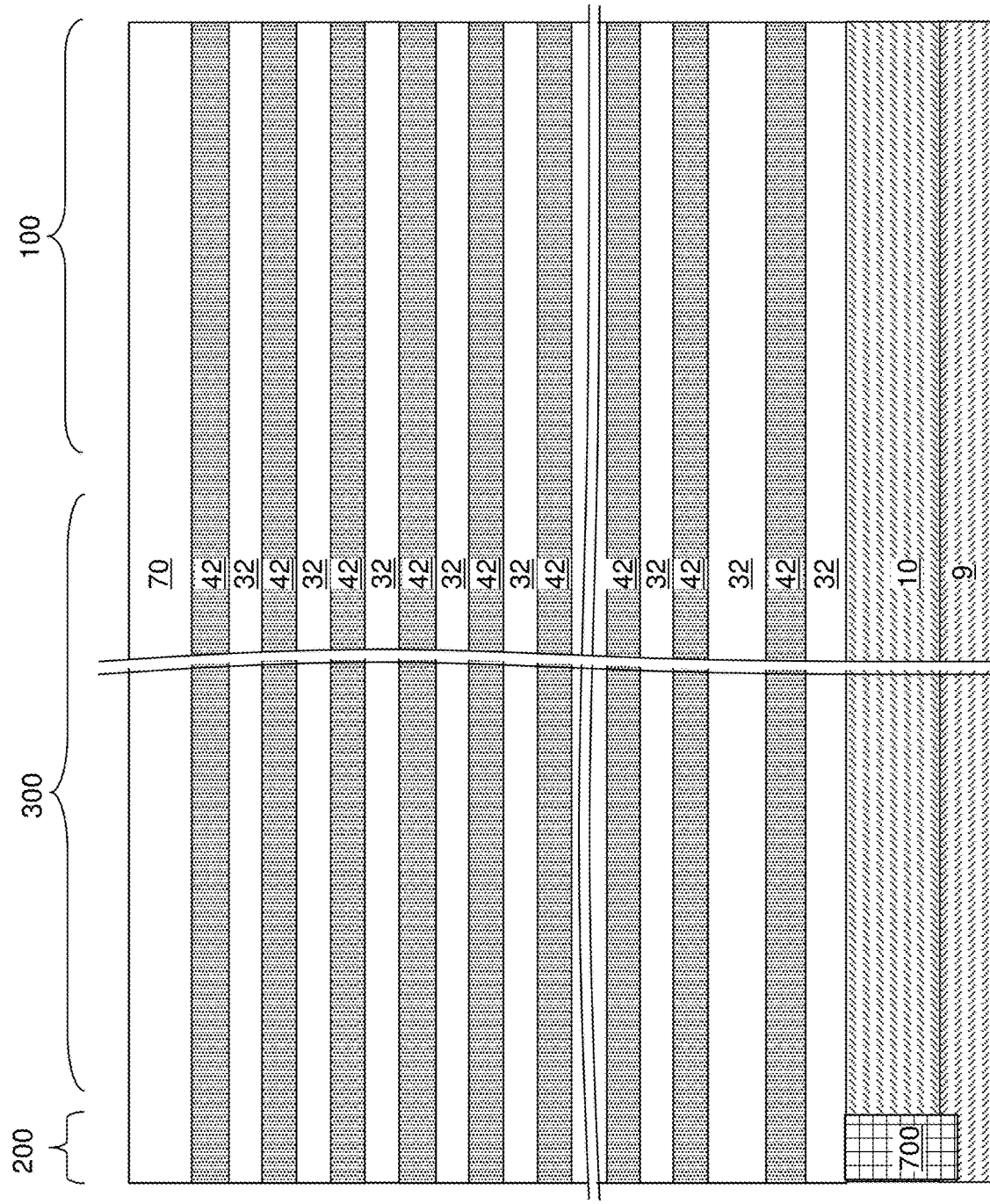
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as gate electrodes. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. In this case, the insulating cap layer 70 may be an additional insulating layer having a same material composition as the insulating layers 32. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
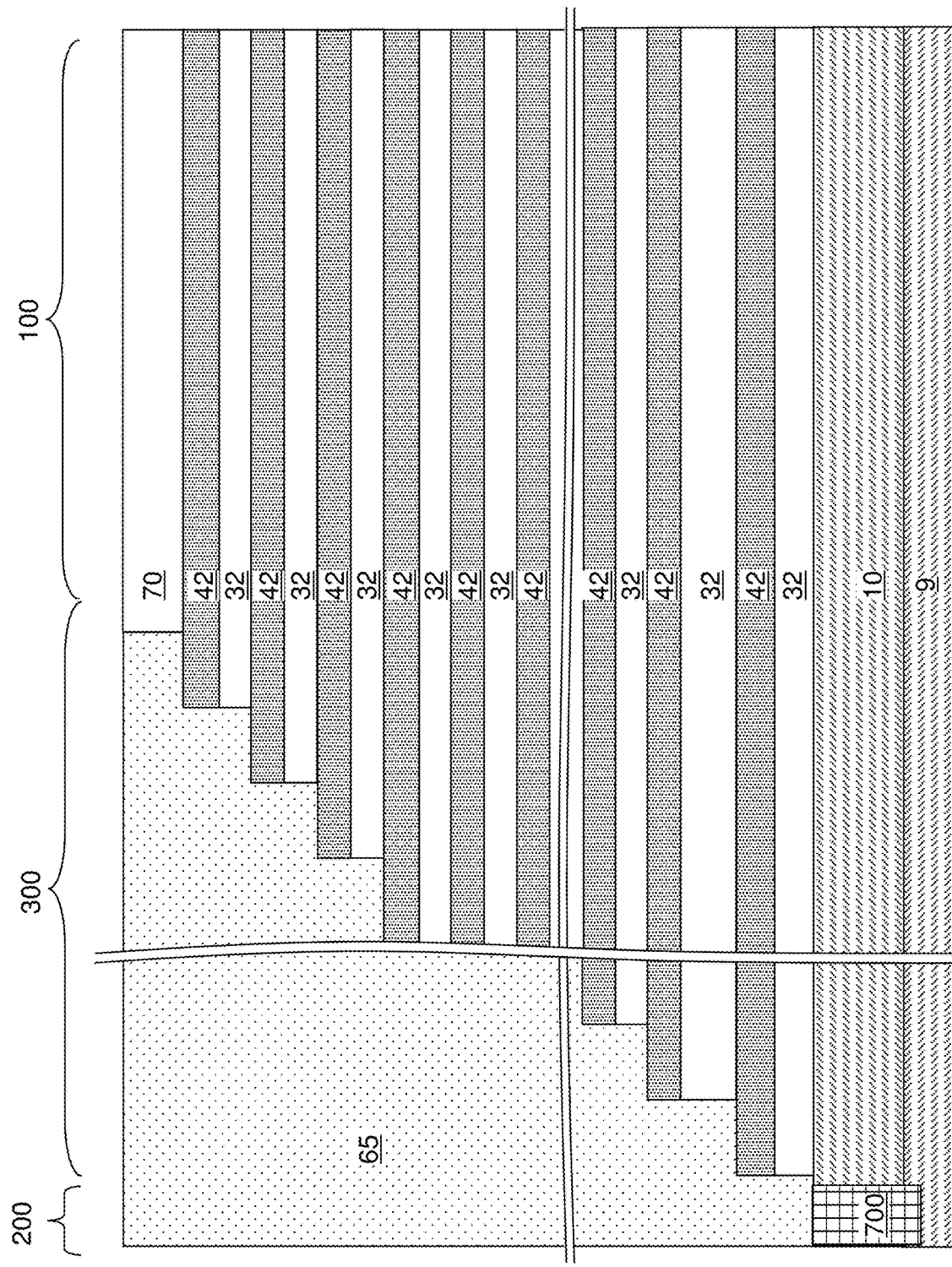
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
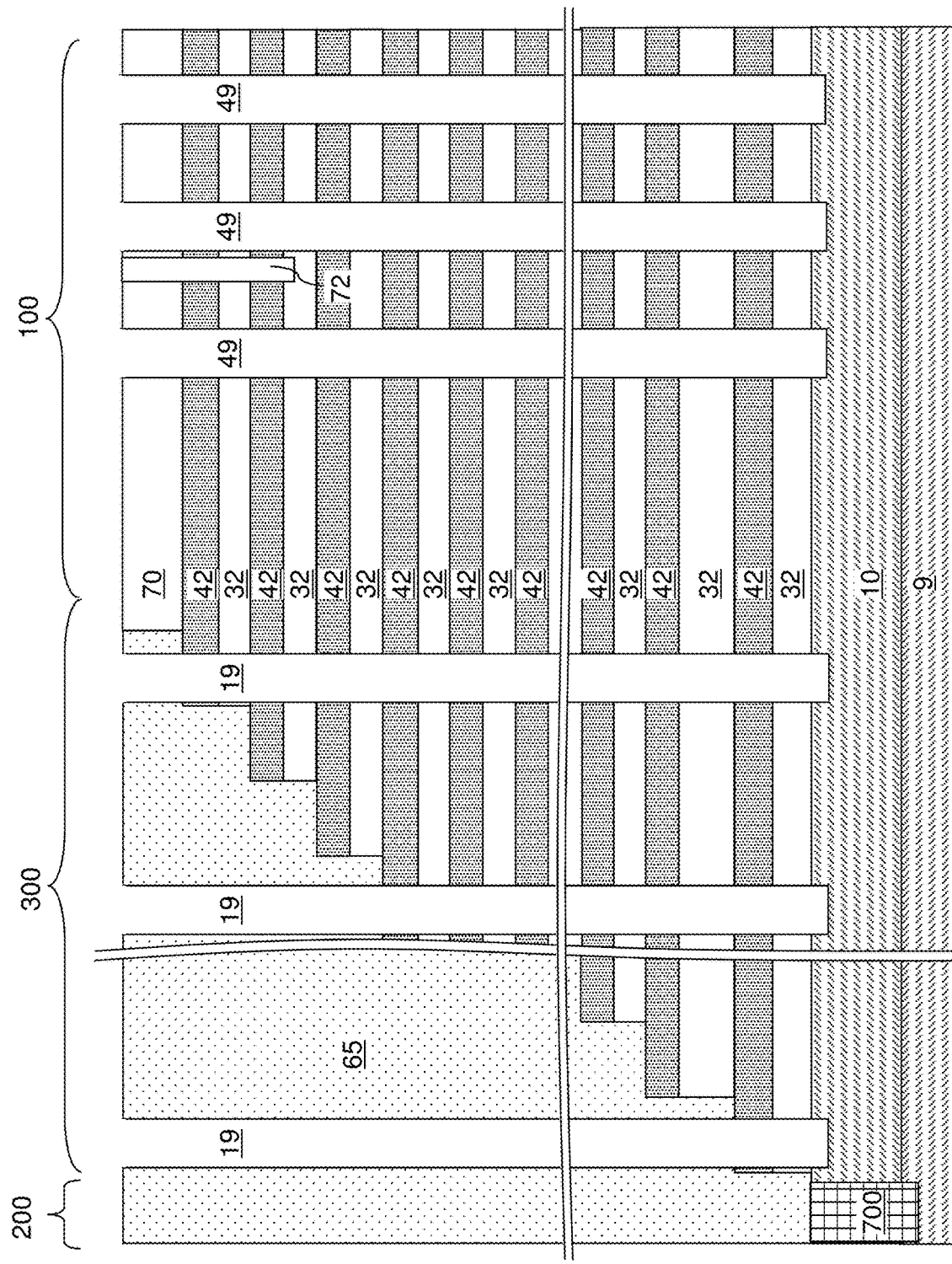
FIG. 4A is a schematic vertical cross-sectional view of the first exemplary structure after formation of memory openings and support openings according to the first embodiment of the present disclosure.
Figure 4B:
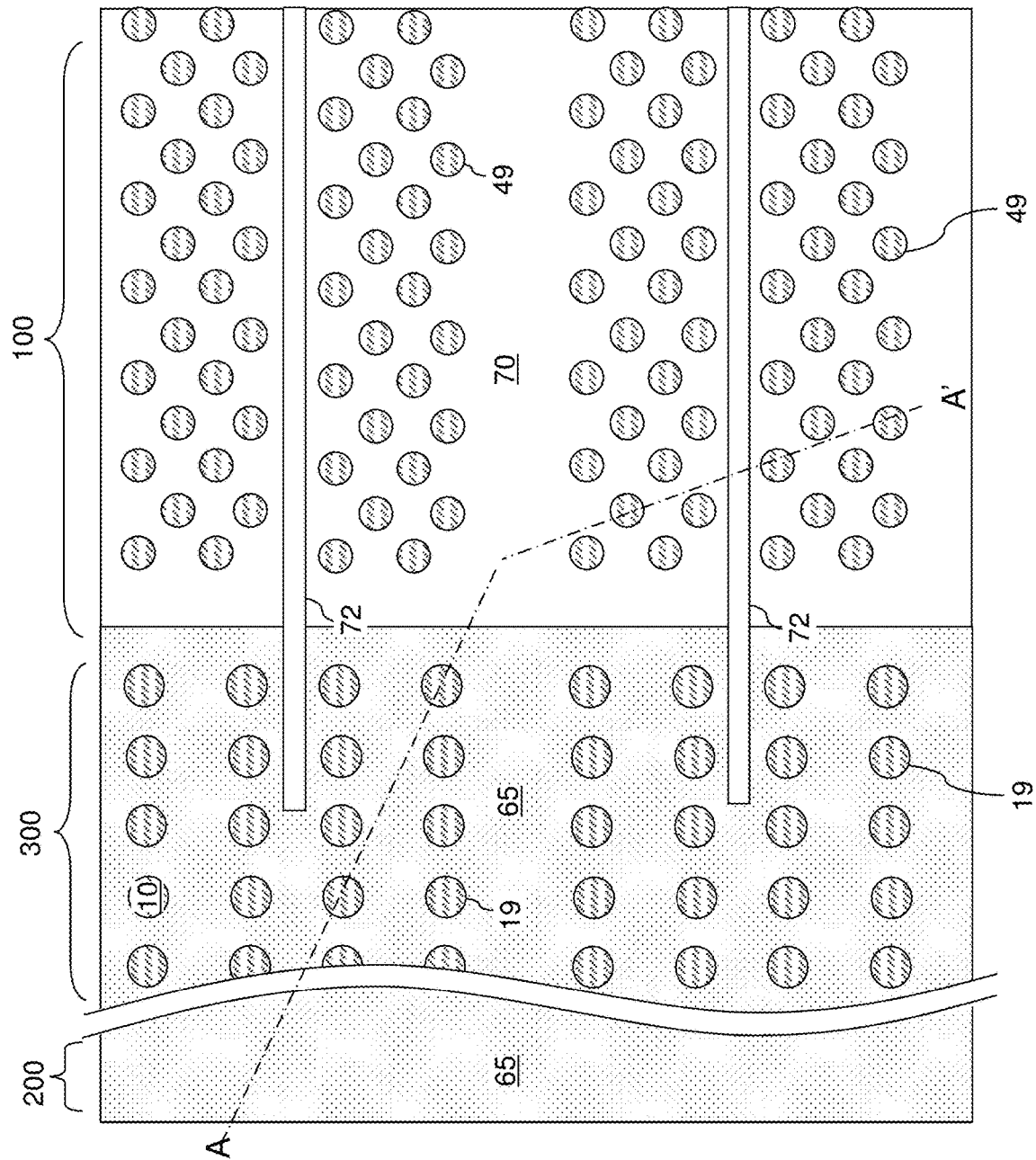
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the first exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, a graded silicon oxynitride layer 51G is deposited over the physically exposed surfaces of the memory opening 49 and over the top surface of the insulating cap layer 70 by a conformal deposition process. The graded silicon oxynitride layer 51G is a composite dielectric spacer layer 51 in which a dielectric material composition is not homogeneous. The graded silicon oxynitride layer 51G may have a material composition of $SiO_{2-2\alpha}N_{4\alpha/3}$, in which the parameter c monotonically or strictly increases during deposition of the graded silicon oxynitride layer 51G. The range of the value of the parameter $\alpha$ may be in a range from 0 to 1. In one embodiment, the value of the parameter $\alpha$ may be between 0 and 0.1 in the beginning of the deposition process, and the value of the parameter $\alpha$ may be between 0.9 and 1 at the end of the deposition process. Thus, the value of the parameter $\alpha$ may be 0 or greater than 0 in the beginning of the deposition process, and/or the value of the parameter $\alpha$ may be 1 or less than 1 at the end of the deposition process.

The graded silicon oxynitride layer 51G may be forming by providing a silicon oxide layer by a conformal deposition process such as a low pressure chemical vapor deposition process. For example, tetraethylorthosilicate (TEOS) may be flowed into a deposition chamber under vacuum at a deposition temperature in a range from 600 degrees Celsius to 750 degrees Celsius at the beginning of a deposition process. Subsequently, a nitridation process such as a thermal nitridation process may be performed such that surface portions of the deposited silicon oxide layer is converted into a silicon oxynitride material such that the nitrogen content in the silicon oxynitride material decreases with a distance from the physically exposed surface of the silicon oxynitride material. A thermal nitridation process employing ammonia may be employed to convert the silicon oxide layer into the graded silicon oxynitride layer 51G. Alternatively, both an oxygen containing source gas (e.g., TEOS) and a nitrogen containing source gas (e.g., ammonia) may be provided into the deposition chamber at the same time, and the ratio of the oxygen containing source gas to the nitrogen containing source gas is decreased continuously or stepwise during the deposition of the graded silicon oxynitride layer 51G. Other suitable methods may be used to deposit the graded silicon oxynitride layer 51G.

The thickness of the graded silicon oxynitride layer 51G may be in a range from 1 nm to 20 nm, such as from 2 nm to 10 nm, although lesser and greater thicknesses may also be employed. Generally, the graded silicon oxynitride layer 51G has a composition gradient such that an atomic concentration of nitrogen increases with a lateral distance from a sidewall of each memory opening 49.

Referring to FIG. 5C, a stack of layers including a dielectric metal oxide blocking dielectric layer 52A, a silicon oxide blocking dielectric layer 52S, a memory material layer 54, a dielectric material liner 56, and an optional sacrificial cover material layer (not illustrated) can be sequentially deposited over the graded silicon oxynitride layer 51G in the memory openings 49 by a respective conformal deposition process.

The dielectric metal oxide blocking dielectric layer 52A can consist essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the dielectric metal oxide blocking dielectric layer 52A can have a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide blocking dielectric layer 52A can be in a range from 1 nm to 20 nm, although lesser and greater thicknesses can also be employed. The dielectric metal oxide blocking dielectric layer 52A can subsequently function as a dielectric material portion that blocks leakage of stored electrical charges to control gate electrodes. In one embodiment, the dielectric metal oxide blocking dielectric layer 52A includes, and/or consists essentially of, aluminum oxide.

The silicon oxide blocking dielectric layer 52S can include, and/or consist essentially of, silicon oxide. In this case, the silicon oxide blocking dielectric layer 52S can be formed by a conformal deposition method such as low pressure chemical vapor deposition, atomic layer deposition, or a combination thereof. The thickness of the silicon oxide blocking dielectric layer 52S can be in a range from 1 nm to 20 nm, although lesser and greater thicknesses can also be employed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material (e.g., floating gate material), a ferroelectric material that can store information in the form of a ferroelectric polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments or a continuous silicon nitride layer. In one embodiment, each memory material layer 54 can include a vertical stack of charge storage regions (e.g., regions of a continuous layer or vertically separated regions) that store electrical charges upon programming. In one embodiment, the memory material layer 54 can be a memory material layer in which each portion adjacent to the sacrificial material layers 42 constitutes a charge storage region.

The memory material layer 54 can be formed, for example, by chemical vapor deposition (CVD), atomic layer deposition (ALD), physical vapor deposition (PVD), or any suitable deposition technique for storing electrical charges therein. In one embodiment, the memory material layer 54 comprises a continuous silicon nitride charge storage layer. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

Optionally, a sacrificial cover material layer (not shown) may be deposited over the dielectric material liner 56. In one embodiment, the sacrificial cover layer includes a sacrificial material that can be subsequently removed selective to the material of the dielectric material liner 56. In one embodiment, the sacrificial cover material layer can include a semiconductor material such as amorphous silicon, or may include a carbon-based material such as amorphous carbon or diamond-like carbon (DLC). The sacrificial cover material layer can be formed by a conformal deposition method such as low pressure chemical vapor deposition (LPCVD). The thickness of the sacrificial cover material layer can be in a range from 2 nm to 10 nm, although lesser and greater thicknesses can also be employed. A memory cavity 49' is formed in the volume of each memory opening 49 that is not filled with the deposited material layers.

Referring to FIG. 5D, the optional sacrificial cover material layer (if present), the dielectric material liner 56, the memory material layer 54, the silicon oxide blocking dielectric layer 52S, the dielectric metal oxide blocking dielectric layer 52A and the graded silicon oxynitride layer 51G can be sequentially anisotropically etched employing at least one anisotropic etch process. Horizontally-extending portions of the sacrificial cover material layer (if present), the dielectric material liner 56, the memory material layer 54, the silicon oxide blocking dielectric layer 52S, the dielectric metal oxide blocking dielectric layer 52A and the graded silicon oxynitride layer 51G located above the top surface of the insulating cap layer 70 can be removed by the at least one anisotropic etch process. Further, the horizontal portions of the sacrificial cover material layer (if present), the dielectric material liner 56, the memory material layer 54, the silicon oxide blocking dielectric layer 52S, the dielectric metal oxide blocking dielectric layer 52A and the graded silicon oxynitride layer 51G located at a bottom of each memory cavity 49' can be removed to form openings through remaining portions thereof. Each of the sacrificial cover material layer (if present), the dielectric material liner 56, the memory material layer 54, the silicon oxide blocking dielectric layer 52S, the dielectric metal oxide blocking dielectric layer 52A and the graded silicon oxynitride layer 51G can be etched by a respective anisotropic etch process employing a respective etch chemistry, which may, or may not, be the same for the various material layers.

Subsequently, remaining portions of the sacrificial cover material layer (if employed) can optionally be removed selective to the dielectric material liner 56 employing an isotropic etch process or an ashing process. A surface of the semiconductor material layer 10 can be physically exposed underneath each opening through the layer stack (52A, 52S, 54, 56) at the bottom of a respective memory opening 49. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance.

A set of a dielectric metal oxide blocking dielectric layer 52A, a silicon oxide blocking dielectric layer 52S, a memory material layer 54, and a dielectric material liner 56 in a memory opening 49 constitutes a memory film 50. In one embodiment, the memory film 50 may include a plurality of charge storage regions (comprising portions of the memory material layer 54) that are insulated from surrounding materials by the stack of the dielectric metal oxide blocking dielectric layer 52A and the silicon oxide blocking dielectric layer 52S or by the dielectric material liner 56. In one embodiment, the dielectric material liner 56, the memory material layer 54, the silicon oxide blocking dielectric layer 52S, the dielectric metal oxide blocking dielectric layer 52A, and the graded silicon oxynitride layer 51G can have vertically coincident sidewalls around an opening through the memory film 50 at the bottom of each memory opening 49.

Referring to FIG. 5E, a semiconductor channel layer 60L can be deposited directly on the semiconductor surface of the semiconductor material layer 10, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a dielectric metal oxide blocking dielectric layer 52A, a silicon oxide blocking dielectric layer 52S, a memory material layer 54, and a dielectric material liner 56 collectively constitute a memory film 50, which can store electrical charges or ferroelectric polarization with a macroscopic retention time. As used herein, a macroscopic retention time refers to a retention time suitable for operation of a memory device as a permanent memory device such as a retention time in excess of 24 hours. According to an embodiment of the present disclosure, the memory film 50 comprises a dielectric metal oxide blocking dielectric layer 52A that is formed directly on the inner cylindrical sidewall of the graded silicon oxynitride layer 51G.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements comprising portions of the memory material layer 54, a silicon oxide blocking dielectric layer 52S, and a dielectric metal oxide blocking dielectric layer 52A.

An entire set of material portions that fills a memory opening 49 is herein referred to as a memory opening fill structure 58. An entire set of material portions that fills a support opening 19 constitutes a support pillar structure. In one embodiment, the memory opening fill structure 58 comprises a graded silicon oxynitride layer 51G, a dielectric metal oxide blocking dielectric layer 52A, a silicon oxide blocking dielectric layer 52S, a memory material layer 54, an optional dielectric material liner 56, a vertical semiconductor channel 60, a dielectric core 62, and a drain region 63. A vertical NAND string can be formed through each memory opening upon subsequent replacement of the sacrificial material layers 42 with electrically conductive layers.

Figure 6:
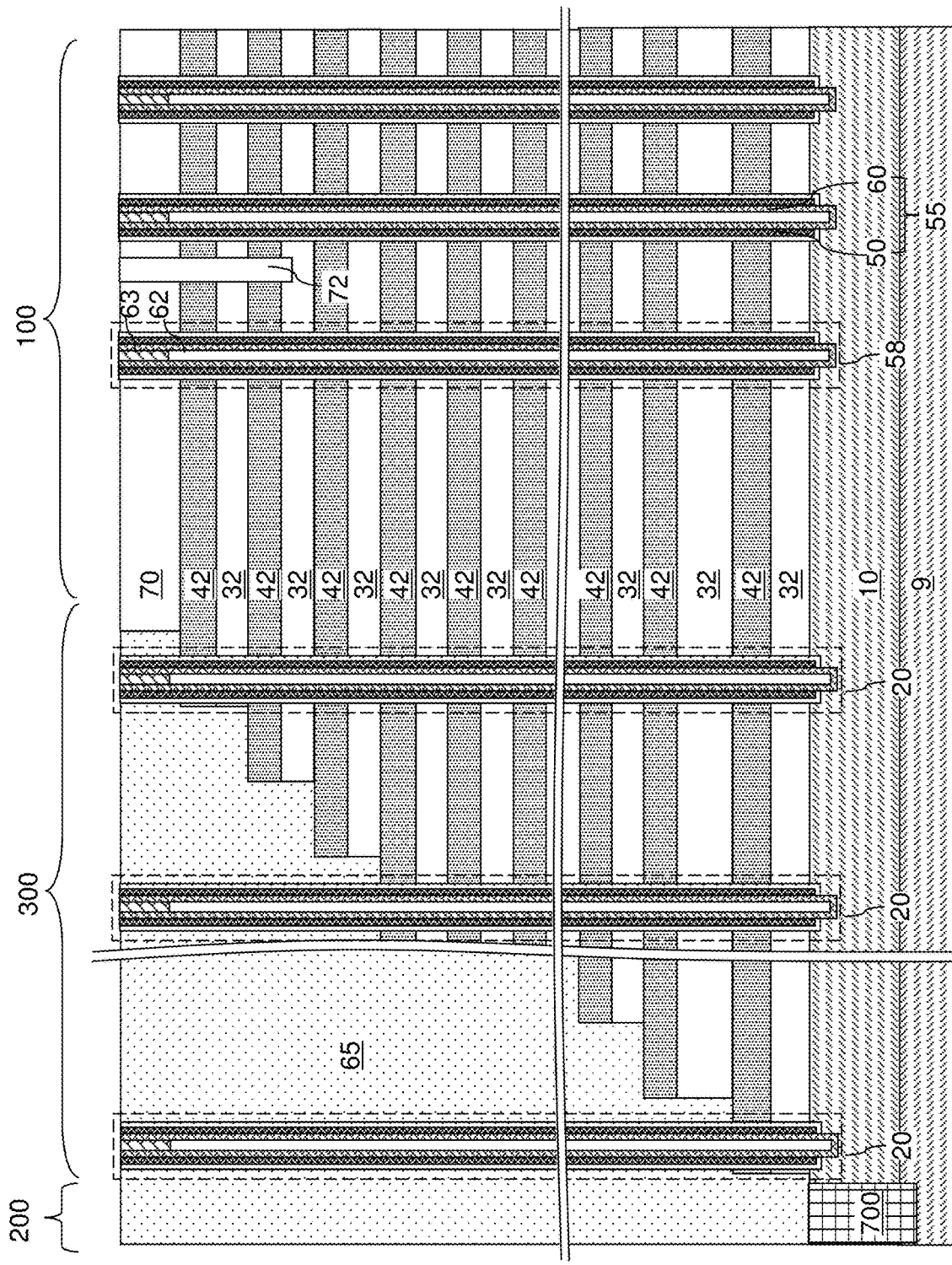
FIG. 6 is a schematic vertical cross-sectional view of the first exemplary structure after formation of memory opening fill structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (as embodied as memory material layer 54) laterally surrounding the dielectric material liner 56, a dielectric metal oxide blocking dielectric layer 52A, and a silicon oxide blocking dielectric layer 52S.

Figure 7A:
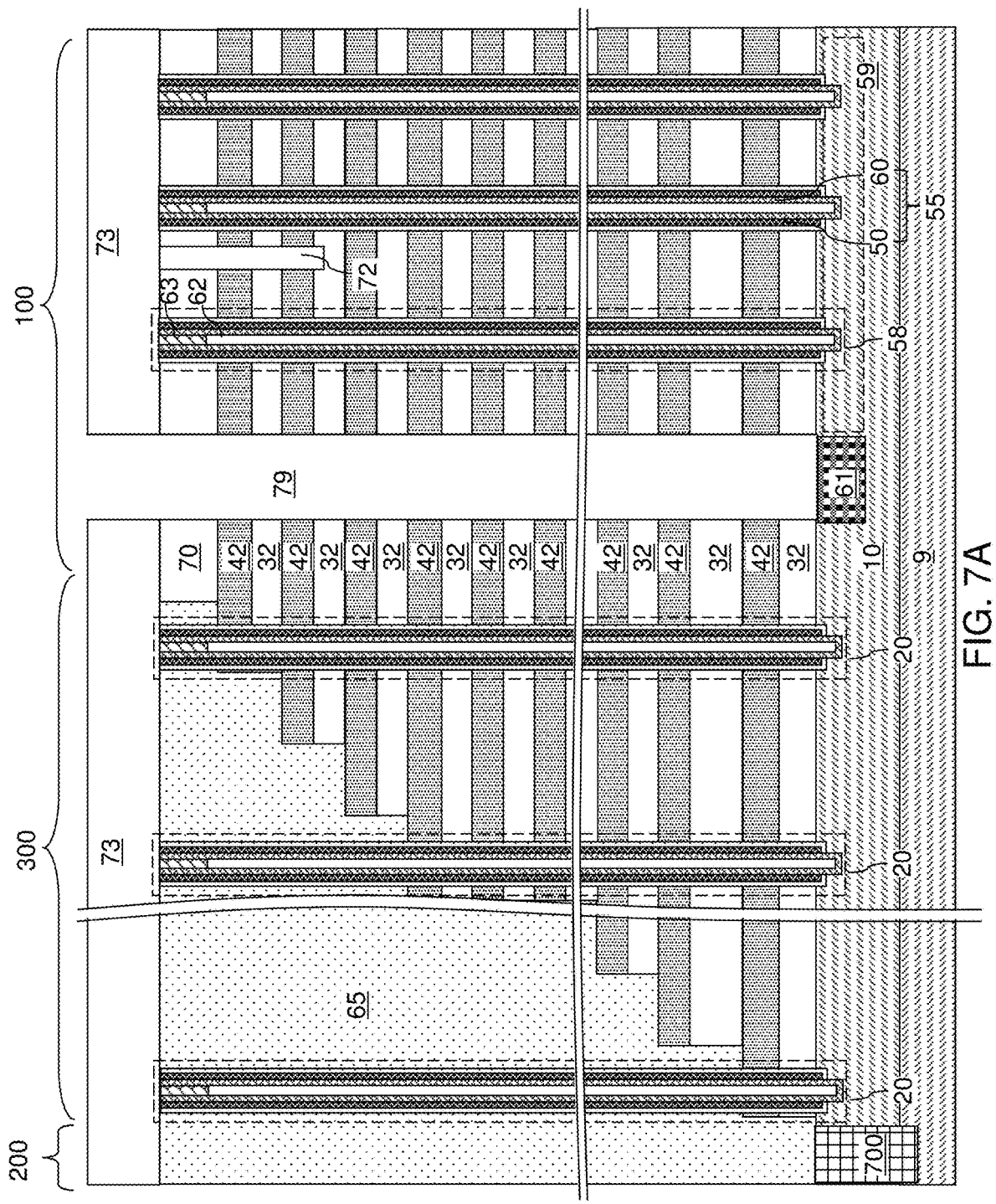
FIG. 7A is a schematic vertical cross-sectional view of the first exemplary structure after formation of backside trenches according to the first embodiment of the present disclosure.
Figure 7C:
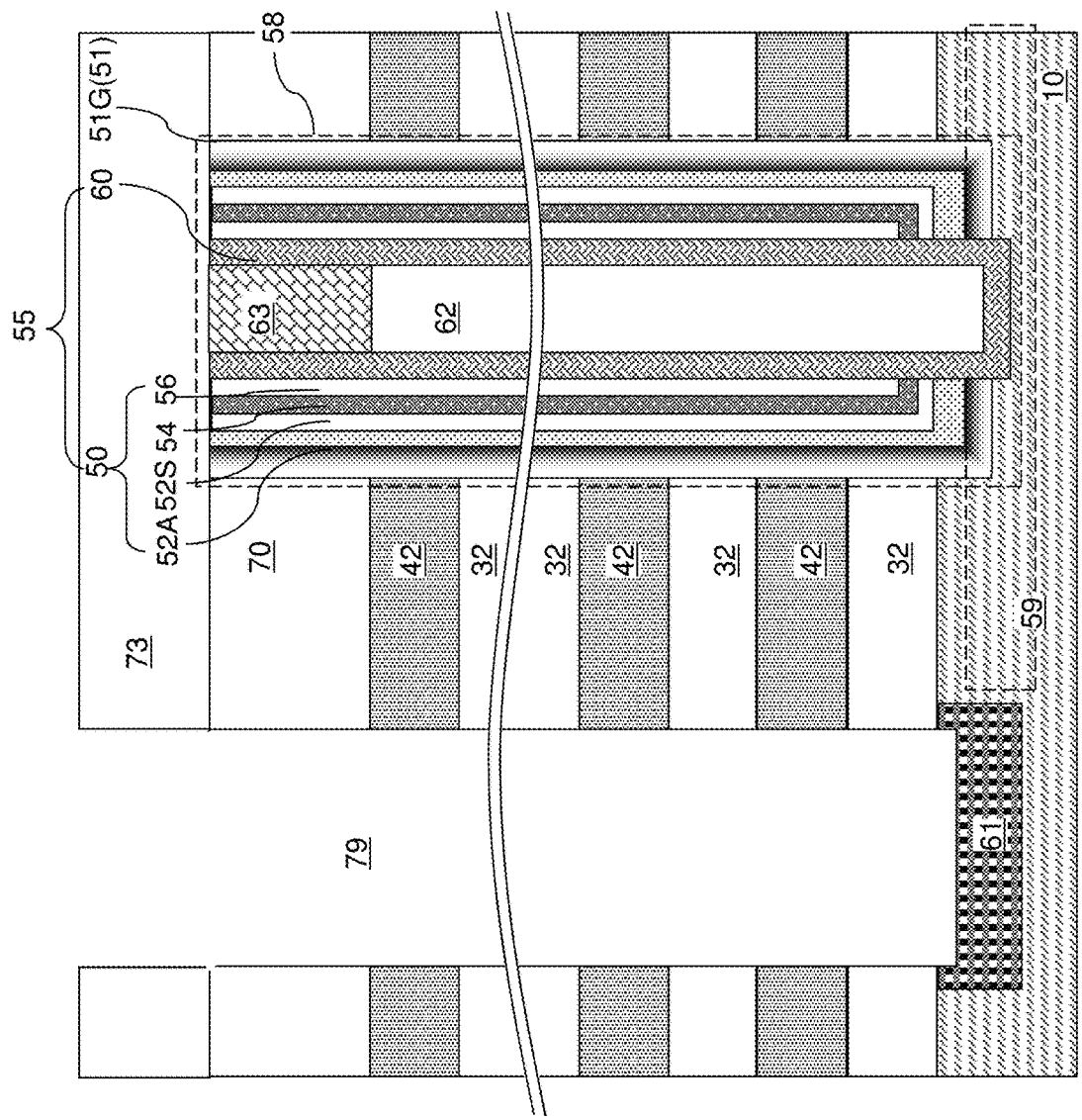
FIG. 7C is a vertical cross-sectional view of the first exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the memory opening fill structures 58 constitutes a horizontal semiconductor channel 59 for a plurality of field effect transistors. The horizontal semiconductor channel 59 is connected to multiple vertical semiconductor channels 60.

Figure 8:
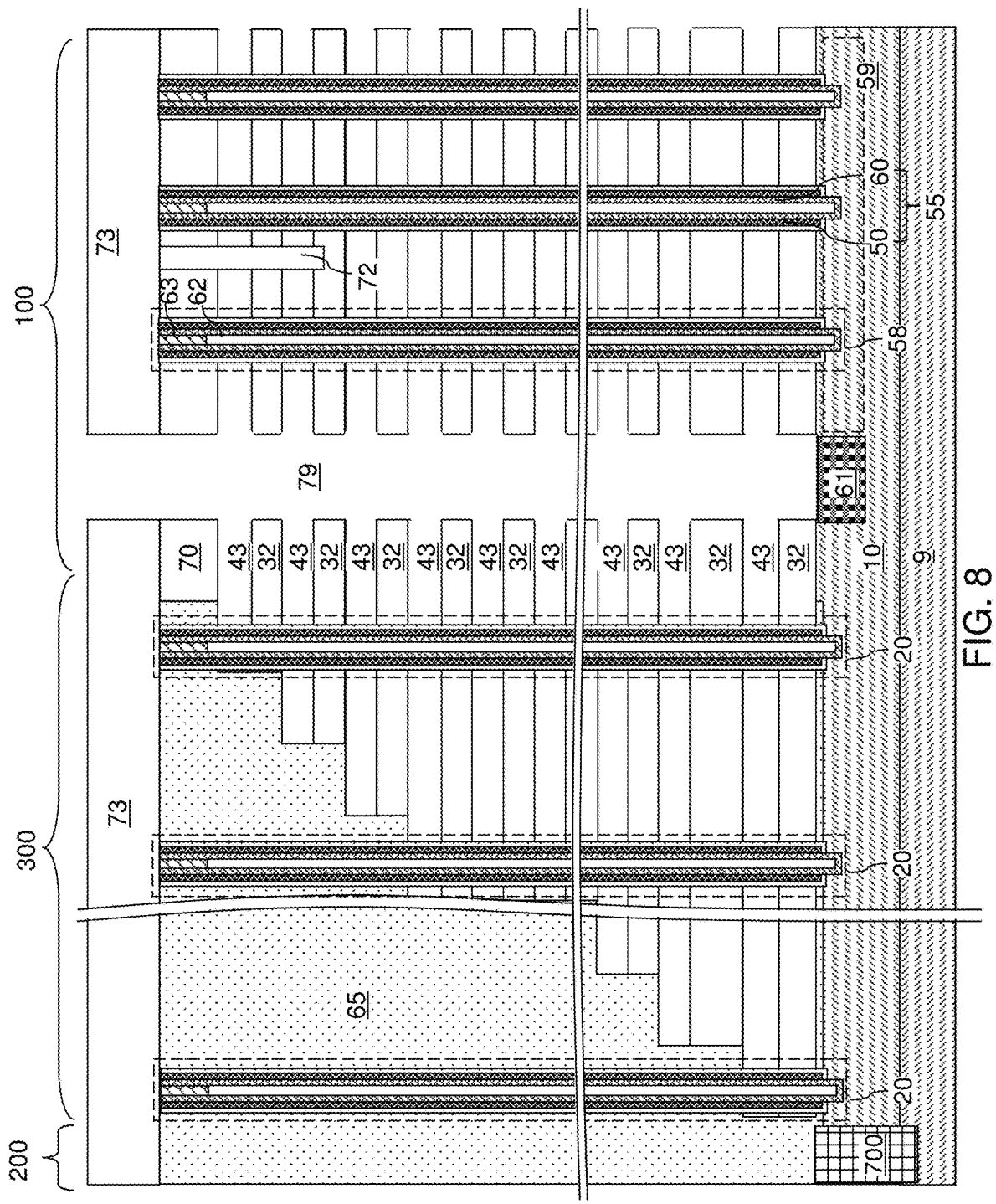
FIG. 8 is a schematic vertical cross-sectional view of the first exemplary structure after formation of backside recesses according to the first embodiment of the present disclosure.
Figure 9A:
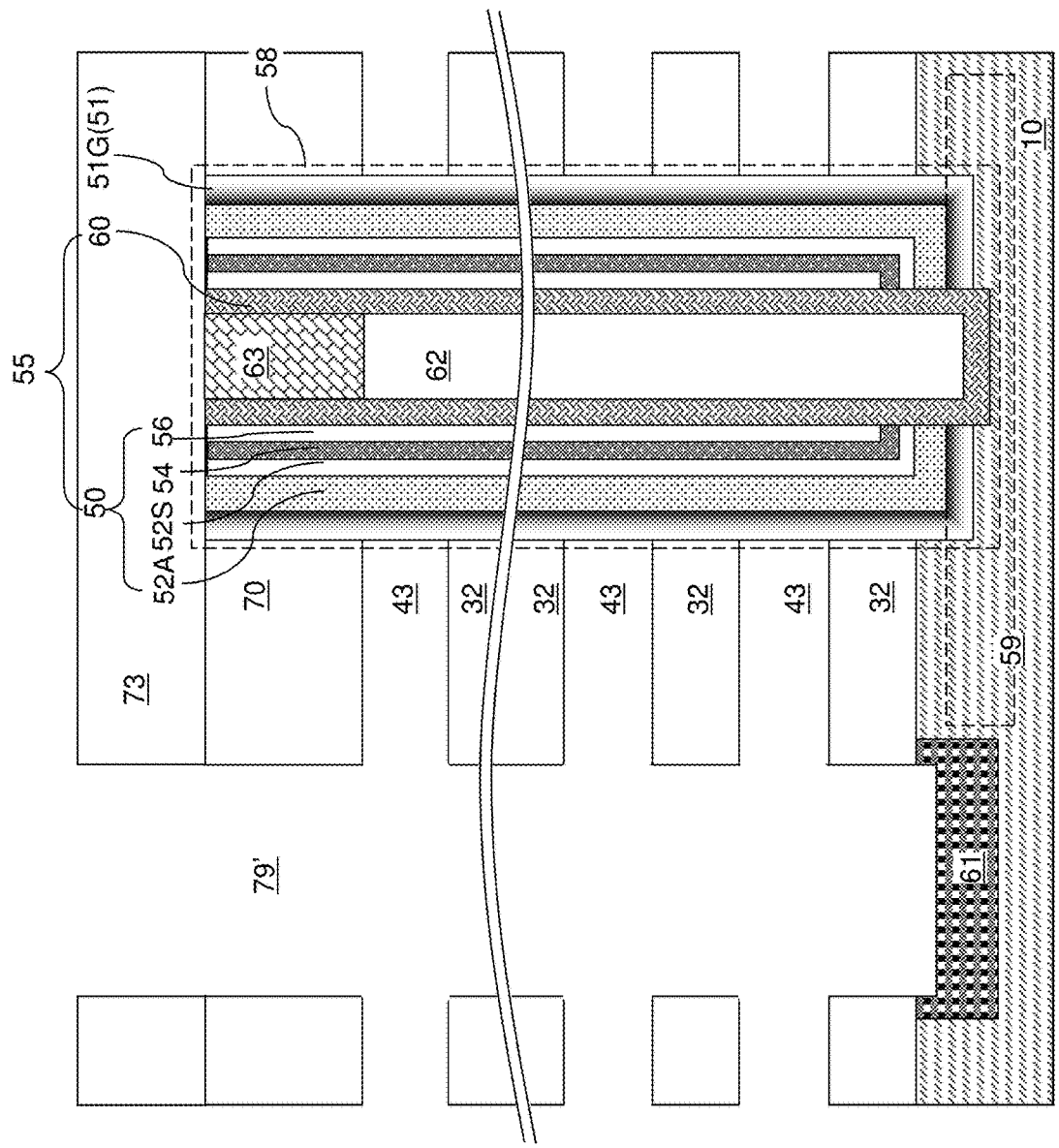
FIGS. 9A-9F are sequential vertical cross-sectional views of a region of the first exemplary structure during formation of electrically conductive layers according to the first embodiment of the present disclosure.

Referring to FIGS. 8 and 9A, an etchant that selectively etches the second material of the sacrificial material layers 42 with respect to the first material of the insulating layers 32 and the oxygen rich material at the outer sidewalls of the graded silicon oxynitride layer 51G can be introduced into the backside trenches 79. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the oxygen rich material of the outer sidewalls of the graded silicon oxynitride layer 51G. In one embodiment, the sacrificial material layers 42 can include silicon nitride, and the materials of the insulating layers 32 and the retro-stepped dielectric material portion 65 can be selected from silicon oxide and dielectric metal oxides. Generally, the backside recesses 43 can be formed by removing the sacrificial material layers 42 selective to the insulating layers 32 and the graded silicon oxynitride layers 51G.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, oxygen rich silicon oxynitride, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 9B:
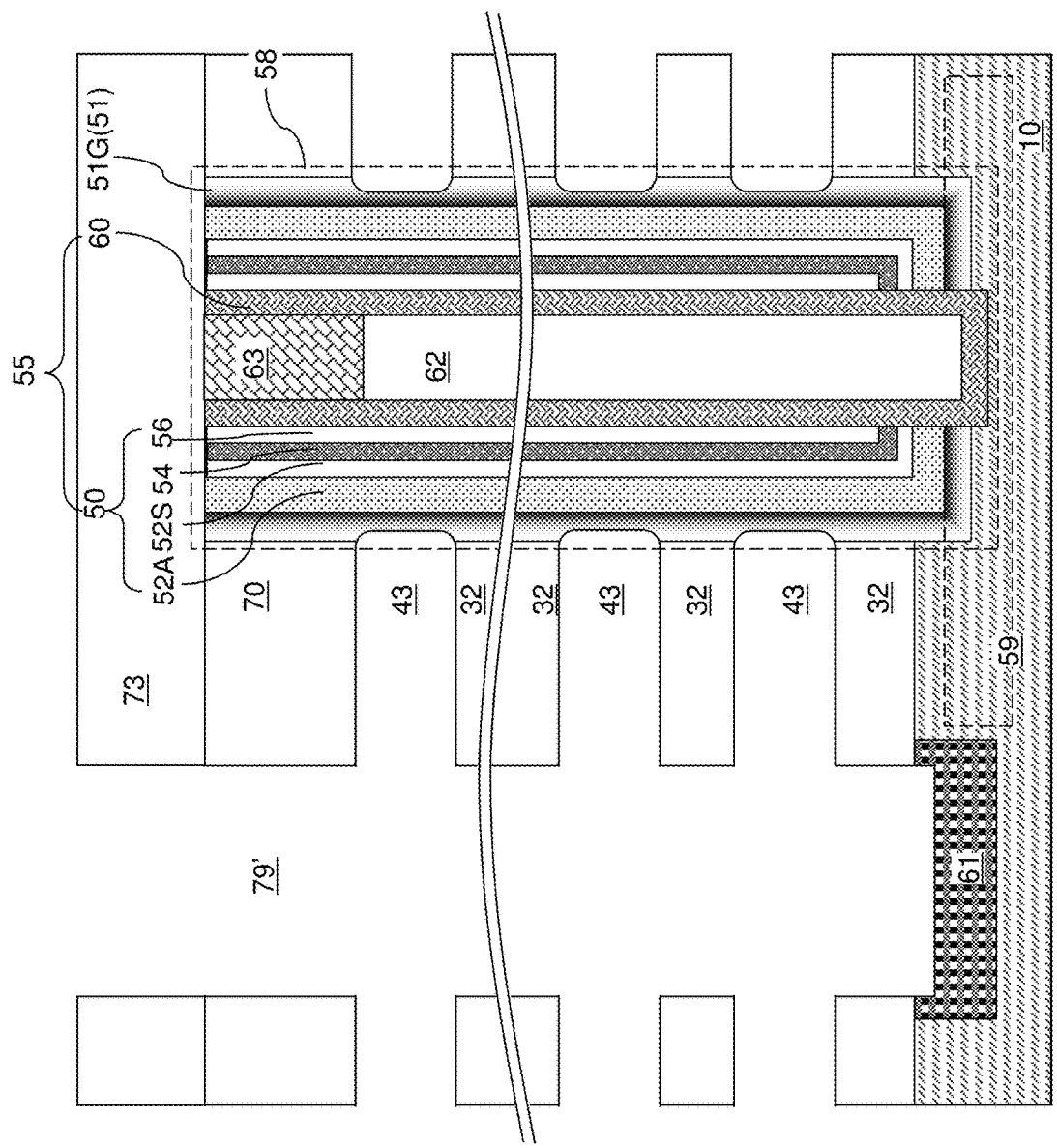

Referring to FIG. 9B, a first isotropic etch process can be performed to etch physically exposed surface portions of the graded silicon oxynitride layer 51G around the backside recesses 43. The first isotropic etch process etches silicon oxide at a higher etch rate than silicon nitride. The duration of the first isotropic etch process can be selected such that the lateral expansion of the backside recesses 43 into the graded silicon oxynitride layers 51G stops before the backside recesses 43 reach the interfaces between the nitrogen rich inner sidewalls of the graded silicon oxynitride layers 51G and the memory films 50. In an illustrative example, the first isotropic etch process may comprise a wet etch process employing dilute hydrofluoric acid.

Surface portions of the insulating layers 32, the insulating cap layer 70, and the contact-level dielectric layer 73 may be collaterally recessed during the first isotropic etch process. The recess distance of the first isotropic etch process into the graded silicon oxynitride layer MG may be in a range from 30% to 95%, such as from 50% to 90%, of the thickness of the graded silicon oxynitride layer 51G.

Figure 9C:
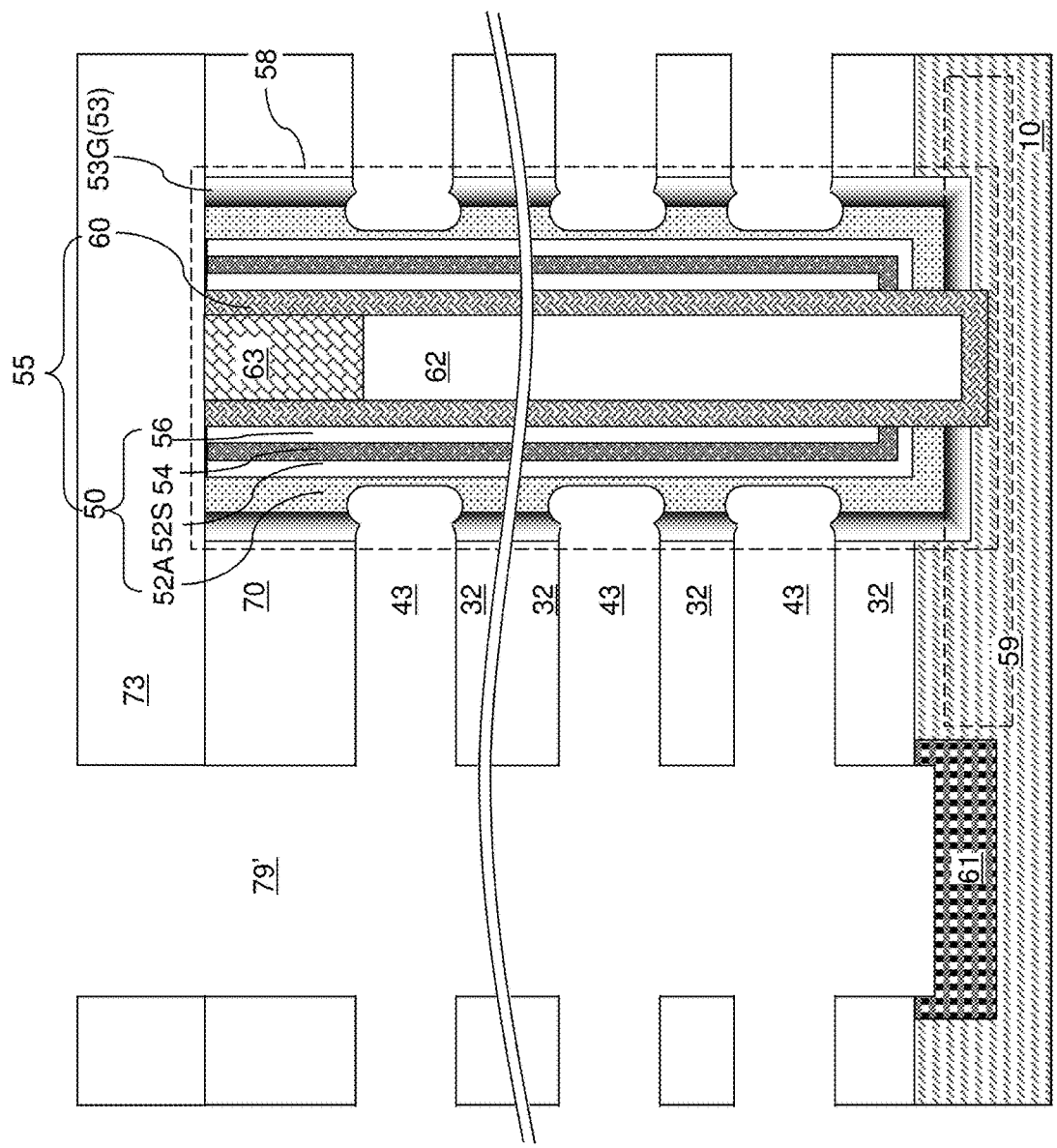

Referring to FIG. 9C, a second isotropic etch process can be performed to etch the nitrogen rich inner portions of the graded silicon oxynitride layer 51G containing nitrogen atoms at a higher atomic concentration (such as greater than 40% in atomic percentage) than the outer portions. Optionally, the second isotropic etch process may also etch adjacent portions of the dielectric metal oxide blocking dielectric layers 52A around the backside recesses 43. The second isotropic etch process etches silicon nitride and the dielectric metal oxide material of the dielectric metal oxide blocking dielectric layers 52A at a higher etch rate than silicon oxide. The duration of the second isotropic etch process can be selected such that the lateral expansion of the backside recesses 43 into the dielectric metal oxide blocking dielectric layers 52A stops before the backside recesses 43 reach the interfaces between a respective adjoining pair of a dielectric metal oxide blocking dielectric layer 52A and a silicon oxide blocking dielectric layer 52S (i.e., before the backside recesses 43 cut through the entire thickness of layer 52A). In an illustrative example, the second isotropic etch process may comprise a wet etch process employing hot phosphoric acid which etches through part of the thickness of the dielectric metal oxide blocking dielectric layer 52A. The nitrogen-rich portions of the graded silicon oxynitride layers 51G and the dielectric metal oxide blocking dielectric layers 52A can be isotropically recessed such that the vertical extent of each backside recess 43 is at a maximum within volumes laterally bounded by recessed surface segments of the dielectric metal oxide blocking dielectric layers 52A that are formed by the second isotropic etch process. The recess distance of the second isotropic etch process, as measured from a vertical plane including an outer cylindrical sidewall of a dielectric metal oxide blocking dielectric layer 52A toward an inner cylindrical sidewall of the dielectric metal oxide blocking dielectric layer 52A, may be in a range from 30% to 95%, such as from 50% to 90%, of the thickness of the dielectric metal oxide blocking dielectric layer 52A.

Generally, the second isotropic etch process etches silicon nitride at a higher etch rate than silicon oxide, and the backside recesses 43 are expanded through the composite dielectric spacer layer 51 around the memory film 50 within each memory opening fill structure 58. The second isotropic etch process etches surface portions of the dielectric metal oxide blocking dielectric layer 52A concurrently with recessing of the nitrogen rich surface portions of the graded silicon oxynitride layer 51G. The combination of the first isotropic etch and the second isotropic etch divides each graded silicon oxynitride layer 51G into a vertical stack of tubular graded silicon oxynitride portions 53G laterally surrounding a respective memory film 50. The tubular graded silicon oxynitride portions 53G comprise composite dielectric spacers 53 that are located between the dielectric metal oxide blocking dielectric layer 52A of a respective memory opening fill structure 58 and the insulating layers 32.

In one embodiment, each tubular graded silicon oxynitride portion 53G within each vertical stack of tubular graded silicon oxynitride portions 53G comprises a contoured top surface including an inner concave top surface segment and an outer concave top surface segment that are adjoined to each other at a cusp, and a contoured bottom surface including an inner concave bottom surface segment and an outer concave bottom surface segment that are adjoined to each other at a cusp.

Figure 9D:
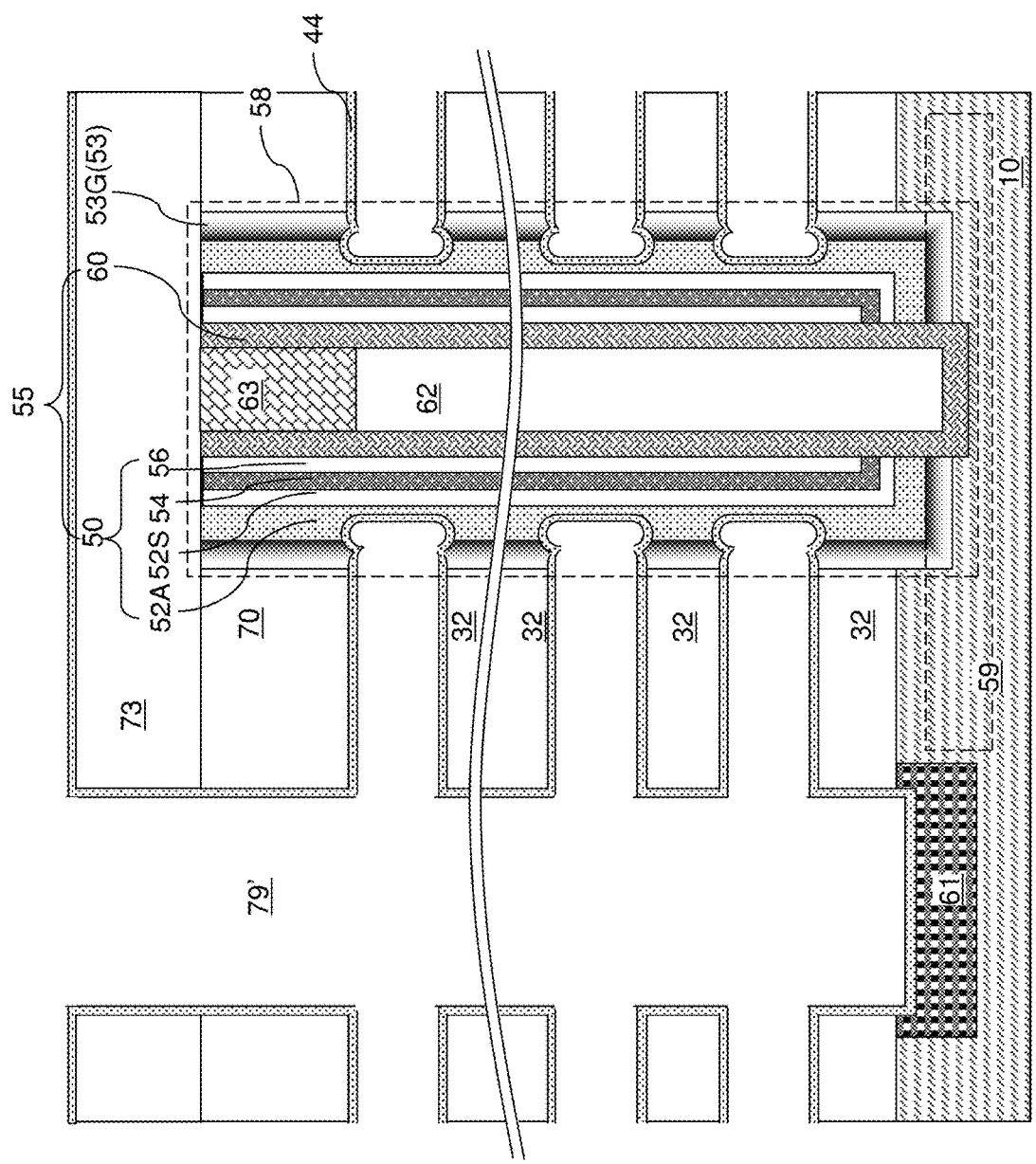

Referring to FIG. 9D, a backside blocking dielectric layer 44 can be optionally formed. The backside blocking dielectric layer 44, if present, comprises a dielectric material that functions as a control gate dielectric for the control gates to be subsequently formed in the backside recesses 43. The backside blocking dielectric layer 44 can be formed in the backside recesses 43 and on a sidewall of the backside trench 79. The backside blocking dielectric layer 44 can be formed directly on horizontal surfaces of the insulating layers 32 and directly on physically exposed surface segments of the dielectric metal oxide blocking dielectric layer 52A around the backside recesses 43. In one embodiment, the backside blocking dielectric layer 44 can be formed by a conformal deposition process such as atomic layer deposition (ALD). The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In one embodiment, the backside blocking dielectric layer 44 can consist essentially of aluminum oxide. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, physically exposed contoured surfaces of the tubular graded silicon oxynitride portions 53G, and physically exposed surface segments of the memory stack structures 55 that are physically exposed to the backside recesses 43. A backside cavity 79' is present within the portion of each backside trench 79 that is not filled with the backside blocking dielectric layer 44.

Figure 9E:
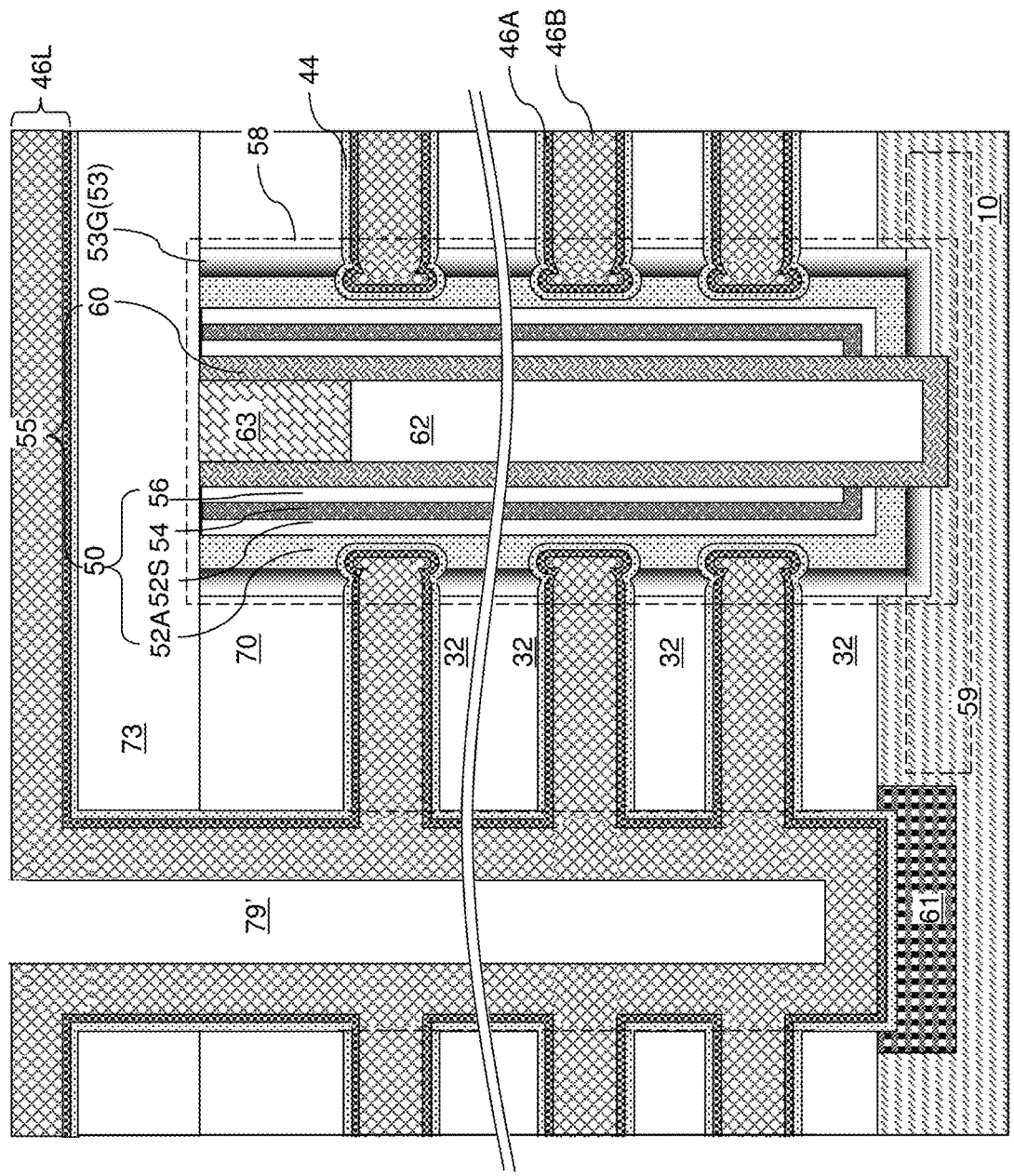

Referring to FIG. 9E, an optional metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, molybdenum, cobalt, ruthenium, titanium, or tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough. Alternatively, the metallic barrier layer 46A may be omitted if the metallic fill material layer 46B comprises molybdenum or another metal which may be used without a diffusion barrier.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73. Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 9F:
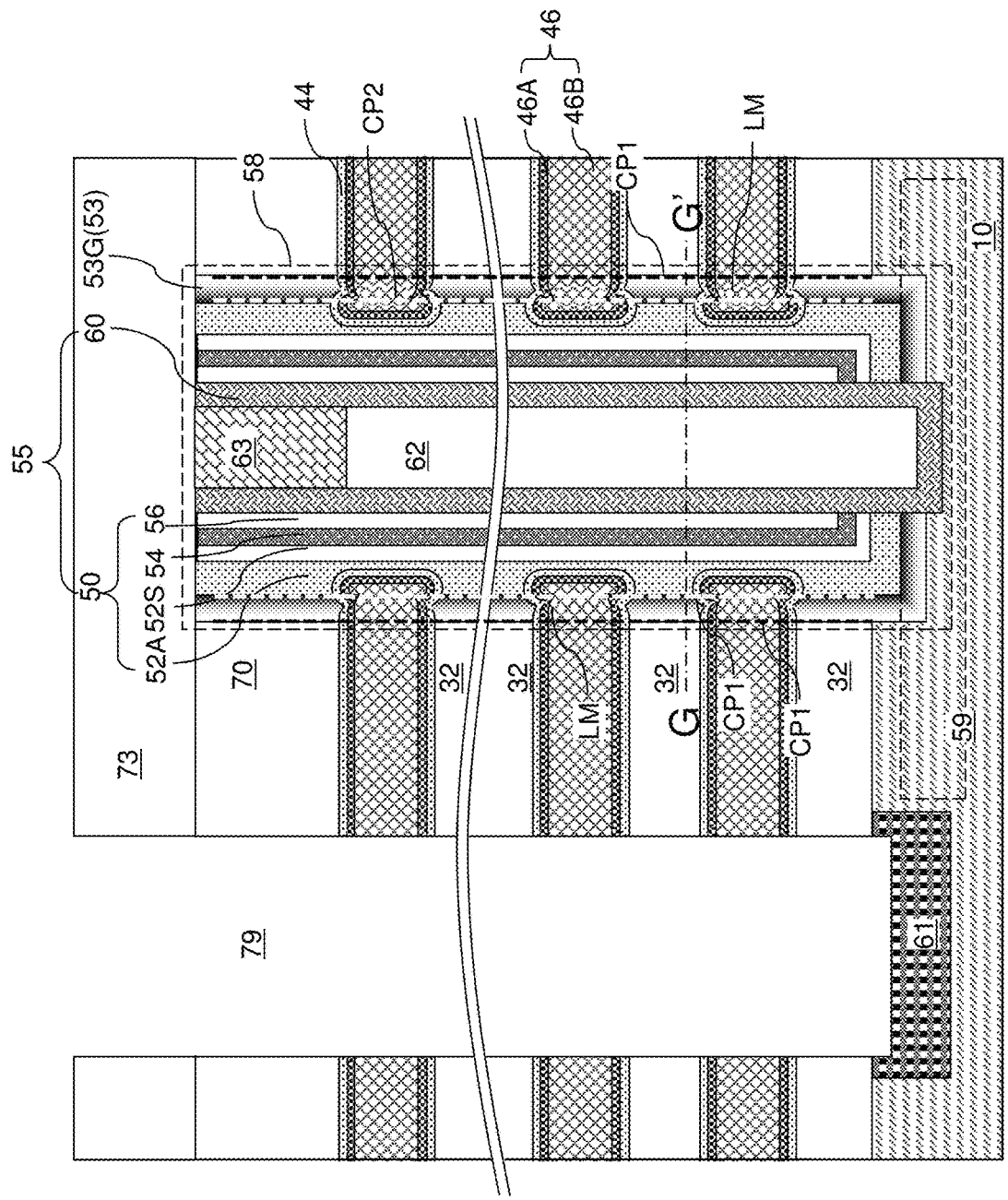
Figure 9G:
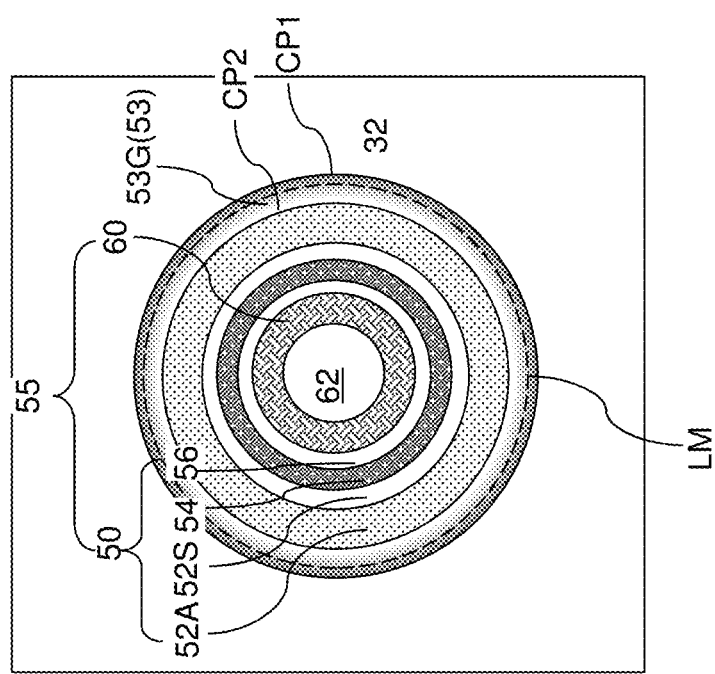
FIG. 9G is a horizontal cross-sectional view of the first exemplary structure along the horizontal plane G-G' of FIG. 9F.

Referring to FIGS. 9F and 9G, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44, and sidewalls of the insulating layers 32 may be physically exposed. A backside cavity 79' is present within each backside trench 79.

In one embodiment, each of the electrically conductive layers 46 may be formed with a hammerhead-shaped vertical cross-sectional profile. As used herein, a "hammerhead-shaped vertical cross-sectional profile" refers to a vertical cross-sectional profile including a vertically-extending portion that is adjoined to a horizontally-extending portion such that the vertical extent of the vertically-extending portion is greater than the vertical extent of the joint between the vertically-extending portion and the horizontally-extending portion.

In one embodiment, the vertical extent of each of the electrically conductive layers 46 may have a local minimum LM (i.e., a pinch point or a narrow height plane) within a cylindrical volume laterally bounded by a sidewall of a respective memory opening 49 (as formed at the processing steps of FIGS. 4A, 4B, and 5A). In one embodiment, the local minimum LM may be located between a first cylindrical plane CP1 including outer sidewalls of a vertical stack of tubular graded silicon oxynitride portions 53G within a memory opening fill structure 58 and a second cylindrical plane CP2 including inner sidewalls of the vertical stack of tubular graded silicon oxynitride portions 53G. In one embodiment, the local minimum LM may be located along a continuous closed shape (such as a circle or an ellipse) that is equidistant from the first cylindrical plane CP1 in a plan view along a vertical direction, for example, as illustrated in FIG. 9G. In one embodiment, a maximum vertical extent of at least one, a plurality, or each, of the electrically conductive layers 46 within the cylindrical volume is greater than a vertical extent of a horizontally-extending portion of the one, the plurality, or each, of the electrically conductive layers 46 located outside the cylindrical volume, and the horizontally-extending portion having a uniform thickness along a vertical direction.

In one embodiment, the memory material layer 54 may comprise a charge storage layer, and the dielectric material liner 56 may comprise a tunneling dielectric layer. In this case, the memory film 50 comprises a layer stack including a tunneling dielectric layer and a charge storage layer in contact with the tunneling dielectric layer. In one embodiment, the memory film 50 comprises a dielectric metal oxide blocking dielectric layer 52A in contact with the vertical stack of tubular graded silicon oxynitride portions 53G.

In one embodiment, each of the electrically conductive layers 46 is spaced from the dielectric metal oxide blocking dielectric layer 52A by a respective backside blocking dielectric layer 44. In one embodiment, the respective backside blocking dielectric layer 44 is in contact with a respective pair of tubular graded silicon oxynitride portions 53G and the dielectric metal oxide blocking dielectric layer 52A.

In one embodiment, the dielectric metal oxide blocking dielectric layer 52A comprises a straight inner sidewall that vertically extends straight through each of the electrically conductive layers 46 from a top periphery of the straight inner sidewall to a bottom periphery of the straight inner sidewall, and a laterally undulating outer sidewall having a first lateral thickness at levels of the insulating layers 32 and having a second lateral thickness at levels of the electrically conductive layers 46 that is less than the first lateral thickness. As used herein, lateral undulation refers to a variation of a lateral extent with respective to a vertical plane or with respect to a vertical line.

In one embodiment, the memory film 50 comprises a silicon oxide blocking dielectric layer 52S in contact with an inner sidewall of the dielectric metal oxide blocking dielectric layer 52A.

Figure 10:
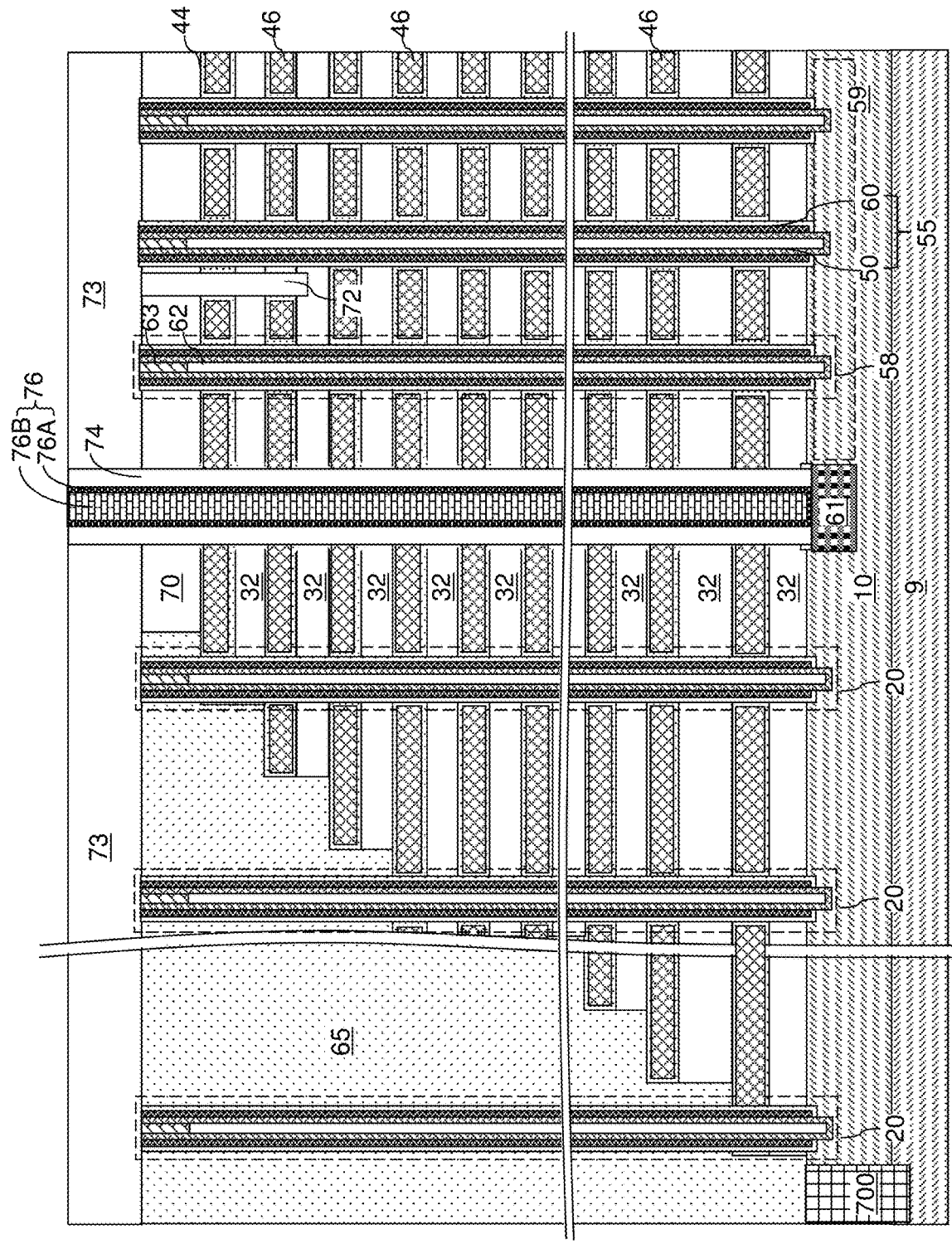
FIG. 10 is a schematic vertical cross-sectional view of the first exemplary structure after formation of an insulating spacer and a backside contact structure in each backside trench according to the first embodiment of the present disclosure.

Referring to FIG. 10, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 11A:
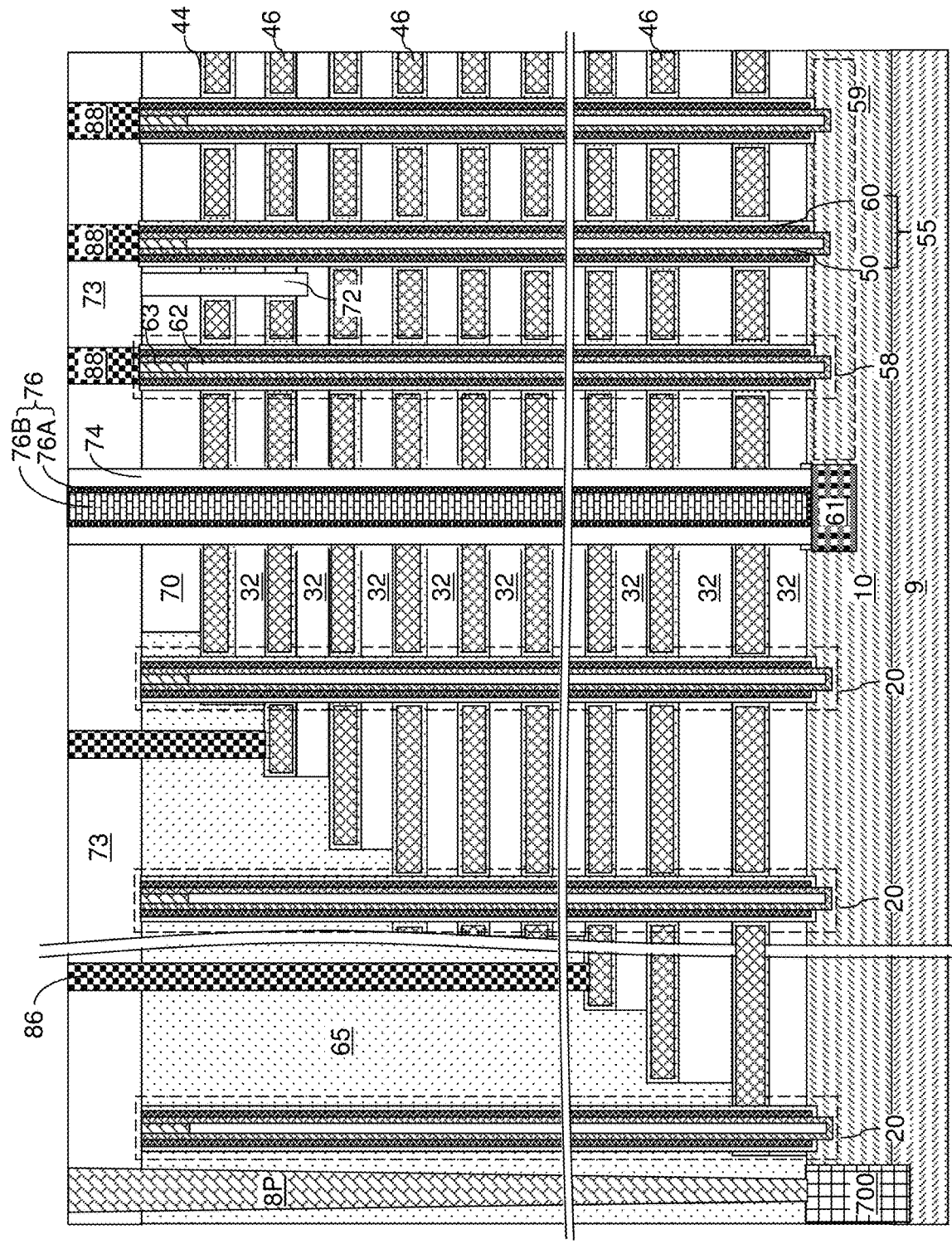
FIG. 11A is a schematic vertical cross-sectional view of the first exemplary structure after formation of additional contact via structures according to the first embodiment of the present disclosure.
Figure 11B:
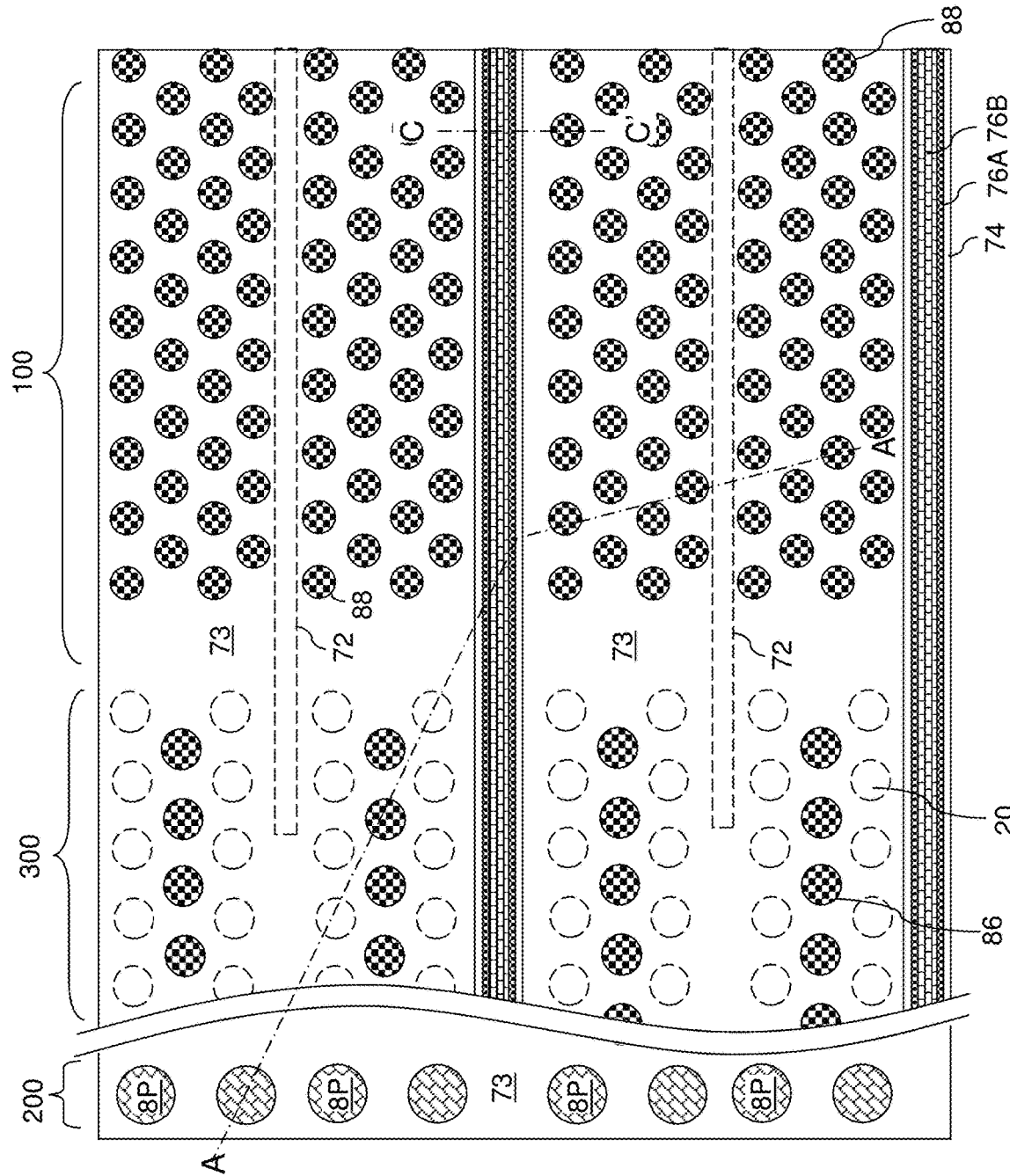
FIG. 11B is a top-down view of the first exemplary structure of FIG. 11A. The vertical plane A-A' is the plane of the schematic vertical cross-sectional view of FIG. 11A.
Figure 11C:
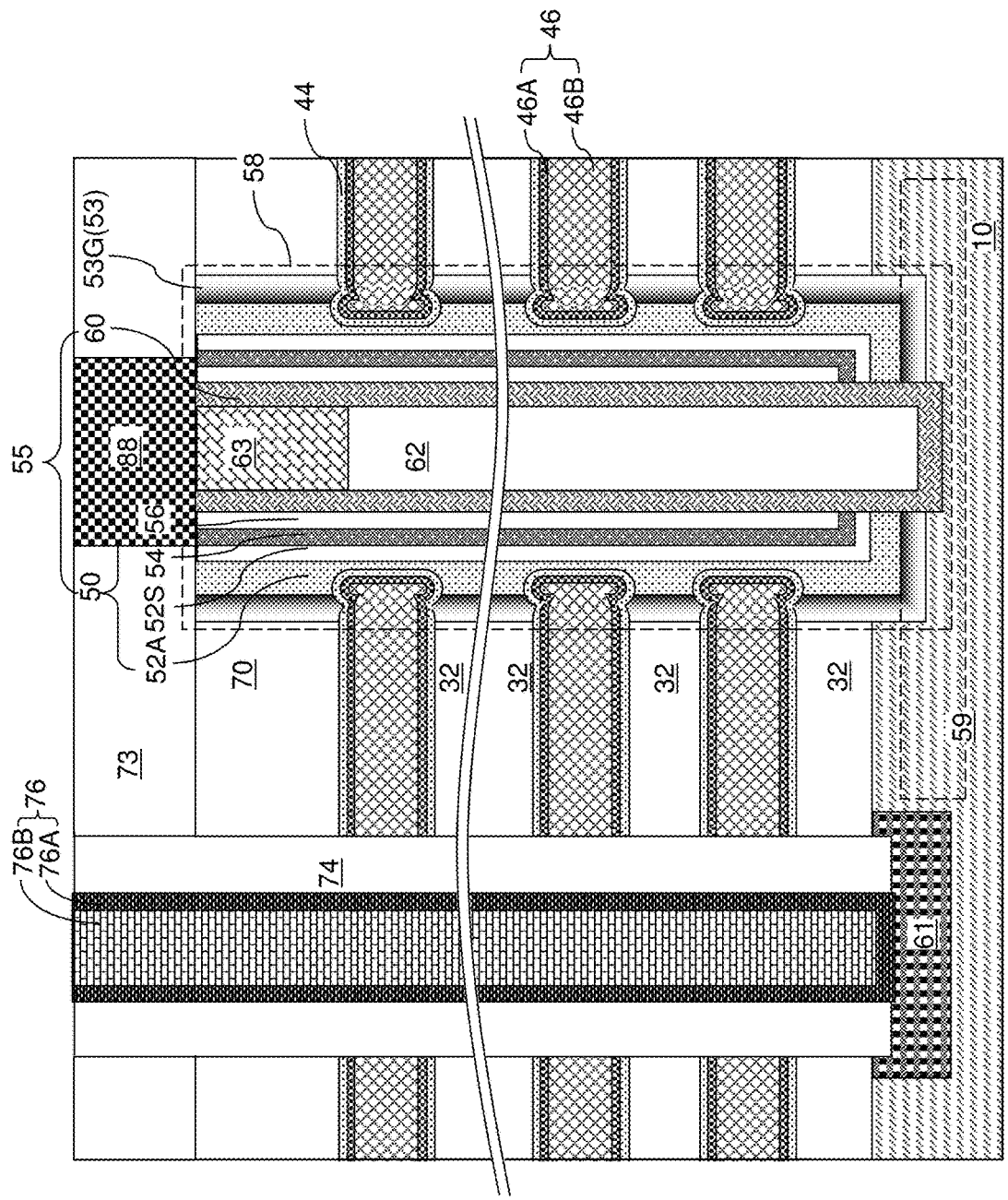
FIG. 11C is a vertical cross-sectional view of the first exemplary structure along the vertical plane C-C' of FIG. 11B.

Referring to FIGS. 11A-11C, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines (not shown for clarity) are then formed in electrical contact with the drain contact via structures 88.

Figure 12A:
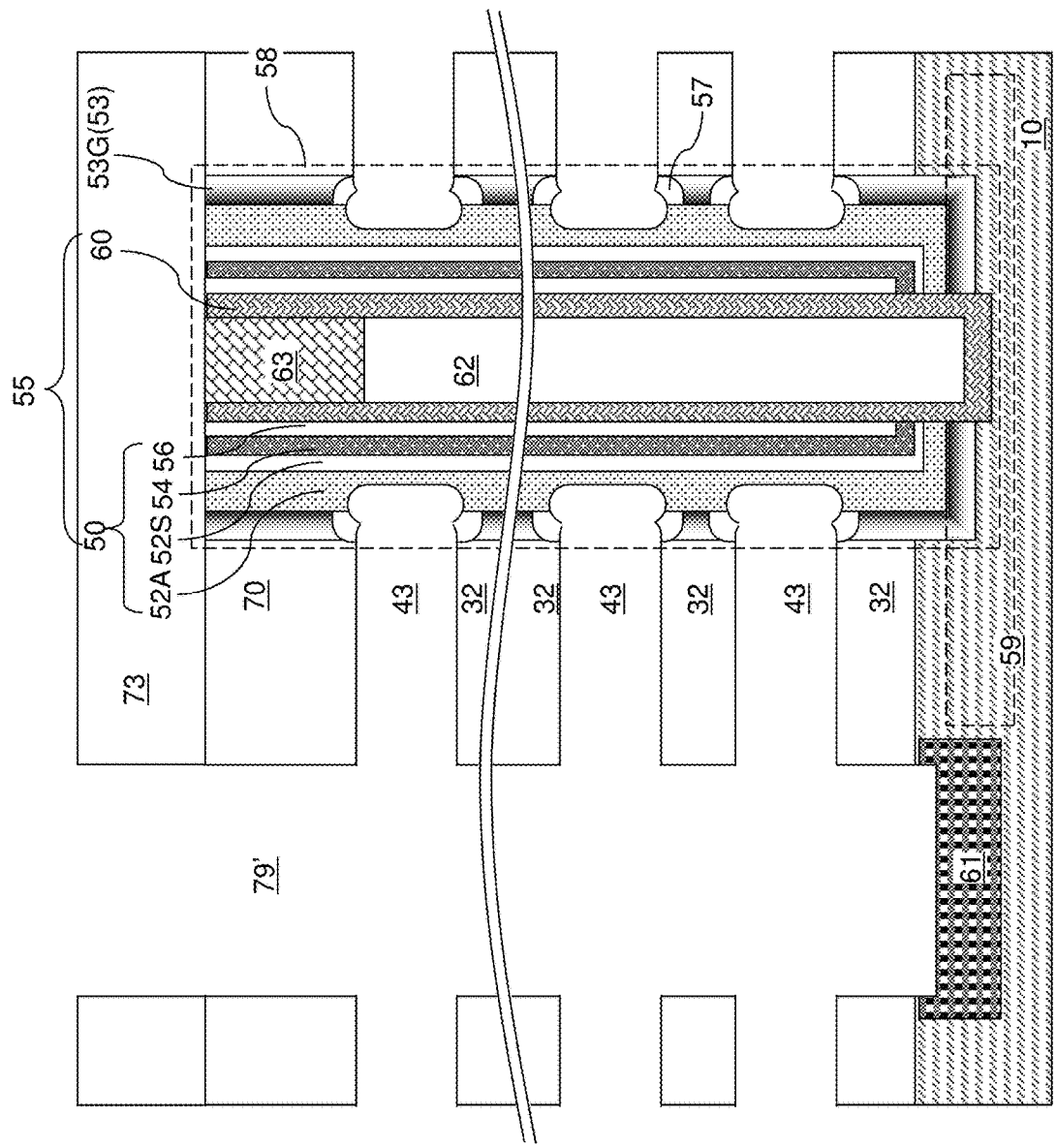
FIGS. 12A and 12B are sequential vertical cross-sectional views of a region of a first alternative embodiment of the first exemplary structure during formation of electrically conductive layers according to the first embodiment of the present disclosure.
Figure 12B:
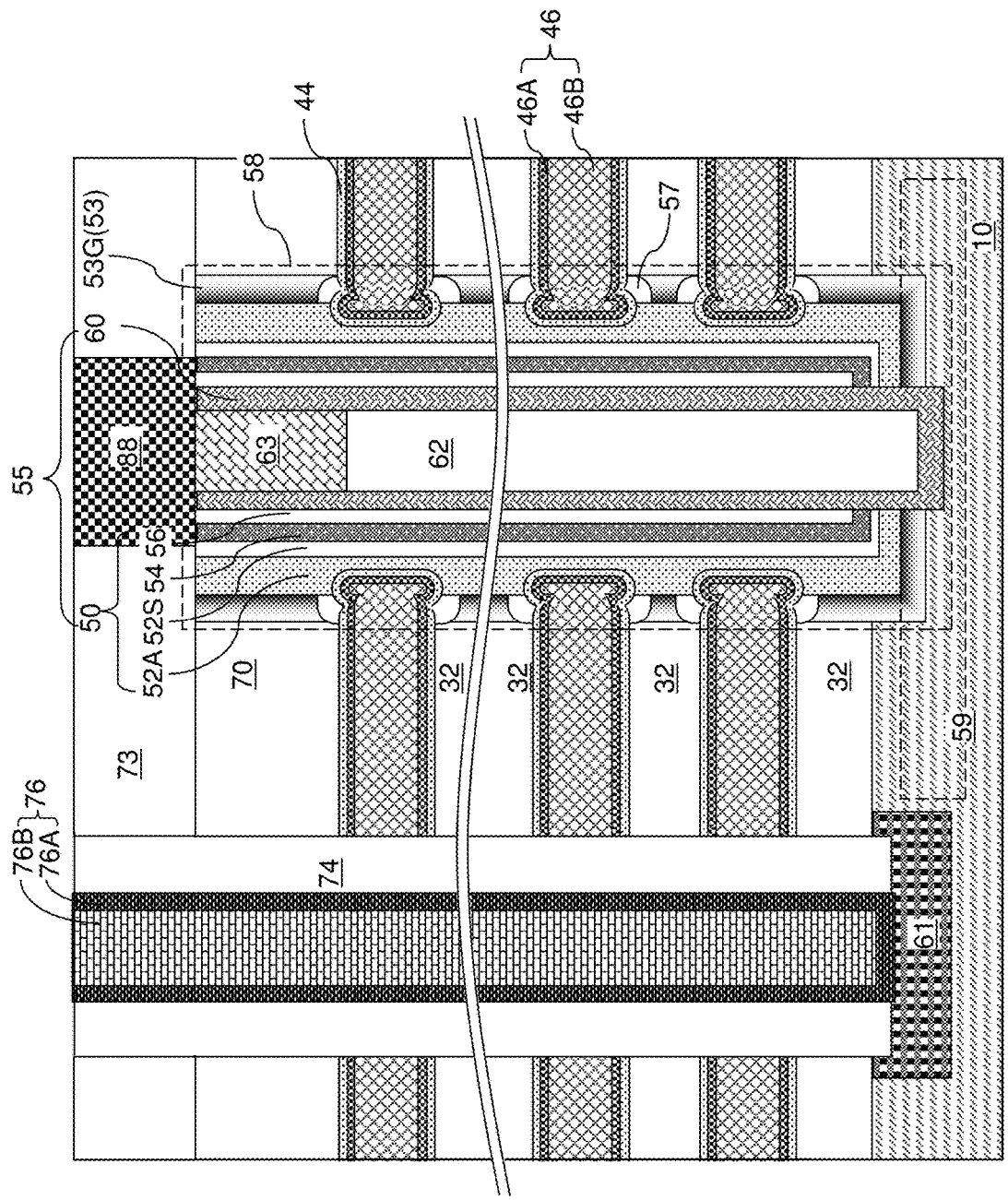

FIGS. 12A and 12B are sequential vertical cross-sectional views of a region of a first alternative embodiment of the first exemplary structure during formation of electrically conductive layers 46 according to the first embodiment of the present disclosure.

Referring to FIG. 12A, the first alternative configuration of the first exemplary structure may be derived from the first exemplary structure illustrated at the processing steps of FIG. 9C by performing an oxidation process, such as a thermal or plasma oxidation process. The oxidation process converts exposed surface portions of the tubular graded silicon oxynitride portions 53G into silicon oxide portions 57. The distance between a physically exposed sidewall and an interface with a respective tubular graded silicon oxynitride portion 53G for each silicon oxide portion 57 may be in a range from 1 nm to 10 nm, although lesser and greater distances may also be employed.

Referring to FIG. 12B, the processing steps of FIGS. 9D-9G, 10, and 11A-11C can be performed. In one embodiment, each of the electrically conductive layers 46 is spaced from the dielectric metal oxide blocking dielectric layer 52A by a respective backside blocking dielectric layer 44. In one embodiment, the memory opening fill structure 58 comprises a vertical stack of silicon oxide portions 57 located between neighboring pairs of an electrically conductive layer 46 of the electrically conductive layers 46 and a tubular graded silicon oxynitride portion 53G of the vertical stack of tubular graded silicon oxynitride portions 53G. In one embodiment, the respective backside blocking dielectric layer 44 may be in contact with a respective pair of silicon oxide portions 57 within the vertical stack of silicon oxide portions 57.

Figure 13A:
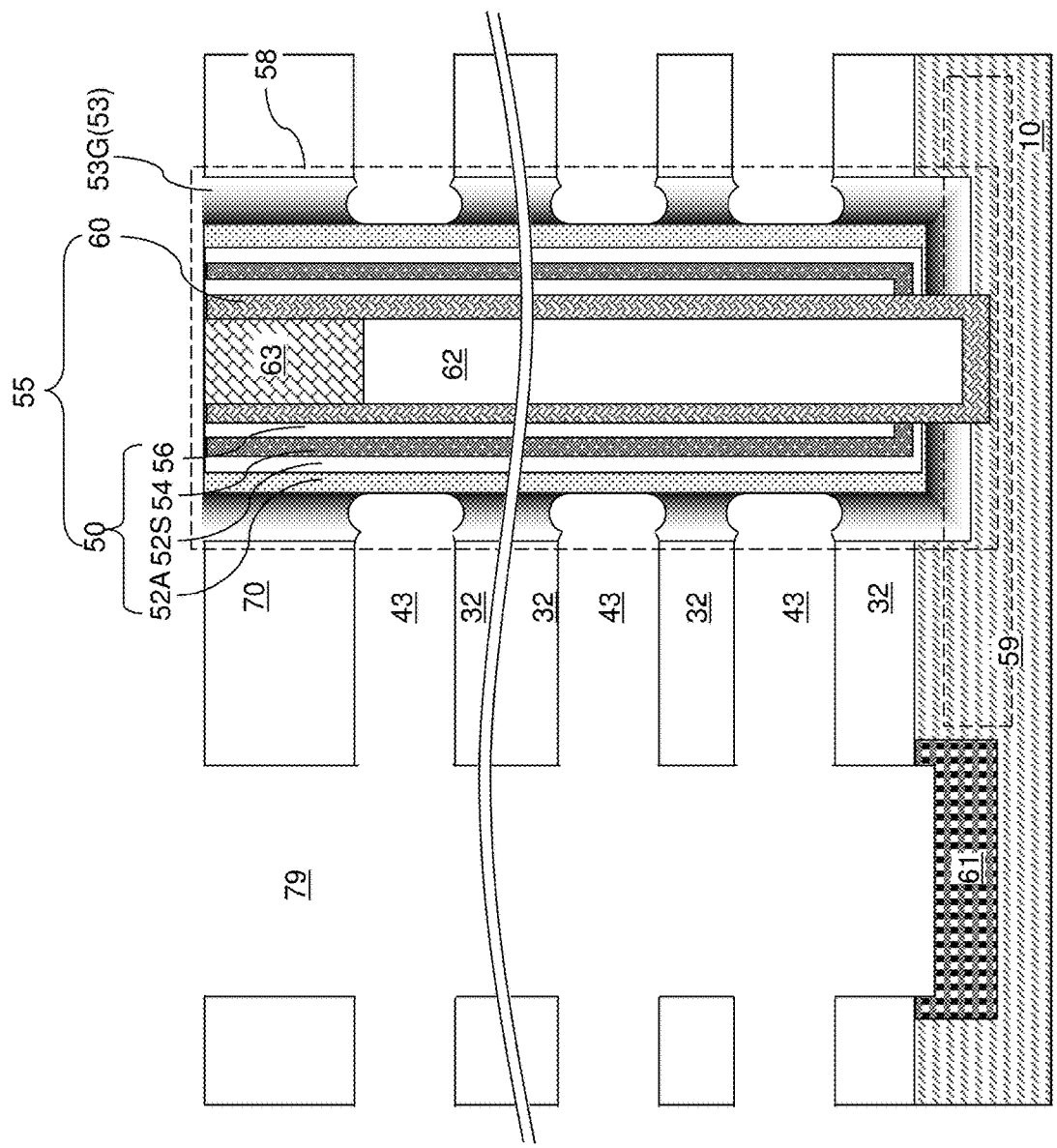
FIGS. 13A and 13B are sequential vertical cross-sectional views of a region of a second alternative embodiment of the first exemplary structure during formation of electrically conductive layers according to the first embodiment of the present disclosure.
Figure 13B:
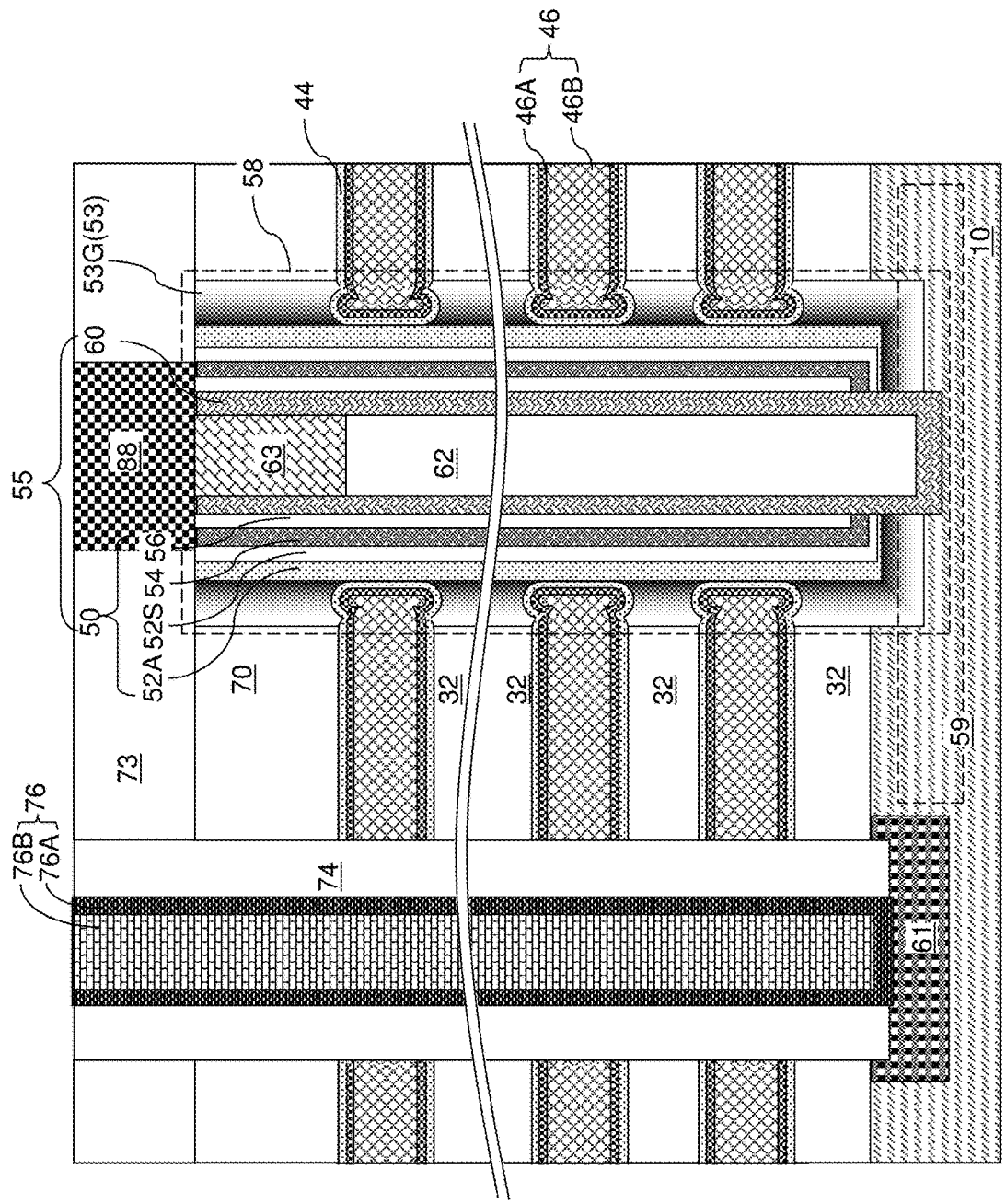

FIGS. 13A and 13B are sequential vertical cross-sectional views of a region of a second alternative embodiment of the first exemplary structure during formation of electrically conductive layers according to the first embodiment of the present disclosure.

Referring to FIG. 13A, the second alternative embodiment of the first exemplary structure may be derived from the first exemplary structure of FIG. 9B by performing a second isotropic etch process described with reference to FIG. 9C with a modification to the etch chemistry and/or to the duration of the second isotropic etch process such that the etch process stops on the outer sidewall of the material of the dielectric metal oxide blocking dielectric layer 52A. In this embodiment, the etch chemistry of the second isotropic etch process may be modified such that the second isotropic etch process etches the nitrogen-rich portions of the tubular graded silicon oxynitride portions 53G selective to the material of the dielectric metal oxide blocking dielectric layer 52A. Alternatively and/or additionally, the duration of the second anisotropic etch process can be selected such that portions of the outer cylindrical sidewall of the dielectric metal oxide blocking dielectric layer 52A are physically exposed without etching the dielectric metal oxide blocking dielectric layer 52A. Thus, the backside recesses 43 do not extend into the dielectric metal oxide blocking dielectric layer 52A.

Referring to FIG. 13B, the processing steps of FIGS. 9D-9G, 10, and 11A-11C can be subsequently performed. In one embodiment, the dielectric metal oxide blocking dielectric layer 52A may have a uniform lateral thickness throughout. In one embodiment, the dielectric metal oxide blocking dielectric layer 52A may comprise a straight inner sidewall that vertically extends straight through each of the electrically conductive layers from a top periphery of the straight inner sidewall to a bottom periphery of the straight inner sidewall, and may comprise a straight outer sidewall that vertically extends straight through each of the electrically conductive layers from a top periphery of the straight outer sidewall to a bottom periphery of the straight outer sidewall. The electrically conductive layers 46 or the backside blocking dielectric layers 44 (if present) contact the outer sidewall of the dielectric metal oxide blocking dielectric layer 52A.

Figure 14:
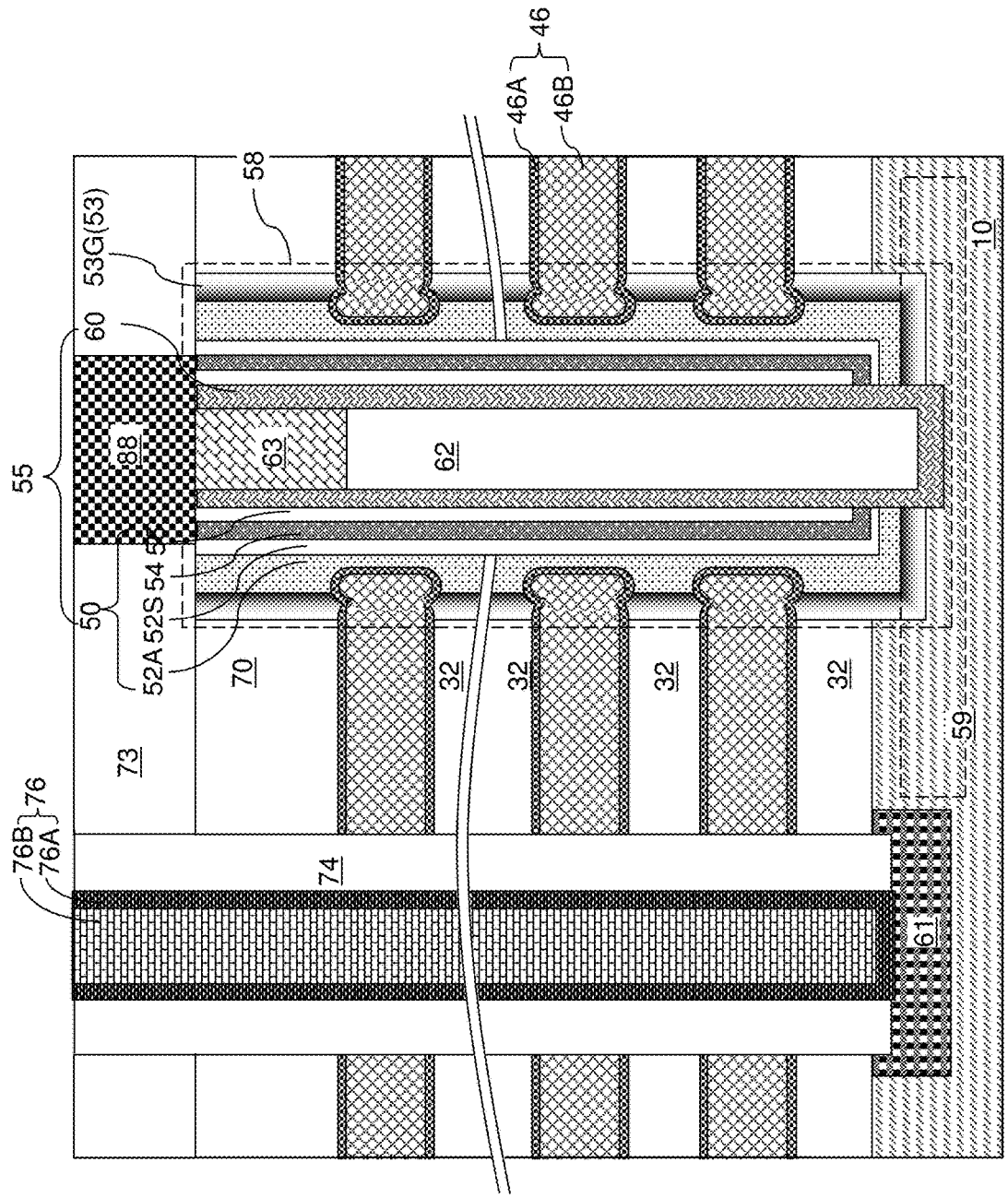
FIG. 14 is a vertical cross-sectional view of a region of a third alternative embodiment of the first exemplary structure according to the first embodiment of the present disclosure.

Referring to FIG. 14, a region of a third alternative embodiment of the first exemplary structure according to the first embodiment of the present disclosure is illustrated. The third alternative embodiment of the first exemplary structure may be derived from the first exemplary structure or the previously described alternative embodiments thereof by omitting formation of the backside blocking dielectric layer 44. In one embodiment, each of the electrically conductive layers 46 may be in direct contact with a respective pair of insulating layers 32 within the insulating layers 32 of the alternating stack (32, 46), and is in direct contact with a respective pair of tubular graded silicon oxynitride portions 53G within the vertical stack of tubular graded silicon oxynitride portions 53G (or in direct contact with the silicon oxide portions 57, if present).

Referring to FIGS. 1-14 and according to various embodiments of the first exemplary structure, a semiconductor structure comprises an alternating stack of insulating layers 32 and electrically conductive layers 46; a memory opening 49 vertically extending through the alternating stack (32, 46), and a memory opening fill structure 58 located in the memory opening 49 and comprising a vertical semiconductor channel 60, a memory film 50 in contact with the vertical semiconductor channel 60, and a vertical stack of tubular graded silicon oxynitride portions 53G laterally surrounding the memory film 50 and having a composition gradient such that an atomic concentration of nitrogen decreases with a lateral distance from an outer sidewall of the memory film 50. In one embodiment, the memory film comprises a dielectric metal oxide blocking dielectric layer. In one embodiment, each of the electrically conductive layers 46 has a hammerhead-shaped vertical cross-sectional profile such that a vertical extent of each of the electrically conductive layers 46 has a local minimum LM within a cylindrical volume laterally bounded by outer sidewall segments of the memory opening fill structure 58. In one embodiment, the vertical extent of each of the electrically conductive layers 46 may have the local minimum LM within a cylindrical volume laterally bounded by a sidewall of a respective memory opening 49 (as formed at the processing steps of FIGS. 4A, 4B, and 5A). In one embodiment, the local minimum LM may be located between a first cylindrical plane CP1 including outer sidewalls of a vertical stack of tubular graded silicon oxynitride portions 53G within a memory opening fill structure 58 and a second cylindrical plane CP2 including inner sidewalls of the vertical stack of tubular graded silicon oxynitride portions 53G. In one embodiment, the local minimum LM may be located along a continuous closed shape (such as a circle or an ellipse) that is equidistant from the first cylindrical plane in a plan view along a vertical direction, for example, as illustrated in FIG. 9G.

According to an aspect of the present disclosure, a second exemplary structure according to a second embodiment of the present disclosure may be derived from the first exemplary structure of FIGS. 4A, 4B, and 5A by alternating components of each memory opening fill structure 58. FIGS. 15A-15H are sequential schematic vertical cross-sectional views of a memory opening 49 within a second exemplary structure during formation of a memory opening fill structure 58 therein according to the second embodiment of the present disclosure.

Figures 15A, 15B:
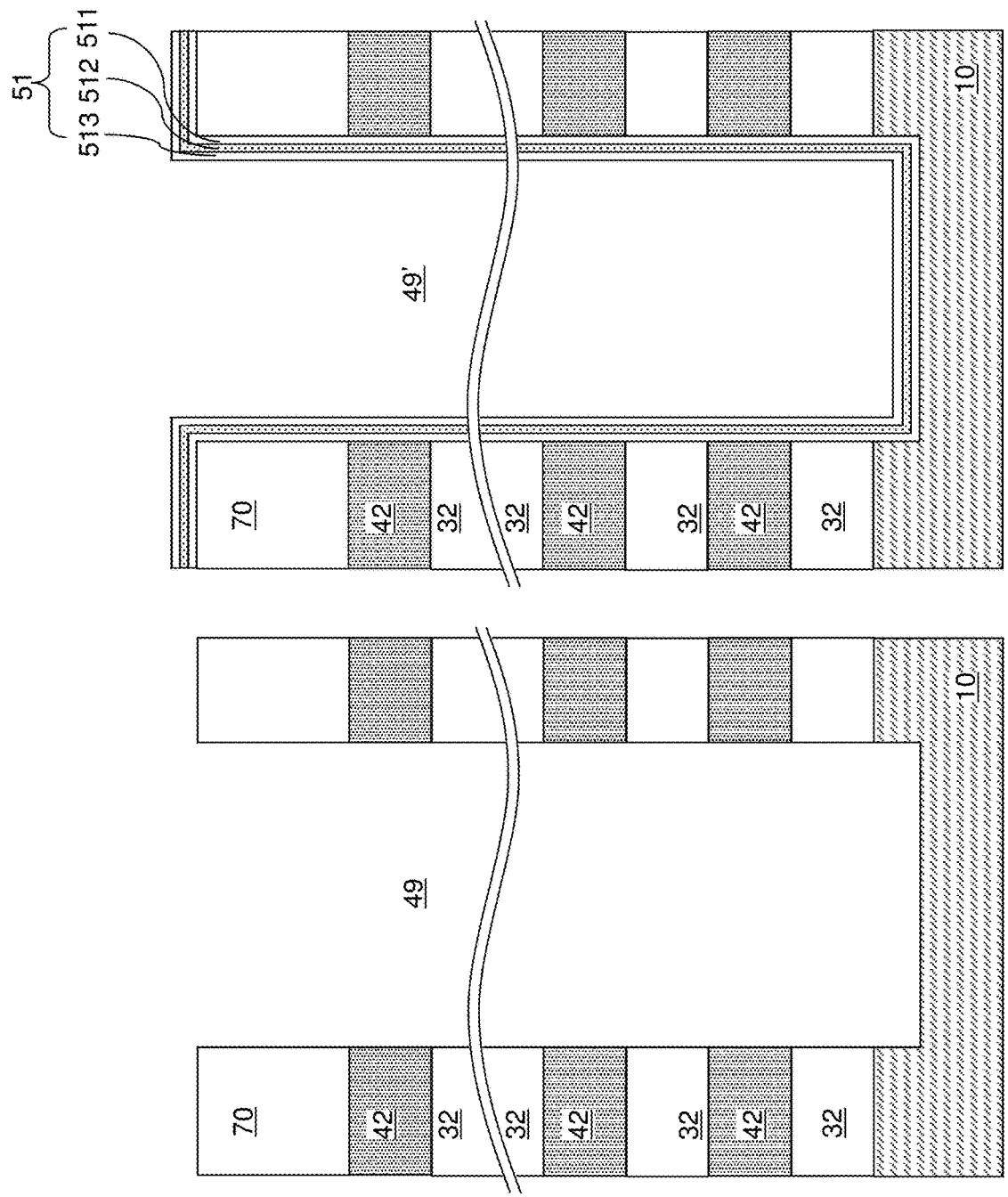

Referring to FIG. 15A, each memory opening 49 within the second exemplary structure may be the same as the memory opening 49 illustrated in FIG. 5A at a processing step that corresponds to the processing steps of FIGS. 4A, 4B, and 5A.

Referring to FIG. 15B, a composite dielectric spacer layer 51 is formed on the physically exposed surfaces of each memory opening 49 and each support opening 19 and over the top surface of the insulating cap layer 70. In one embodiment, the composite dielectric spacer layer 51 comprises a layer stack that includes a first silicon oxide spacer layer 511 (which is also referred to as an outer silicon oxide spacer layer), a dielectric metal oxide spacer layer 512, and a second silicon oxide spacer layer 513. The first silicon oxide spacer layer 511, the dielectric metal oxide spacer layer 512, and the second silicon oxide spacer layer 513 may be sequentially deposited by a respective conformal deposition process. The conformal deposition processes employed to deposit the first silicon oxide spacer layer 511, the dielectric metal oxide spacer layer 512, and the second silicon oxide spacer layer 513 may comprise at least one low pressure chemical vapor deposition process and/or at least one atomic layer deposition process.

The first silicon oxide spacer layer 511 and the second silicon oxide spacer layer 513 comprise, and/or consist essentially of, silicon oxide. The dielectric metal oxide spacer layer 512 comprises, and/or consists essentially of, a dielectric metal oxide material, such as aluminum oxide. The thickness of the first silicon oxide spacer layer 511 may be in a range from 2 nm to 20 nm, such as from 4 nm to 10 nm, although lesser and greater thicknesses may also be employed. The thickness of the dielectric metal oxide spacer layer 512 may be in a range from 2 nm to 20 nm, such as from 4 nm to 10 nm, although lesser and greater thicknesses may also be employed. The thickness of the third silicon oxide spacer layer 513 may be in a range from 2 nm to 20 nm, such as from 4 nm to 10 nm, although lesser and greater thicknesses may also be employed.

Referring to FIG. 15C, a stack of layers including the dielectric metal oxide blocking dielectric layer 52A, a memory material layer 54, a dielectric material liner 56, and an optional sacrificial cover material layer (not illustrated) can be sequentially deposited in the memory openings 49 by a respective conformal deposition process, as described in the first embodiment above. Each of the dielectric metal oxide blocking dielectric layer 52A, the memory material layer 54, the dielectric material liner 56, and the optional sacrificial cover material layer may have the same material composition and the same thickness range as in the first exemplary structure illustrated in FIG. 5C. The dielectric metal oxide blocking dielectric layer 52A may be deposited directly on the composite dielectric spacer layer 51, and the memory material layer 54 may be deposited directly on the dielectric metal oxide blocking dielectric layer 52A.

Referring to FIG. 15D, at least one anisotropic etch process may be performed to sequentially etch horizontally-extending portions of the optional sacrificial cover material layer (if present), the dielectric material liner 56, the memory material layer 54, the dielectric metal oxide blocking dielectric layer 52A, and the composite dielectric spacer layer 51. A surface of the semiconductor material layer 10 can be physically exposed underneath each opening through the layer stack (51, 52A, 54, 56) at the bottom of a respective memory opening 49. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance.

A set of a dielectric metal oxide blocking dielectric layer 52A, a memory material layer 54, and a dielectric material liner 56 in a memory opening 49 constitutes a memory film 50. In one embodiment, the memory film 50 may include a plurality of charge storage regions (comprising portions of the memory material layer 54) that are insulated from surrounding materials by the dielectric metal oxide blocking dielectric layer 52A or by the dielectric material liner 56. In one embodiment, the dielectric material liner 56, the memory material layer 54, the dielectric metal oxide blocking dielectric layer 52A, and the composite dielectric spacer layer 51 can have vertically coincident sidewalls around an opening through the memory film 50 at the bottom of each memory opening 49.

Figures 15E, 15F:
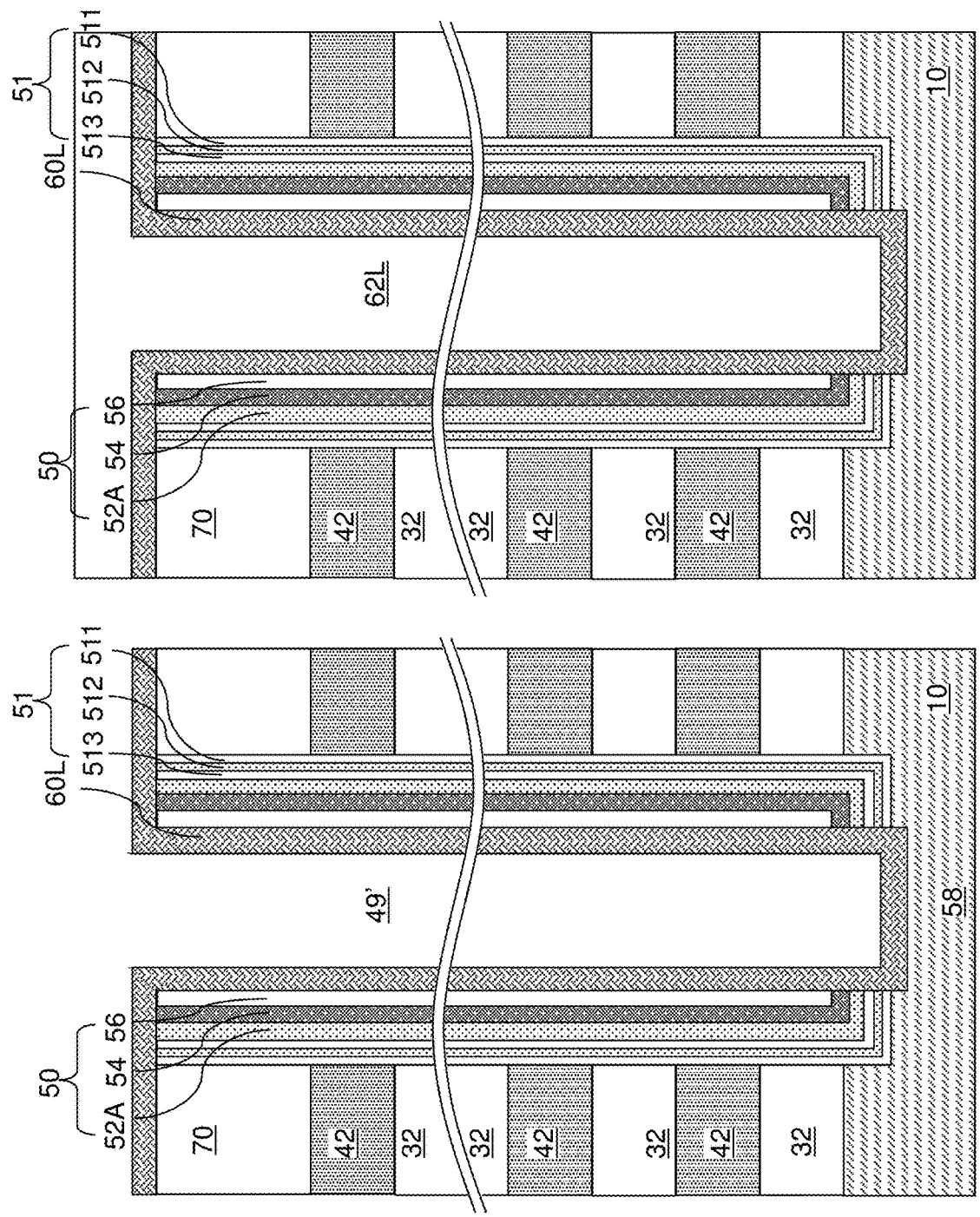

Referring to FIG. 15E, the semiconductor channel layer 60L can be deposited directly on the semiconductor surface of the semiconductor material layer 10, and directly on the dielectric material liner 56. The material composition and the thickness range of the semiconductor channel layer 60L may be the same as in the first exemplary structure.

Referring to FIG. 15F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 15H:
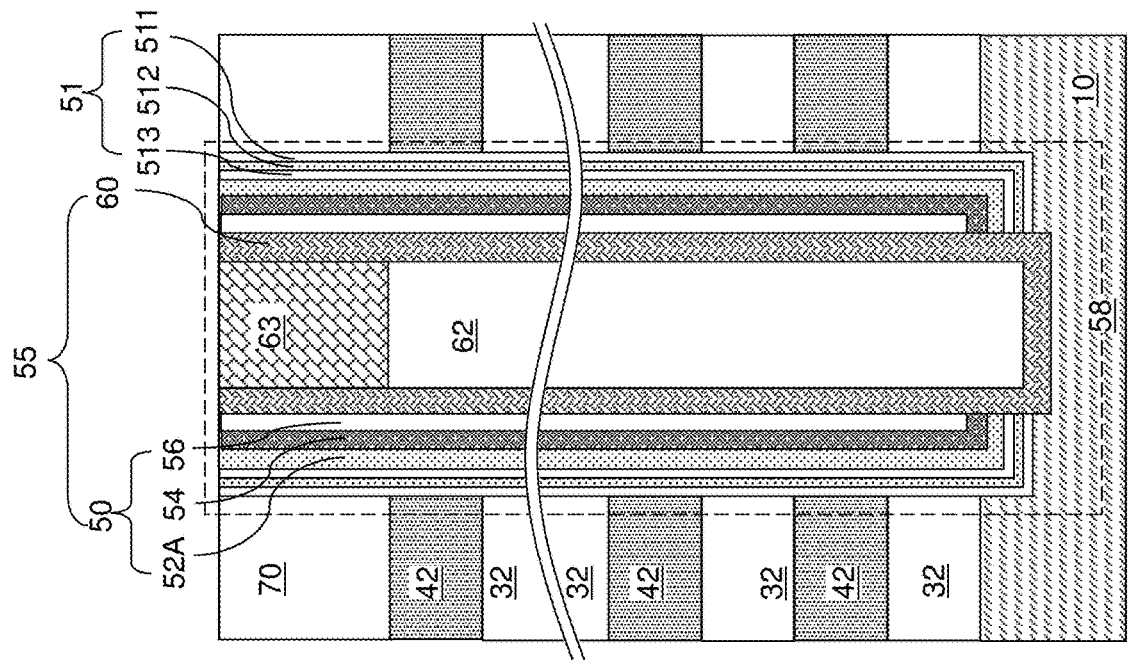
Figure 15G:
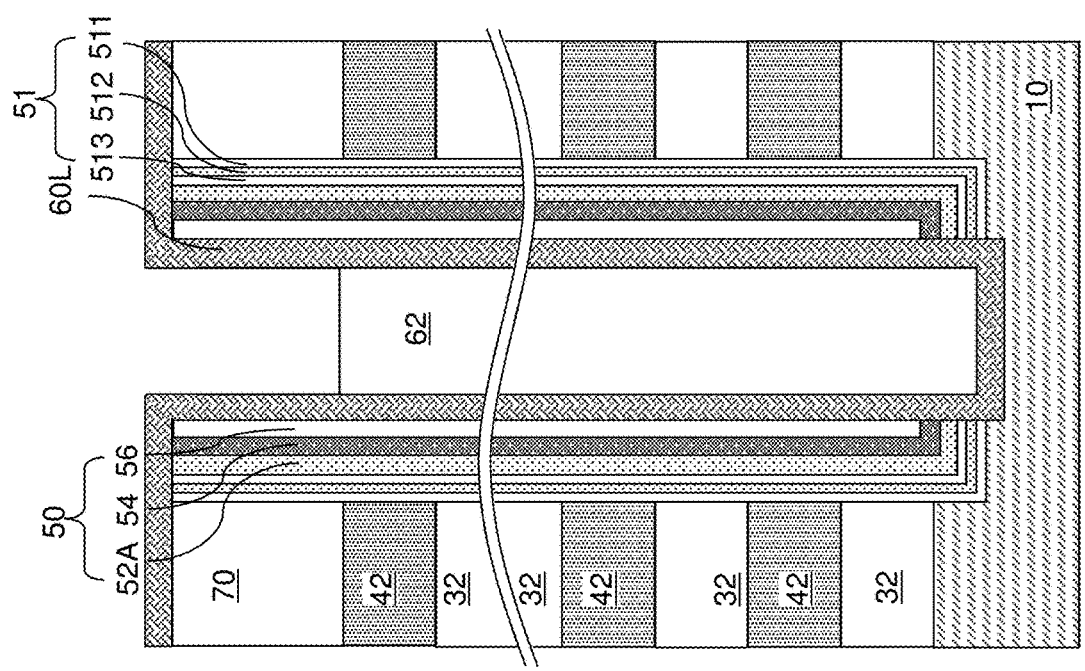

Referring to FIG. 15G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 15H, the processing steps of FIG. 5H may be performed to form a vertical semiconductor channel 60 and a drain region 63 within each memory opening 49. According to an embodiment of the present disclosure, the memory film 50 comprises a dielectric metal oxide blocking dielectric layer 52A that is formed directly on the inner cylindrical sidewall of the composite dielectric spacer layer 51.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements comprising portions of the memory material layer 54, and a dielectric metal oxide blocking dielectric layer 52A. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. In one embodiment, the memory opening fill structure 58 comprises a composite dielectric spacer layer 51, a dielectric metal oxide blocking dielectric layer 52A, a memory material layer 54, an optional dielectric material liner 56, a vertical semiconductor channel 60, a dielectric core 62, and a drain region 63.

Generally, an instance of a memory opening fill structure 58 illustrated in FIG. 15H can be formed within each memory opening 49 of the structure of FIGS. 4A and 4B. An instance of the support pillar structure can be formed within each support opening 19 of the structure of FIGS. 4A and 4B. Generally, the composite dielectric spacer layer 51 comprises a stack of a first silicon oxide spacer layer 511, a dielectric metal oxide spacer layer 512, and a second silicon oxide spacer layer 513. The memory film 50 may be formed by sequentially depositing a dielectric metal oxide blocking dielectric layer 52A, a memory material layer 54 (which may comprise a charge storage layer), and dielectric material liner 56 (such as a tunneling dielectric layer) over the second silicon oxide spacer layer 513.

Subsequently, the processing steps of FIGS. 7A-7C and the processing steps of FIGS. 8 and 9A can be performed to provide the second exemplary structure illustrated in FIG. 16A.

Figure 16A:
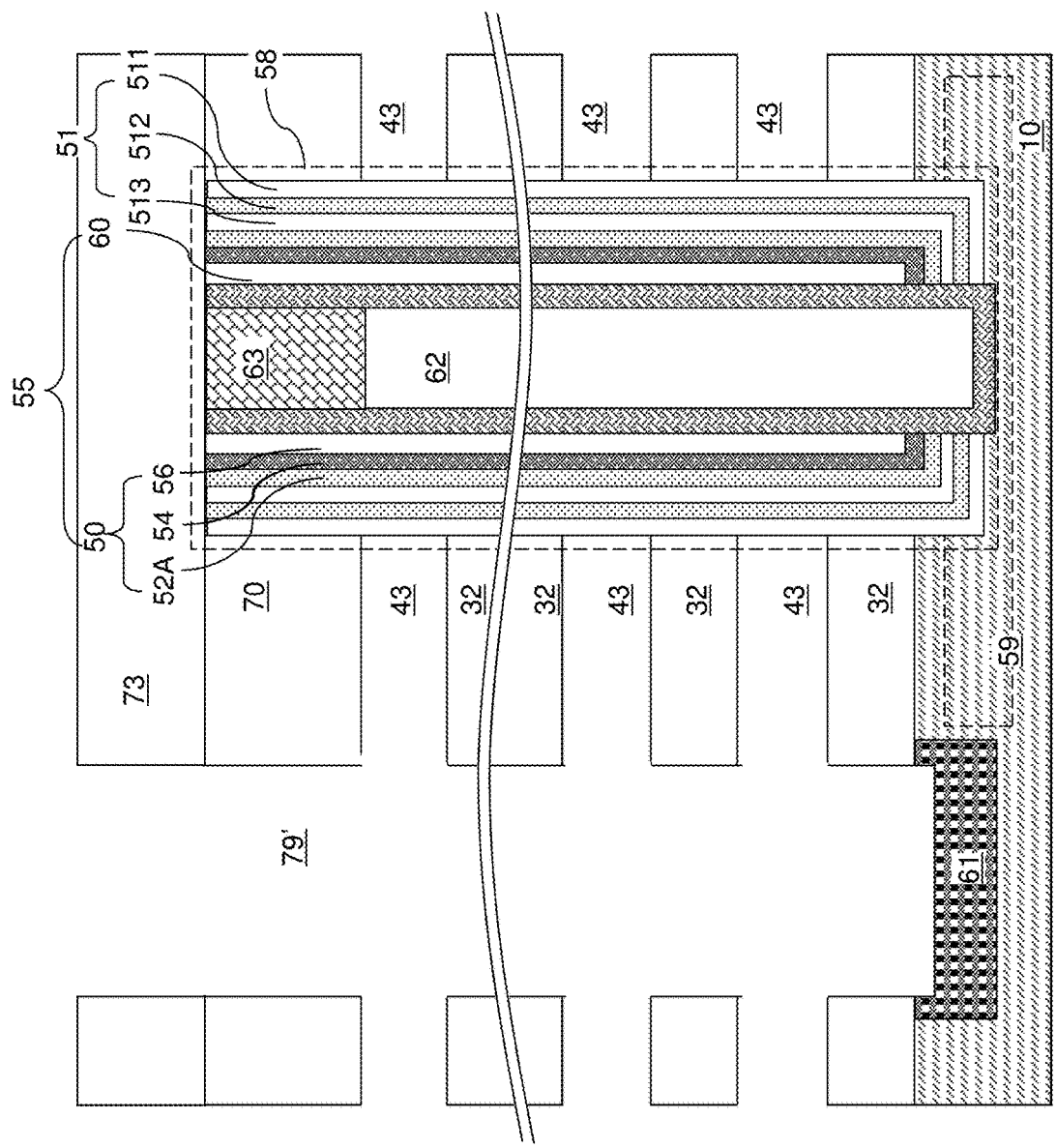
FIGS. 16A-16G are sequential vertical cross-sectional views of a region of the second exemplary structure during formation of electrically conductive layers and contact via structures according to the second embodiment of the present disclosure.

Referring to FIG. 16A, an etchant that selectively etches the second material of the sacrificial material layers 42 with respect to the first material of the insulating layers 32 and the silicon oxide material of the first silicon oxide spacer layer 511 can be introduced into the backside trenches 79, for example, employing an etch process. Backside recesses 43 are formed in volumes from which the sacrificial material layers 42 are removed. In one embodiment, the sacrificial material layers 42 can include silicon nitride, and the materials of the insulating layers 32 and the retro-stepped dielectric material portion 65 can be silicon oxide and/or dielectric metal oxide. Generally, the backside recesses 43 can be formed by removing the sacrificial material layers 42 selective to the insulating layers 32 and the first silicon oxide spacer layer 511. In one embodiment, the etch process that removes the second material selective to the first material and the first silicon oxide spacer layer 511 may be the same as the etch process described above with reference to FIGS. 8 and 9A.

Figure 16B:
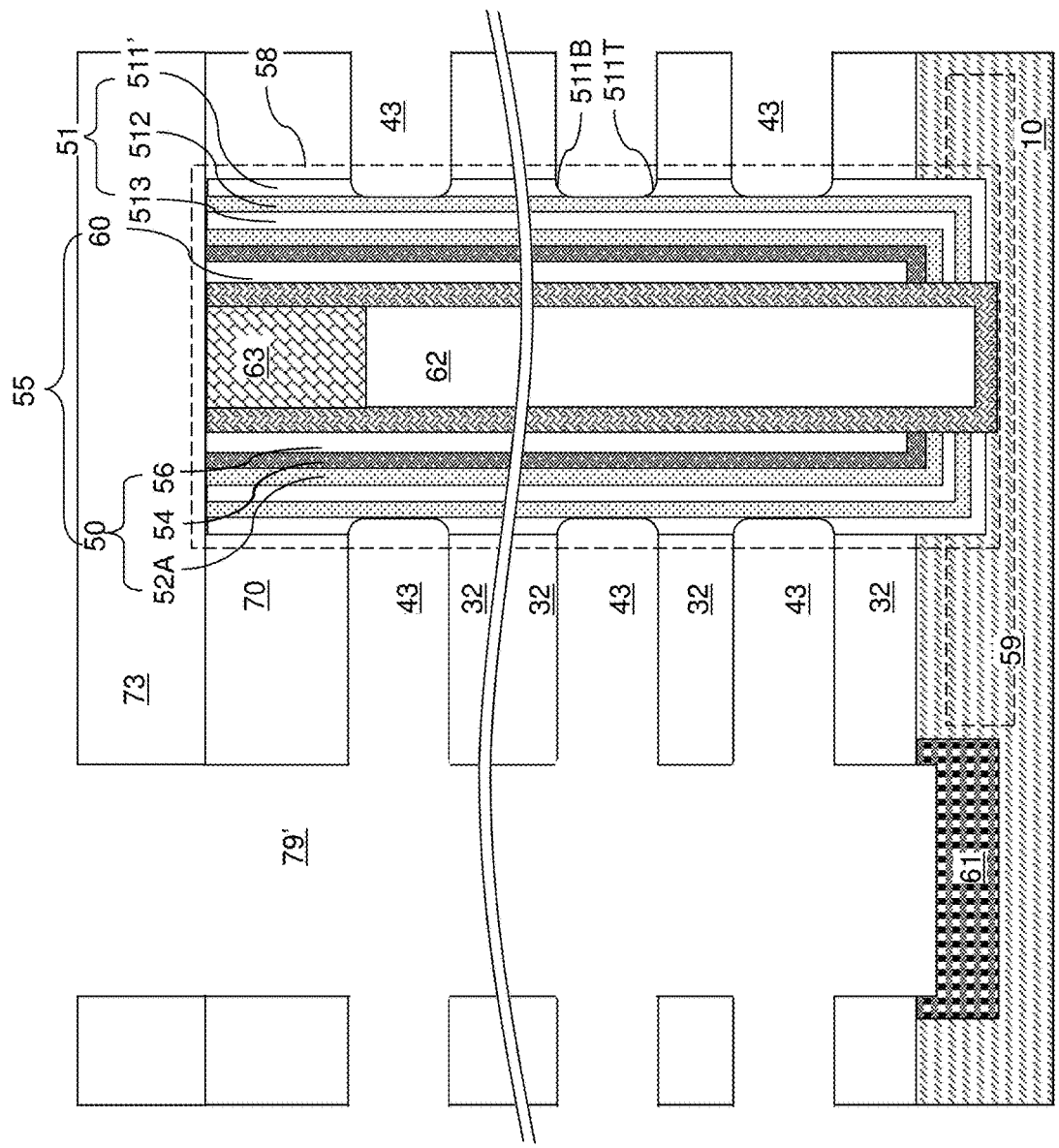

Referring to FIG. 16B, a first isotropic etch process can be performed to isotropically etch the silicon oxide material of the portions of the first silicon oxide spacer layer 511 located around the backside recesses 43. The first isotropic etch process etches silicon oxide selective to the material of the dielectric metal oxide spacer layer 512. The duration of the first isotropic etch process can be selected such that cylindrical segments of the outer sidewall of the dielectric metal oxide spacer 512 are physically exposed around the backside recesses 43. The recess distance of the first isotropic etch process into the first silicon oxide spacer layer 511 may be in a range from 100% to 130% of the thickness of the first silicon oxide spacer layer 511. Surface portions of the insulating layers 32, the insulating cap layer 70, and the contact-level dielectric layer 73 may be collaterally recessed during the first isotropic etch process. In an illustrative example, the first isotropic etch process may comprise a wet isotropic etch process employing dilute hydrofluoric acid.

The backside recesses 43 are expanded into the composite dielectric spacer layer 51 around the memory film 50. The first silicon oxide spacer layer 511 can be divided into a vertical stack of first tubular silicon oxide spacers 511' having a uniform thickness and having at least one tapered concave annular surface. A subset of the first tubular silicon oxide spacers 511' may comprise a respective tapered concave top annular surface 511T and a respective tapered concave bottom annular surface 511B.

Figure 16C:
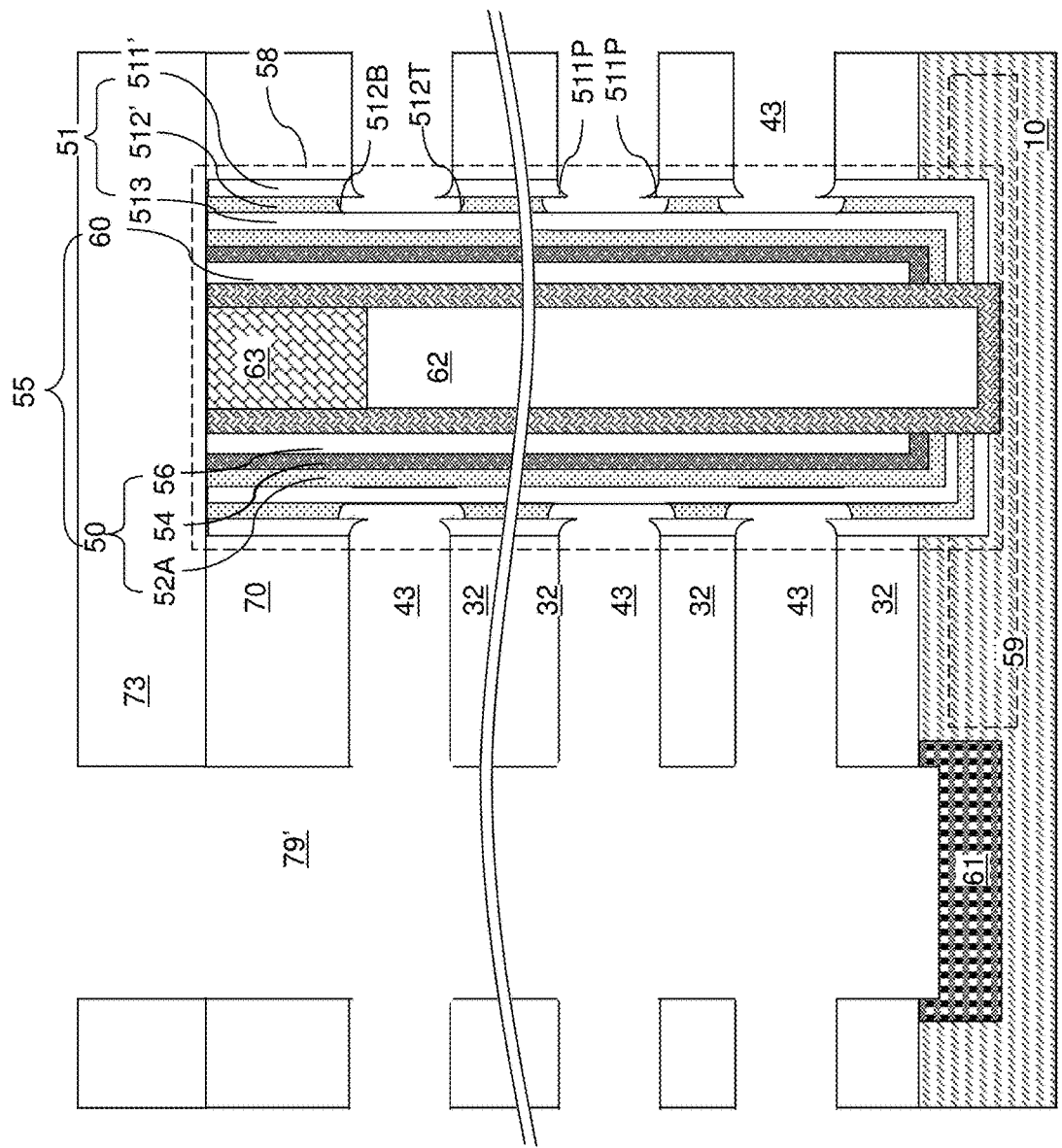

Referring to FIG. 16C, a second isotropic etch process can be performed to isotropically etch the dielectric metal oxide material of the portions of the dielectric metal oxide spacer layer 512 located around the backside recesses 43. The second isotropic etch process etches the dielectric metal oxide material of the dielectric metal oxide spacer layer 512 selective to the silicon oxide material of the first tubular silicon oxide spacers 511' and selective to the materials of the insulating layers 32, the insulating cap layer 70, and the contact-level dielectric layer 73. The duration of the second isotropic etch process can be selected such that cylindrical segments of the outer sidewall of the second silicon oxide spacer 513 are physically exposed around the backside recesses 43. The recess distance of the second isotropic etch process into the dielectric metal oxide spacer layer 512 may be in a range from 100% to 200% of the thickness of the dielectric metal oxide spacer layer 512. In an illustrative example, the second isotropic etch process may comprise a wet isotropic etch process employing hot phosphoric acid. The respective tapered concave top annular surface 511T and the respective tapered concave bottom annular surface 511B define respective protruding portions 511P of the first tubular silicon oxide spacers 511'.

The backside recesses 43 are expanded into the composite dielectric spacer layer 51 around the memory film 50. The dielectric metal oxide spacer layer 512 can be divided into a vertical stack of tubular dielectric metal oxide spacers 512' having a uniform thickness and having at least one tapered concave annular surface. A subset of the tubular dielectric metal oxide spacers 512' may comprise a respective tapered concave top annular surface 512T and a respective tapered concave bottom annular surface 512B. In one embodiment, the vertical extent of each backside recess 43 between a vertically neighboring pair of tubular dielectric metal oxide spacers 512' may be greater than the vertical extent of the horizontally-extending portion of the respective backside recess 43 between a vertically neighboring pair of insulating layers 32.

Figure 16D:
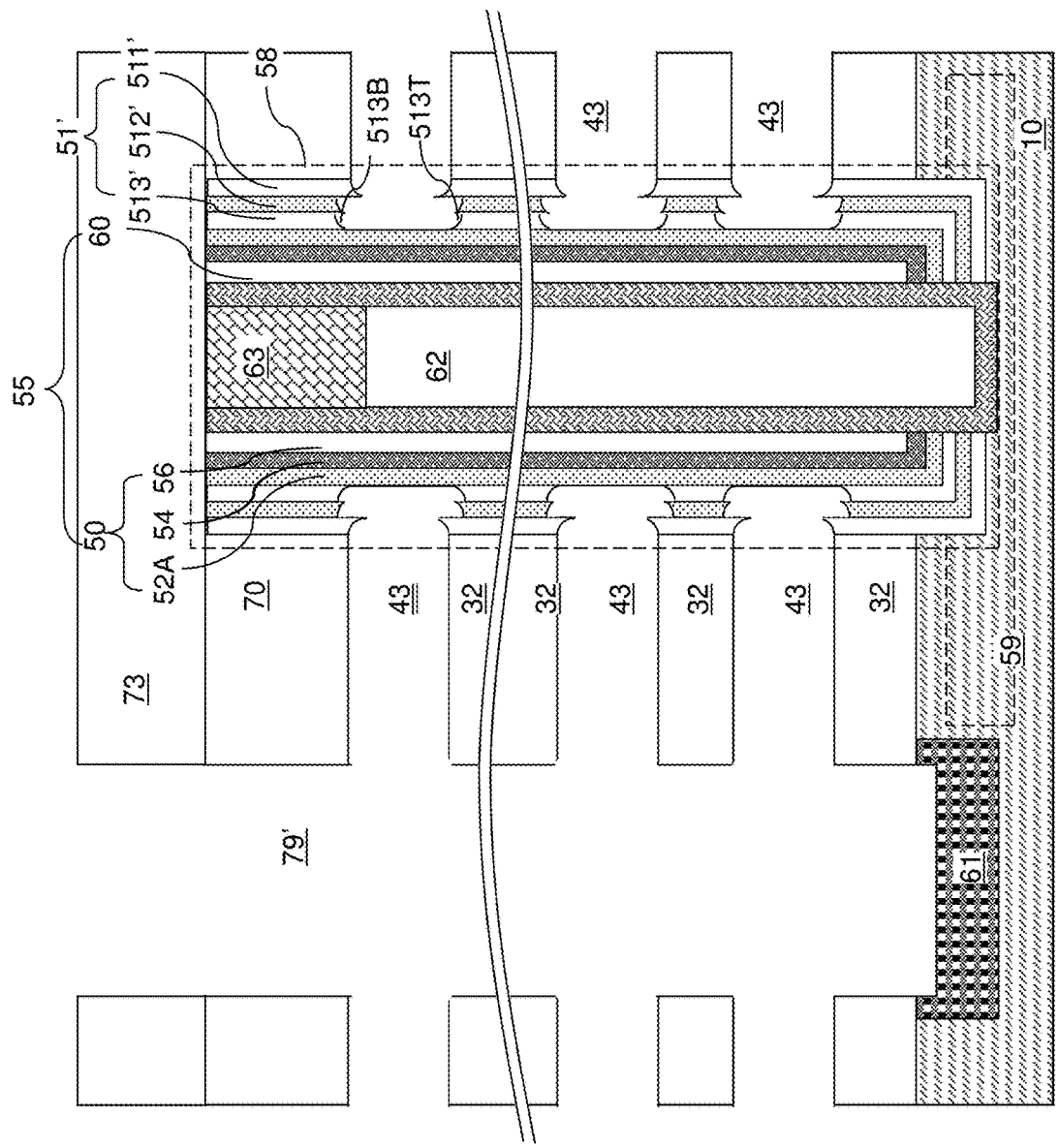

Referring to FIG. 16D, a third isotropic etch process can be performed to isotropically etch the silicon oxide material of the portions of the second silicon oxide spacer layer 513 located around the backside recesses 43. The third isotropic etch process etches the silicon oxide material of the second silicon oxide spacer layer 513 selective to the material of the memory material layer 54, and selective to the dielectric metal oxide material of the tubular dielectric metal oxide spacers 512'. The first tubular silicon oxide spacers 511', the insulating layers 32, the insulating cap layer 70, and the contact-level dielectric layer 73 may be collaterally recessed during the third isotropic etch process. The duration of the third isotropic etch process can be selected such that cylindrical segments of the outer sidewall of the second silicon oxide spacer 513 are physically exposed around the backside recesses 43. The recess distance of the third isotropic etch process into the second silicon oxide spacer layer 513 may be in a range from 100% to 200% of the thickness of the second silicon oxide spacer layer 513. In an illustrative example, the third isotropic etch process may comprise a wet etch process employing dilute hydrofluoric acid.

The backside recesses 43 are expanded through the composite dielectric spacer layer 51 around the memory film 50. The second silicon oxide spacer layer 513 can be divided into a vertical stack of second tubular silicon oxide spacers 513' having a uniform thickness and having at least one tapered concave annular surface. A subset of the second tubular silicon oxide spacers 513' may comprise a respective tapered concave top annular surface 513T and a respective tapered concave bottom annular surface 513B. In one embodiment, the vertical extent of each backside recess 43 between a vertically neighboring pair of second tubular silicon oxide spacers 513' may be greater than the vertical extent of the horizontally-extending portion of the respective backside recess 43 between a vertically neighboring pair of insulating layers 32. In one embodiment, the vertical extent of each backside recess 43 between a vertically neighboring pair of tubular dielectric metal oxide spacers 512' may also be greater than the vertical extent of the horizontally-extending portion of the respective backside recess 43 between a vertically neighboring pair of insulating layers 32.

Each contiguous set of a first tubular silicon oxide spacer 511', a tubular dielectric metal oxide spacer 512', and a second tubular silicon oxide spacer 513' constitutes a tubular composite dielectric spacer 51'. Generally, the composite dielectric spacer layer 51 can be divided into a vertical stack of tubular composite dielectric spacers 51' by a combination of isotropic etch processes, such as the combination of the first isotropic etch process, the second isotropic etch process, and the third isotropic etch process. The vertical stack of tubular composite dielectric spacers 51' laterally surrounds the memory film 50, which may comprise a layer stack of a dielectric metal oxide blocking dielectric layer 52A, a memory material layer 54 (which may comprise a charge storage layer), and a dielectric material liner 56 (which may comprise a tunneling dielectric layer).

The cylindrical plane including the outer sidewalls of the vertical stack of tubular composite dielectric spacers 51' is herein referred to as a first cylindrical plane CP1. According to an aspect of the present disclosure, each first tubular silicon oxide spacer 511' within the vertical stack of tubular composite dielectric spacers 51' may have a variable vertical extent that increases with a lateral distance from the first cylindrical plane CP1. In one embodiment, each tubular dielectric metal oxide spacer 512' within the vertical stack of tubular composite dielectric spacers 512' has a variable vertical extent that increases with a lateral distance from the first cylindrical plane CP1. In one embodiment, each second tubular silicon oxide spacer 513' within the vertical stack of tubular composite dielectric spacers 513' may have a variable vertical extent that increases with a lateral distance from the first cylindrical plane CP1.

In one embodiment, each of the tubular composite dielectric spacers 51' comprises a respective second tubular silicon oxide spacer 513' in contact with an outer sidewall of the memory film 50. In one embodiment, the memory film 50 may comprise a layer stack including a tunneling dielectric layer (comprising a dielectric material liner 56) in contact with the vertical semiconductor channel 60, a charge storage layer (comprising a memory material layer 54) in contact with the tunneling dielectric layer, and a dielectric metal oxide blocking dielectric layer 52A in contact with the charge storage layer 54 and with the vertical stack of tubular composite dielectric spacers 51'.

In one embodiment, a vertical cross-sectional profile of a tubular composite dielectric spacer 51' within the vertical stack of tubular composite dielectric spacers 51' comprises a serrated top surface including a concave top surface segment 511T of a first tubular silicon oxide spacer 511' of the first tubular silicon oxide spacers 511', a concave top surface segment 512T of a tubular dielectric metal oxide spacer 512' of the tubular dielectric metal oxide spacers 512', and a concave top surface segment 513T of a second tubular silicon oxide spacer 513' of the second tubular silicon oxide spacers 513'. In one embodiment, the serrated top surface comprises a first vertical surface segment (which is a first cylindrical surface segment) of the first tubular silicon oxide spacer 511' connecting the concave top surface segment of the first tubular silicon oxide spacer 511' and the concave top surface segment of the tubular dielectric metal oxide spacer 512', and an additional vertical surface segment (which is an additional cylindrical surface segment) of the tubular dielectric meal oxide spacer 512' connecting the concave top surface segment of the tubular dielectric metal oxide spacer 512' and the concave top surface segment of the second tubular silicon oxide spacer 513'.

In one embodiment, the vertical cross-sectional profile of a tubular composite dielectric spacer 51' within the vertical stack of tubular composite dielectric spacers 51' comprises a serrated bottom surface including a concave bottom surface segment 511B of a first tubular silicon oxide spacer 511' of the first tubular silicon oxide spacers 511', a concave bottom surface segment 512B of a tubular dielectric metal oxide spacer 512' of the tubular dielectric metal oxide spacers 512', and a concave bottom surface segment 513B of a second tubular silicon oxide spacer 513' of the second tubular silicon oxide spacers 513'. In one embodiment, the serrated bottom surface comprises a second vertical surface segment (which is a second cylindrical surface segment) of the first tubular silicon oxide spacer 511' connecting the concave bottom surface segment of the first tubular silicon oxide spacer 511' and the concave bottom surface segment of the tubular dielectric metal oxide spacer 512', and an additional vertical surface segment (which is an additional cylindrical surface segment) of the tubular dielectric meal oxide spacer 512' connecting the concave bottom surface segment of the tubular dielectric metal oxide spacer 512' and the concave bottom surface segment of the second tubular silicon oxide spacer 513'.

Figure 16E:
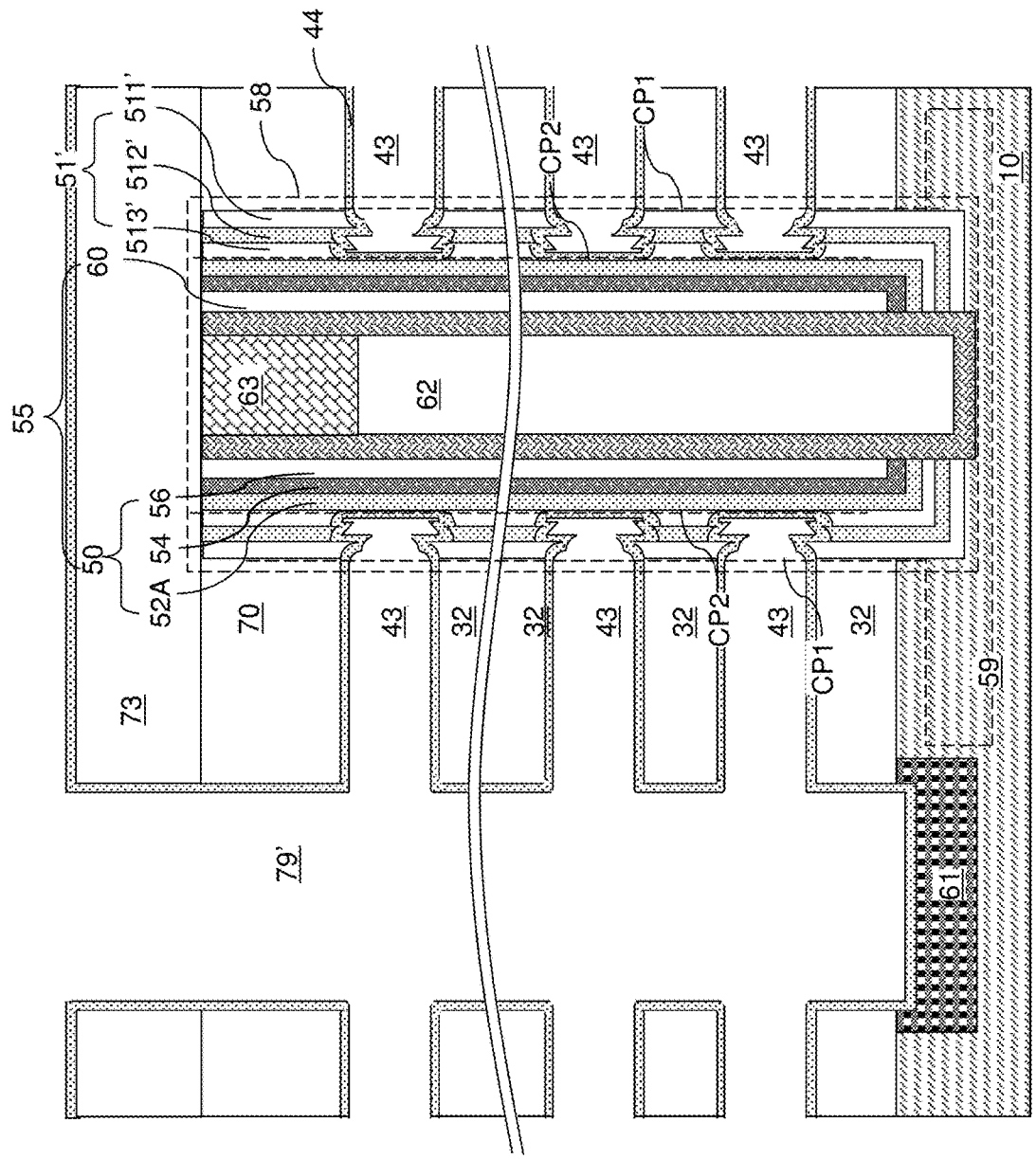

Referring to FIG. 16E, a backside blocking dielectric layer 44 can be optionally formed. The backside blocking dielectric layer 44, if present, comprises a dielectric material that functions as a control gate dielectric for the control gates to be subsequently formed in the backside recesses 43. The backside blocking dielectric layer 44 can be formed in the backside recesses 43 and on a sidewall of the backside trench 79. The backside blocking dielectric layer 44 can be formed directly on horizontal surfaces of the insulating layers 32 and directly on physically exposed surface segments of the dielectric metal oxide blocking dielectric layer 52A around the backside recesses 43. In one embodiment, the backside blocking dielectric layer 44 can be formed by a conformal deposition process such as atomic layer deposition (ALD). The material composition and the thickness range of the backside blocking dielectric layer 44 may be the same as in the first exemplary structure.

Figure 16F:
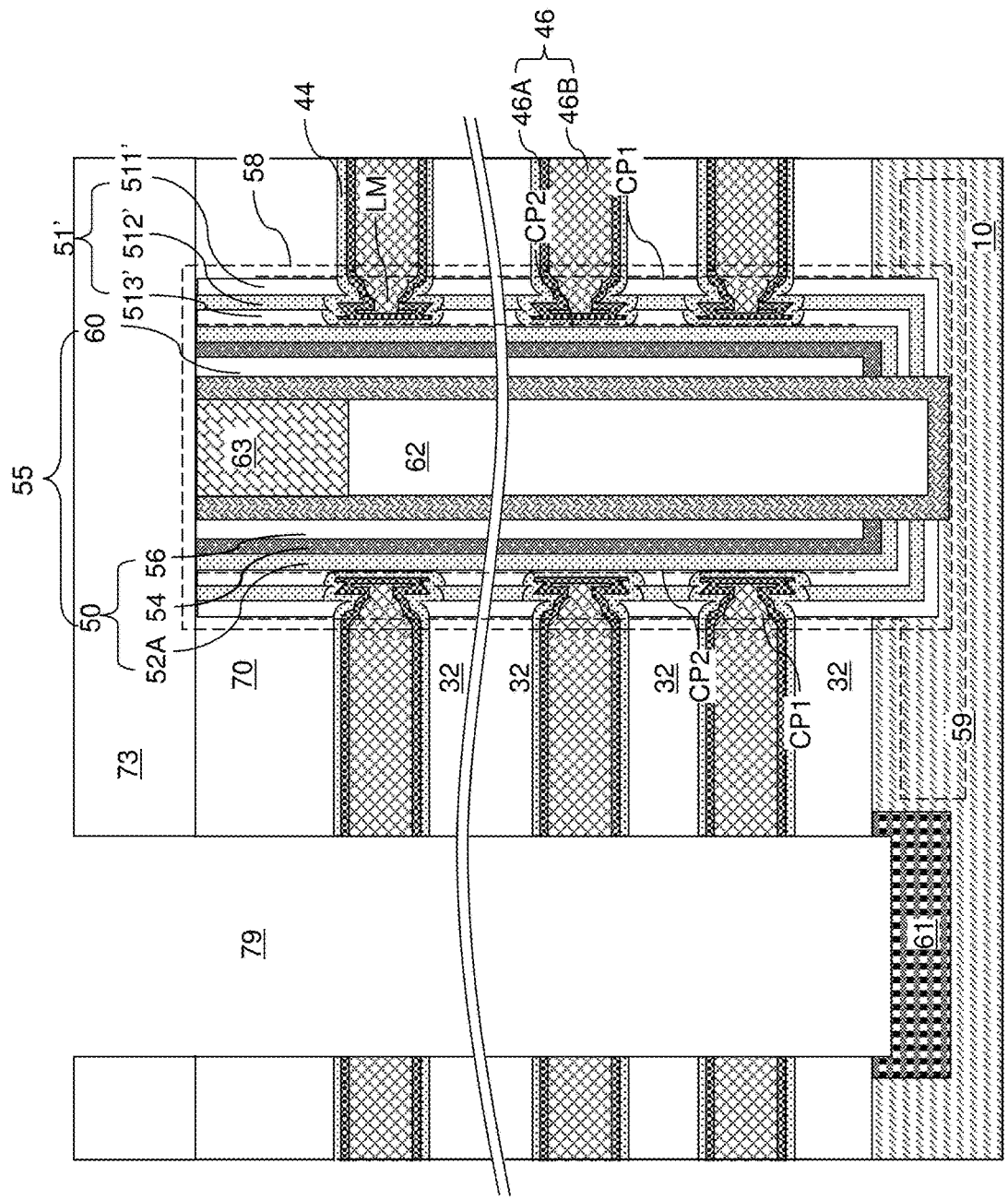

Referring to FIG. 16F, the processing steps of FIGS. 9E, 9F, and 9G can be performed to sequentially deposit a metallic barrier layer 46A and a metallic fill material layer 46B, and to remove a continuous metallic material layer 46L from inside the backside trenches 79 and from above the insulating cap layer 70. Each remaining portion of the metallic barrier layer 46A and the metallic fill material layer 46B in the backside recesses 43 constitutes an electrically conductive layer 46. Each electrically conductive layer 46 can be a conductive line structure. Thus, the sacrificial material layers 42 are replaced with the electrically conductive layers 46. Alternatively, the metallic barrier layer 46A may be omitted.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44, and sidewalls of the insulating layers 32 may be physically exposed. A backside cavity 79' is present within each backside trench 79.

In one embodiment, each of the electrically conductive layers 46 may be formed with a hammerhead-shaped vertical cross-sectional profile. In one embodiment, the vertical extent of each of the electrically conductive layers 46 may have a local minimum LM within a cylindrical volume laterally bounded by outer sidewall segments of the memory opening fill structure 58 that contact the insulating layers 32.

In one embodiment, the local minimum LM may be located between a first cylindrical plane CP1 including outer sidewalls of a vertical stack of tubular composite dielectric spacers 51' within a memory opening fill structure 58 and a second cylindrical plane CP2 including inner sidewalls of the vertical stack of tubular composite dielectric spacers 51'. In one embodiment, the local minimum LM may be located along a continuous closed shape (such as a circle or an ellipse) that is equidistant from the first cylindrical plane CP1 in a plan view along a vertical direction.

In one embodiment, each of the electrically conductive layers 46 is spaced from the dielectric metal oxide blocking dielectric layer 52A by a respective backside blocking dielectric layer 44. In one embodiment, each of the backside blocking dielectric layers 44 contacts a respective pair of tubular composite dielectric spacers 51' within the vertical stack of tubular composite dielectric spacers 41'. Alternatively, the backside blocking dielectric 44 may be omitted. In one embodiment, the maximum vertical extent of one, a plurality, or each, of the electrically conductive layers 46 within the cylindrical volume is greater than the vertical extent of a horizontally-extending portion of the one, the plurality, or each, of the electrically conductive layers 46 located outside the cylindrical volume and having a uniform thickness along a vertical direction.

Figure 16G:
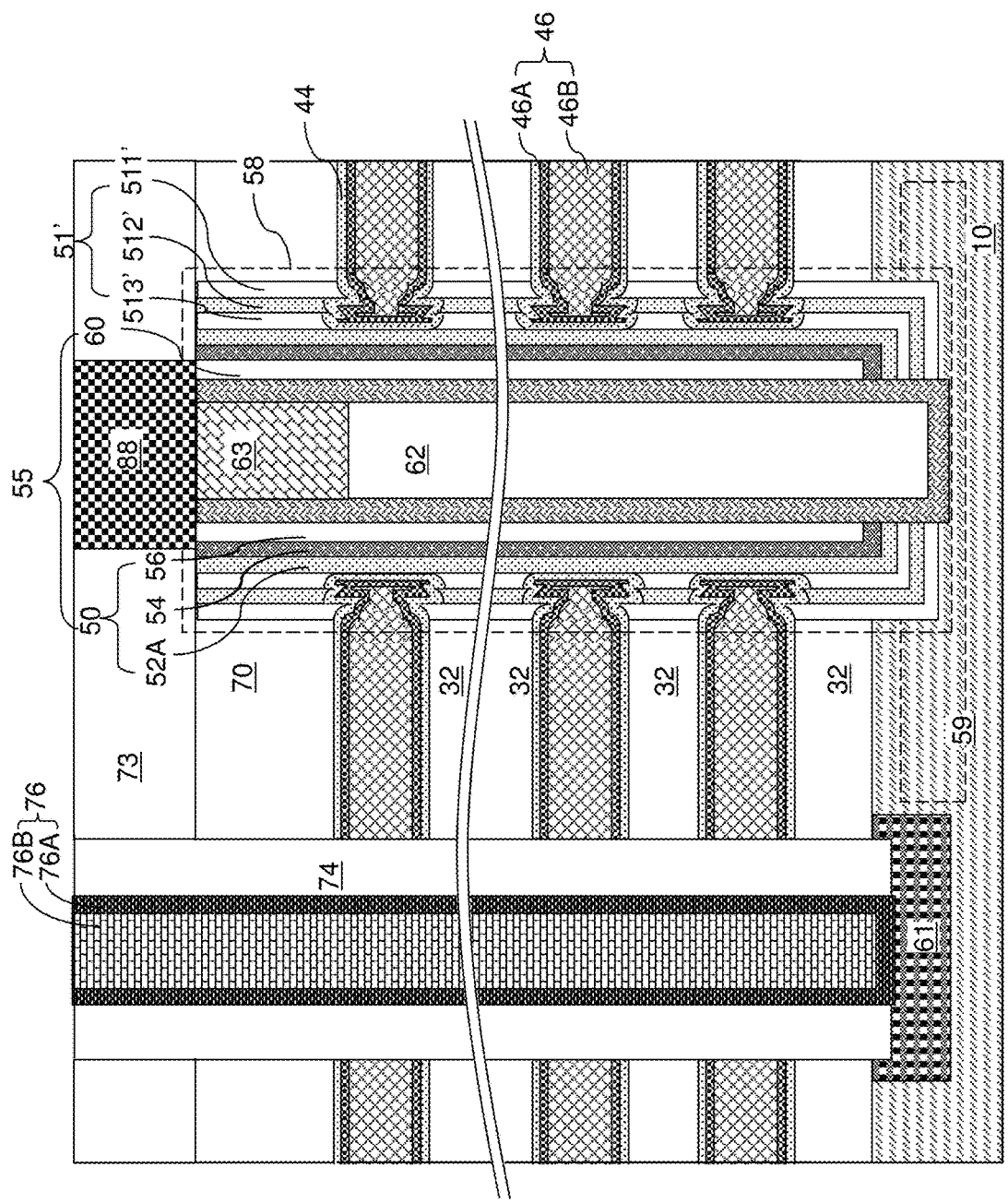

Referring to FIG. 16G, the processing steps of FIG. 10 can be performed to form an insulating spacer 74 and a backside contact via structure 76 in each of the backside trenches 79. The processing steps of FIGS. 11A and 11B can be performed to form various additional contact via structures (88, 86, 8P). For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

According to an aspect of the present disclosure, a third exemplary structure according to a third embodiment of the present disclosure may be derived from the first exemplary structure of FIGS. 4A, 4B, and 5A by alternating components of each memory opening fill structure 58. FIGS. 17A-17H are sequential schematic vertical cross-sectional views of a memory opening 49 within the third exemplary structure during formation of a memory opening fill structure 58 therein according to the third embodiment of the present disclosure.

Referring to FIG. 17A, each memory opening 49 within the second exemplary structure may be the same as the memory opening 49 illustrated in FIG. 5A at a processing step that corresponds to the processing steps of FIGS. 4A, 4B, and 5A.

Referring to FIG. 17B, a composite dielectric spacer layer 51 is formed on the physically exposed surfaces of each memory opening 49 and each support opening 19 and over the top surface of the insulating cap layer 70. In one embodiment, the composite dielectric spacer layer 51 comprises a layer stack that includes a silicon oxide spacer layer 511 (which is also referred to as an outer silicon oxide spacer layer) and a dielectric metal oxide spacer layer 512. The silicon oxide spacer layer 511 and the dielectric metal oxide spacer layer 512 may be sequentially deposited by a respective conformal deposition process. The conformal deposition processes employed to deposit the silicon oxide spacer layer 511 and the dielectric metal oxide spacer layer 512 may comprise at least one low pressure chemical vapor deposition process and/or at least one atomic layer deposition process.

The silicon oxide spacer layer 511 may have the same material composition and the same thickness range as the first silicon oxide spacer layer 511 of the second exemplary structure. The dielectric metal oxide spacer layer 512 may have the same material composition and the same thickness range as in the second exemplary structure.

Referring to FIG. 17C, a stack of layers including a silicon oxide blocking dielectric layer 52S, a memory material layer 54, a dielectric material liner 56, and an optional sacrificial cover material layer (not illustrated) can be sequentially deposited in the memory openings 49 by a respective conformal deposition process. Each of the silicon oxide blocking dielectric layer 52S, the memory material layer 54, the dielectric material liner 56, and the optional sacrificial cover material layer may have the same material composition and the same thickness range as in the first exemplary structure illustrated in FIG. 5C. The silicon oxide blocking dielectric layer 52S may be deposited directly on the composite dielectric spacer layer 51, and the memory material layer 54 may be deposited directly on the silicon oxide blocking dielectric layer 52S.

Referring to FIG. 17D, at least one anisotropic etch process may be performed to sequentially etch horizontally-extending portions of the optional sacrificial cover material layer (if present), the dielectric material liner 56, the memory material layer 54, the silicon oxide blocking dielectric layer 52S, and the composite dielectric spacer layer 51. A surface of the semiconductor material layer 10 can be physically exposed underneath each opening through the layer stack (51, 52S, 54, 56) at the bottom of a respective memory opening 49. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance.

A set of a silicon oxide blocking dielectric layer 52S, a memory material layer 54, and a dielectric material liner 56 in a memory opening 49 constitutes a memory film 50. In one embodiment, the memory film 50 may include a plurality of charge storage regions (comprising portions of the memory material layer 54) that are insulated from surrounding materials by the silicon oxide blocking dielectric layer 52S or by the dielectric material liner 56. In one embodiment, the dielectric material liner 56, the memory material layer 54, the silicon oxide blocking dielectric layer 52S, and the composite dielectric spacer layer 51 can have vertically coincident sidewalls around an opening through the memory film 50 at the bottom of each memory opening 49.

Figures 17E, 17F:
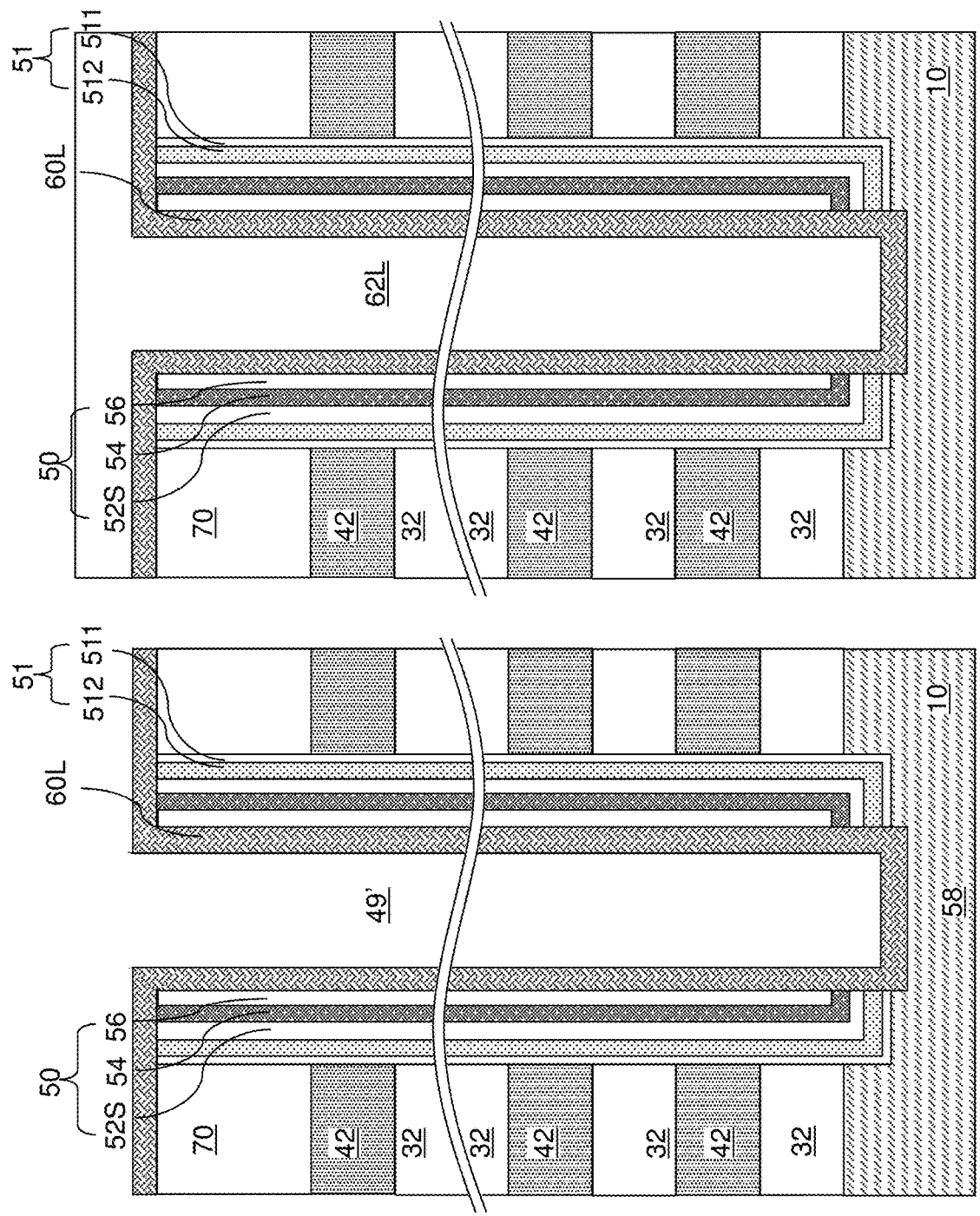

Referring to FIG. 17E, a semiconductor channel layer 60L can be deposited directly on the semiconductor surface of the semiconductor material layer 10, and directly on the dielectric material liner 56. The material composition and the thickness range of the semiconductor channel layer 60L may be the same as in the first exemplary structure.

Referring to FIG. 17F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 17G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 17H, the processing steps of FIG. 5H may be performed to form a vertical semiconductor channel 60 and a drain region 63 within each memory opening 49.

A dielectric material liner 56 is surrounded by a memory material layer 54, and laterally surrounds a portion of the vertical semiconductor channel 60. Each adjoining set of a silicon oxide blocking dielectric layer 52S, a memory material layer 54, and a dielectric material liner 56 collectively constitute a memory film 50, which can store electrical charges or ferroelectric polarization with a macroscopic retention time. According to an embodiment of the present disclosure, the memory film 50 comprises a silicon oxide blocking dielectric layer 52S that is formed directly on the inner cylindrical sidewall of the composite dielectric spacer layer 51.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements as embodied as portions of the memory material layer 54, and a silicon oxide blocking dielectric layer 52S. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. In one embodiment, the memory opening fill structure 58 comprises a composite dielectric spacer layer 51, a silicon oxide blocking dielectric layer 52S, a memory material layer 54, an optional dielectric material liner 56, a vertical semiconductor channel 60, a dielectric core 62, and a drain region 63.

Generally, an instance of a memory opening fill structure 58 illustrated in FIG. 17H can be formed within each memory opening 49 of the structure of FIGS. 4A and 4B. An instance of the support pillar structure can be formed within each support opening 19 of the structure of FIGS. 4A and 4B. Generally, the composite dielectric spacer layer 51 comprises a stack of a silicon oxide spacer layer 511 and a dielectric metal oxide spacer layer 512. The memory film 50 may be formed by sequentially depositing a silicon oxide blocking dielectric layer 52S, a memory material layer 54 (which may comprise a charge storage layer), and dielectric material liner 56 (such as a tunneling dielectric layer) over the dielectric metal oxide spacer layer 512.

Figure 18A:
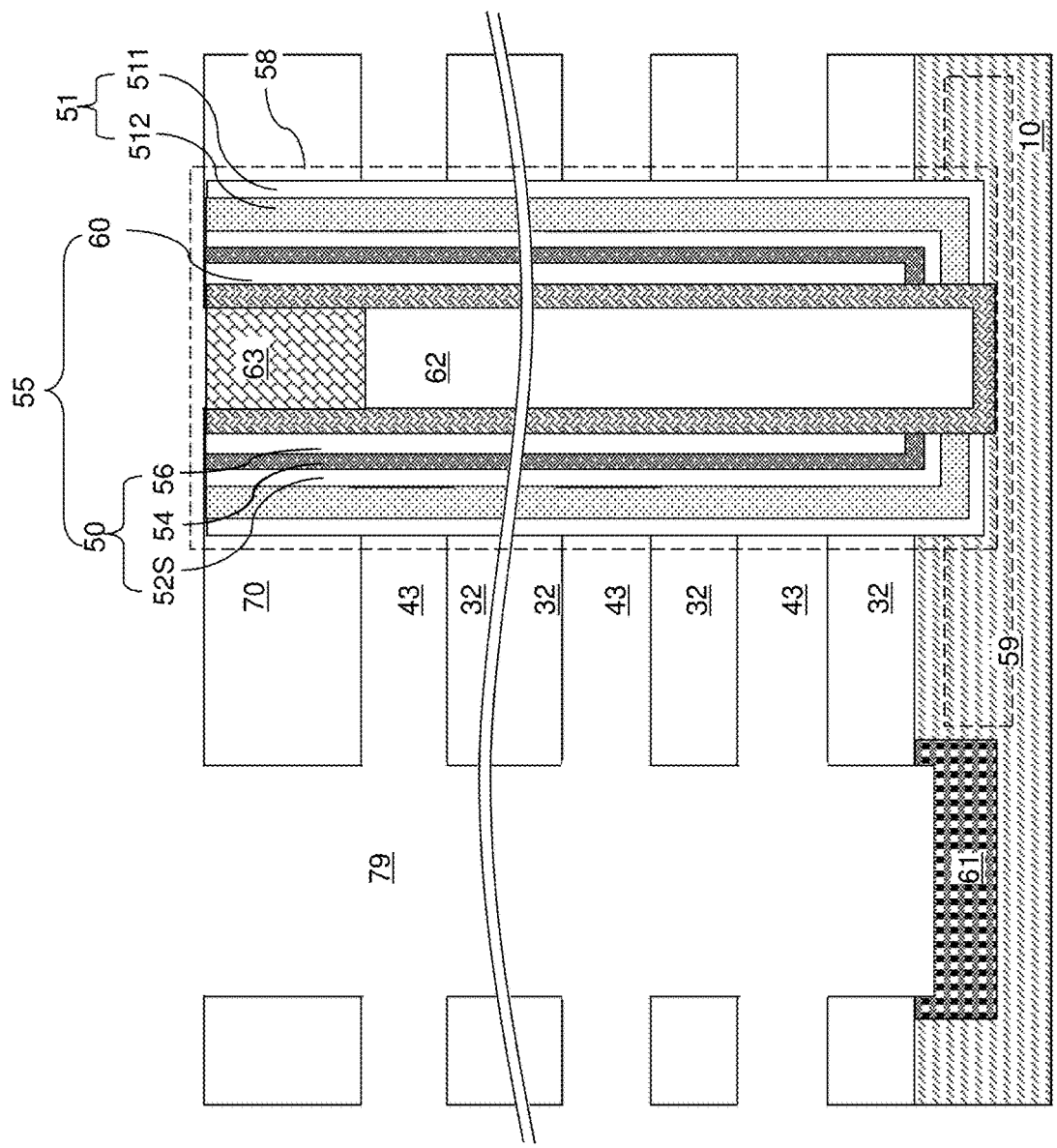
FIGS. 18A-18E are sequential vertical cross-sectional views of a region of the third exemplary structure during formation of electrically conductive layers and contact via structures according to the third embodiment of the present disclosure.

Subsequently, the processing steps of FIGS. 7A-7C and the processing steps of FIGS. 8 and 9A can be performed to provide the third exemplary structure illustrated in FIG. 18A. Generally, the backside recesses 43 can be formed by removing the sacrificial material layers 42 selective to the insulating layers 32 and the silicon oxide spacer layer 511. In one embodiment, the etch process that removes the second material selective to the first material and the silicon oxide spacer layer 511 may be the same as the etch process described above with reference to FIGS. 8 and 9A.

Figure 18B:
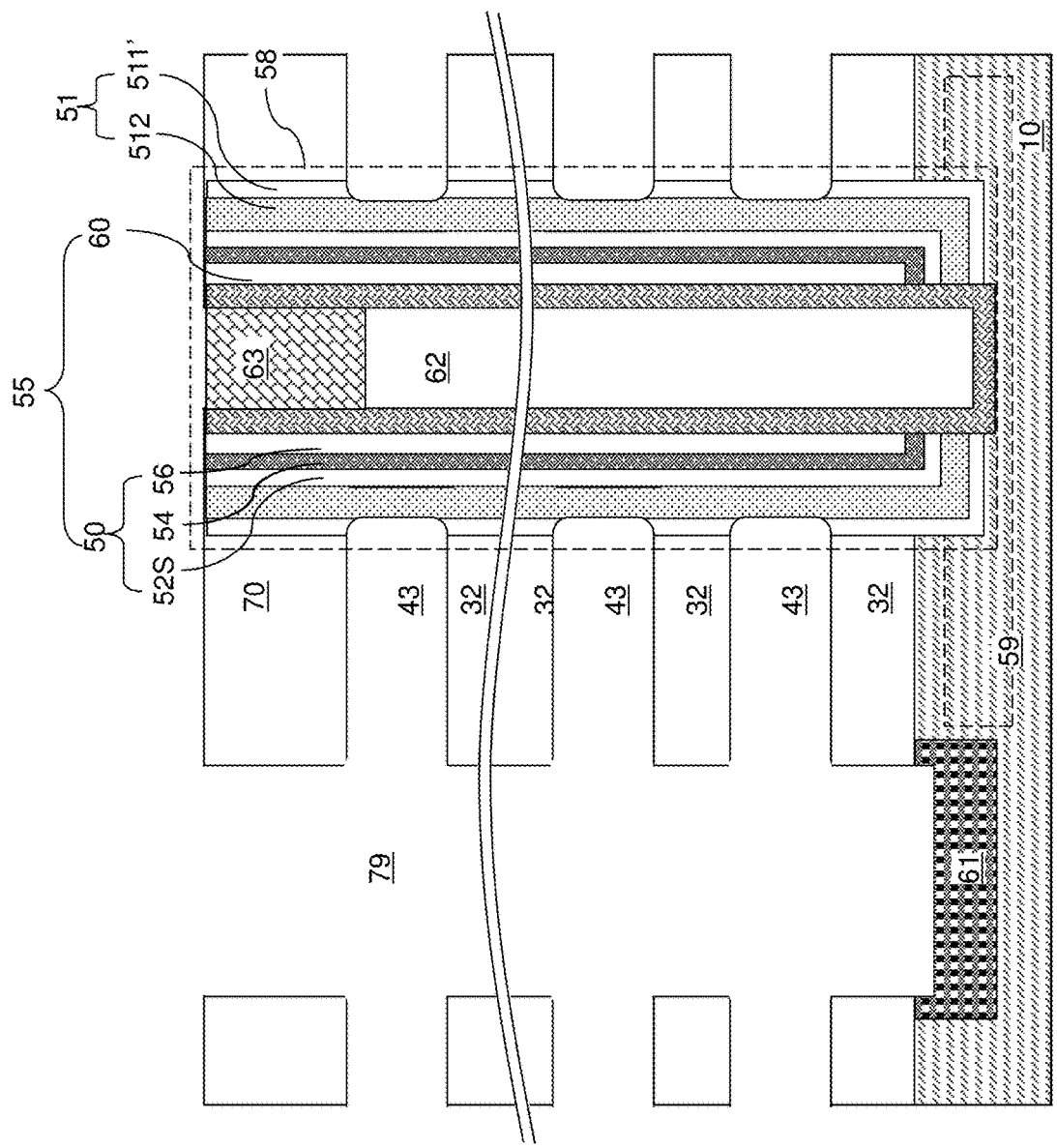

Referring to FIG. 18B, a first isotropic etch process can be performed to isotropically etch the silicon oxide material of the portions of the silicon oxide spacer layer 511 located around the backside recesses 43. The first isotropic etch process etches silicon oxide selective to the material of the dielectric metal oxide spacer layer 512. The duration of the first isotropic etch process can be selected such that cylindrical segments of the outer sidewall of the dielectric metal oxide spacer 512 are physically exposed around the backside recesses 43. The recess distance of the first isotropic etch process into the silicon oxide spacer layer 511 may be in a range from 100% to 130% of the thickness of the silicon oxide spacer layer 511. Surface portions of the insulating layers 32, the insulating cap layer 70, and the contact-level dielectric layer 73 may be collaterally recessed during the first isotropic etch process. In an illustrative example, the first isotropic etch process may comprise a wet isotropic etch process employing dilute hydrofluoric acid.

The backside recesses 43 are expanded into the composite dielectric spacer layer 51 around the memory film 50. The silicon oxide spacer layer 511 can be divided into a vertical stack of tubular silicon oxide spacers 511' having a uniform thickness and having at least one tapered concave annular surface. A subset of the tubular silicon oxide spacers 511' may comprise a respective tapered concave top annular surface and a respective tapered concave bottom annular surface.

Figure 18C:
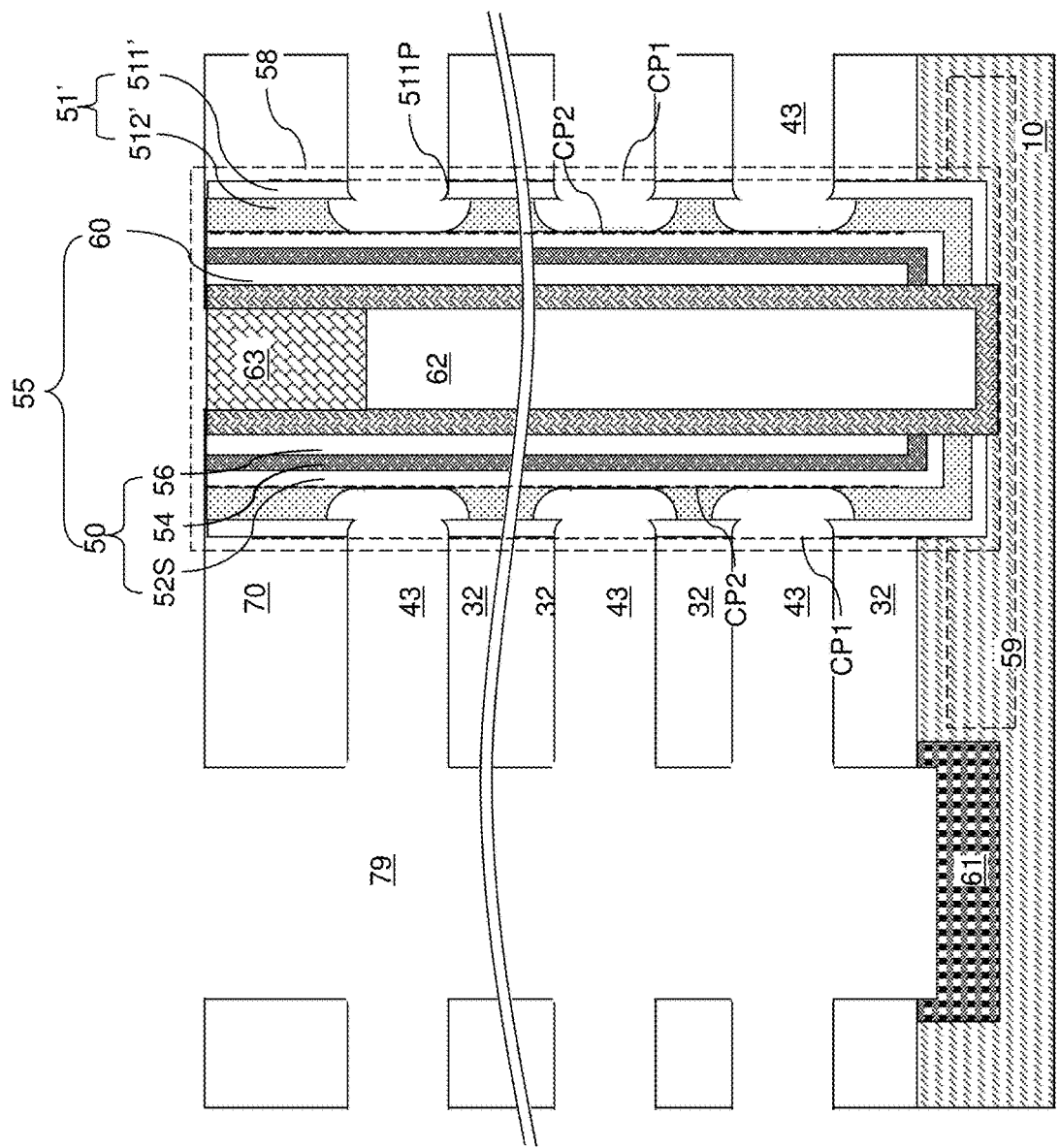

Referring to FIG. 18C, a second isotropic etch process can be performed to isotropically etch the dielectric metal oxide material of the portions of the dielectric metal oxide spacer layer 512 located around the backside recesses 43. The second isotropic etch process etches the dielectric metal oxide material of the dielectric metal oxide spacer layer 512 selective to the silicon oxide material of the tubular silicon oxide spacers 511' and selective to the materials of the insulating layers 32, the insulating cap layer 70, and the contact-level dielectric layer 73. The duration of the second isotropic etch process can be selected such that cylindrical segments of the outer sidewall of the memory film 50 are physically exposed around the backside recesses 43. The recess distance of the second isotropic etch process into the dielectric metal oxide spacer layer 512 may be in a range from 100% to 200% of the thickness of the dielectric metal oxide spacer layer 512. In an illustrative example, the second isotropic etch process may comprise a wet isotropic etch process employing hot phosphoric acid.

The backside recesses 43 are expanded through the composite dielectric spacer layer 51 around the memory film 50. The dielectric metal oxide spacer layer 512 can be divided into a vertical stack of tubular dielectric metal oxide spacers 512' having a uniform thickness and having at least one tapered concave annular surface. A subset of the tubular dielectric metal oxide spacers 512' may comprise a respective tapered concave top annular surface and a respective tapered concave bottom annular surface. In one embodiment, the vertical extent of each backside recess 43 between a vertically neighboring pair of tubular dielectric metal oxide spacers 512' may be greater than the vertical extent of the horizontally-extending portion of the respective backside recess 43 between a vertically neighboring pair of insulating layers 32.

Each contiguous set of a tubular silicon oxide spacer 511' and a tubular dielectric metal oxide spacer 512' constitutes a tubular composite dielectric spacer 51'. Generally, the composite dielectric spacer layer 51 can be divided into a vertical stack of tubular composite dielectric spacers 51' by a combination of isotropic etch processes, such as the combination of the first isotropic etch process and the second isotropic etch process. The vertical stack of tubular composite dielectric spacers 51' laterally surrounds the memory film 50, which may comprise a layer stack of a silicon oxide blocking dielectric layer 52S, a memory material layer 54 (which may comprise a charge storage layer), and a dielectric material liner 56 (which may comprise a tunneling dielectric layer).

The cylindrical plane including the outer sidewalls of the vertical stack of tubular composite dielectric spacers 51' is herein referred to as a first cylindrical plane CP1. The cylindrical plane including the inner sidewalls of the vertical stack of tubular composite dielectric spacers 51' is herein referred to as a second cylindrical plane CP2. According to an aspect of the present disclosure, each tubular silicon oxide spacer 511' within the vertical stack of tubular composite dielectric spacers 51' may have a variable vertical extent that increases with a lateral distance from the first cylindrical plane CP1. In one embodiment, each tubular dielectric metal oxide spacer 512' within the vertical stack of tubular composite dielectric spacers 512' has a variable vertical extent that increases with a lateral distance from the first cylindrical plane CP1.

In one embodiment, the memory film 50 may comprise a layer stack including a tunneling dielectric layer (comprising the dielectric material liner 56) in contact with the vertical semiconductor channel 60, a charge storage layer (comprising the memory material layer 54) in contact with the tunneling dielectric layer, and a silicon oxide blocking dielectric layer 52S in contact with the charge storage layer 54 and with the vertical stack of tubular composite dielectric spacers 51'.

In one embodiment, a vertical cross-sectional profile of a tubular composite dielectric spacer 51' within the vertical stack of tubular composite dielectric spacers 51' comprises a serrated top surface including a concave top surface segment of a tubular silicon oxide spacer 511' of the tubular silicon oxide spacers 511', and a concave top surface segment of a tubular dielectric metal oxide spacer 512' of the tubular dielectric metal oxide spacers 512'. In one embodiment, the serrated top surface comprises a first vertical surface segment (which is a first cylindrical surface segment) of the tubular silicon oxide spacer 511' connecting the concave top surface segment of the tubular silicon oxide spacer 511' and the concave top surface segment of the tubular dielectric metal oxide spacer 512'.

In one embodiment, the vertical cross-sectional profile of a tubular composite dielectric spacer 51' within the vertical stack of tubular composite dielectric spacers 51' comprises a serrated bottom surface including a concave bottom surface segment of a tubular silicon oxide spacer 511' of the tubular silicon oxide spacers 511', and a concave bottom surface segment of a tubular dielectric metal oxide spacer 512' of the tubular dielectric metal oxide spacers 512'. In one embodiment, the serrated bottom surface comprises a second vertical surface segment (which is a second cylindrical surface segment) of the tubular silicon oxide spacer 511' connecting the concave bottom surface segment of the tubular silicon oxide spacer 511' and the concave bottom surface segment of the tubular dielectric metal oxide spacer 512'.

Optionally, the second isotropic etching step may be performed in two sub-steps. In a first sub-step, the dielectric metal oxide spacer layer 512 is partially etched (i.e., part of the thickness of the dielectric metal oxide spacer layer 512 is etched) using hot phosphoric acid. Then an additional isotropic rounding etch process may be performed to round out or decrease the height of the protruding portions 511P of the tubular silicon oxide spacers 511'. The additional isotropic rounding etch may comprise a dilute hydrofluoric acid etch. Then the second sub-step of the second isotropic etching step is performed to etch through the entire thickness of the dielectric metal oxide spacer layer 512 to form the tubular dielectric metal oxide spacers 512'.

Figure 18D:
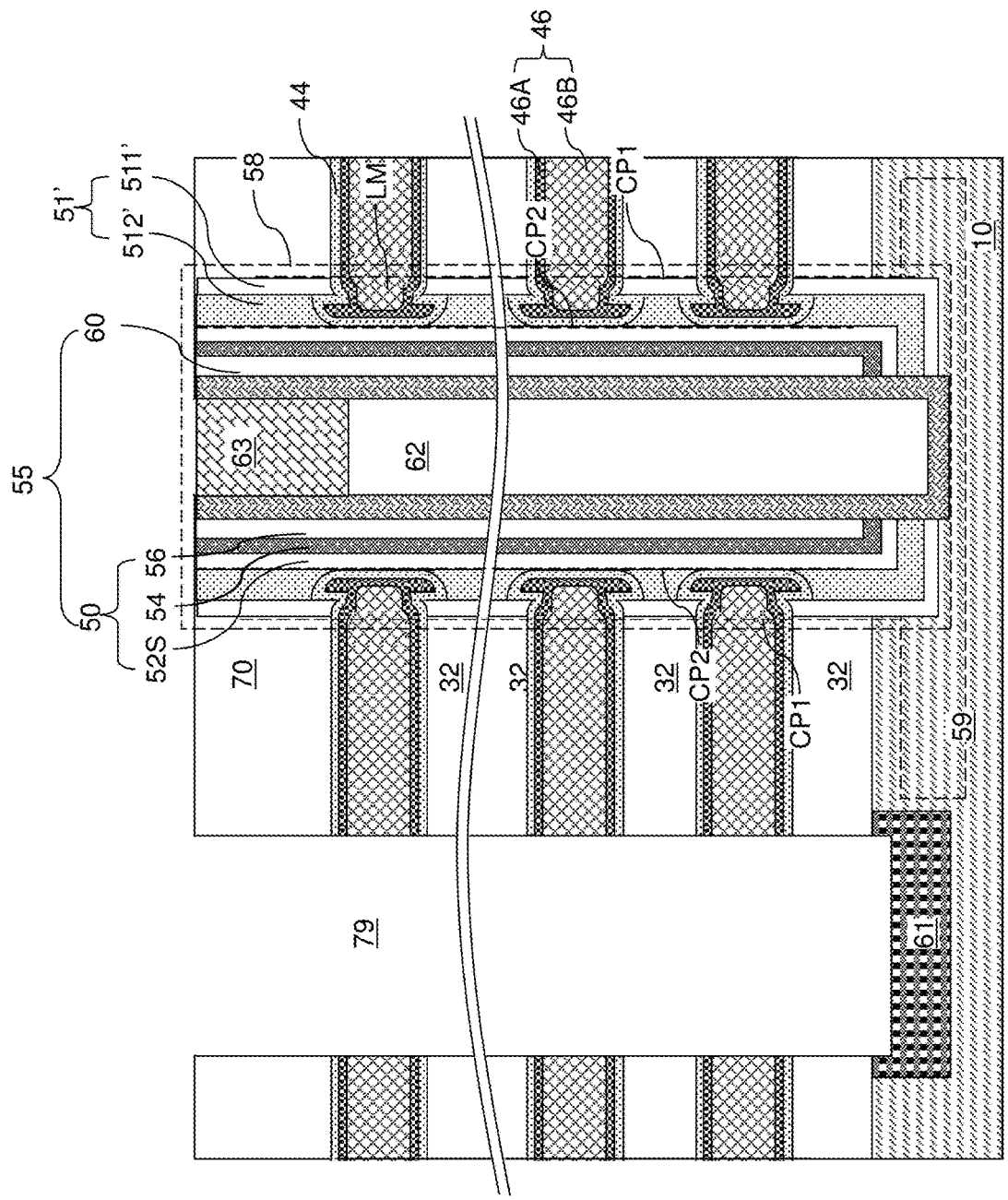

Referring to FIG. 18D, a backside blocking dielectric layer 44 can be optionally formed. The material composition and the thickness range of the backside blocking dielectric layer 44 may be the same as in the first exemplary structure.

Subsequently, the processing steps of FIGS. 9E, 9F, and 9G can be performed to sequentially deposit a metallic barrier layer 46A and a metallic fill material layer 46B, and to remove a continuous metallic material layer 46L from inside the backside trenches 79 and from above the insulating cap layer 70. Each remaining portion of the metallic barrier layer 46A and the metallic fill material layer 46B in the backside recesses 43 constitutes an electrically conductive layer 46. Each electrically conductive layer 46 can be a conductive line structure. Thus, the sacrificial material layers 42 are replaced with the electrically conductive layers 46.

In one embodiment, each of the electrically conductive layers 46 may be formed with a hammerhead-shaped vertical cross-sectional profile. In one embodiment, the vertical extent of each of the electrically conductive layers 46 may have a local minimum LM within a cylindrical volume laterally bounded by outer sidewall segments of the memory opening fill structure 58 that contact the insulating layers 32. In one embodiment, the local minimum LM may be located between a first cylindrical plane CP1 including outer sidewalls of a vertical stack of tubular composite dielectric spacers 51' within a memory opening fill structure 58 and a second cylindrical plane CP2 including inner sidewalls of the vertical stack of tubular composite dielectric spacers 51'. In one embodiment, the local minimum LM may be located along a continuous closed shape (such as a circle or an ellipse) that is equidistant from the first cylindrical plane CP1 in a plan view along a vertical direction.

In one embodiment, each of the electrically conductive layers 46 is spaced from the silicon oxide blocking dielectric layer 52S by a respective backside blocking dielectric layer 44. In one embodiment, each of the backside blocking dielectric layers 44 contacts a respective pair of tubular composite dielectric spacers 51' within the vertical stack of tubular composite dielectric spacers 41'. Alternatively, the backside blocking dielectric layer 44 may be omitted. In one embodiment, the maximum vertical extent of one, a plurality, or each, of the electrically conductive layers 46 within the cylindrical volume is greater than the vertical extent of a horizontally-extending portion of the one, the plurality, or each, of the electrically conductive layers 46 located outside the cylindrical volume and having a uniform thickness along a vertical direction.

Figure 18E:
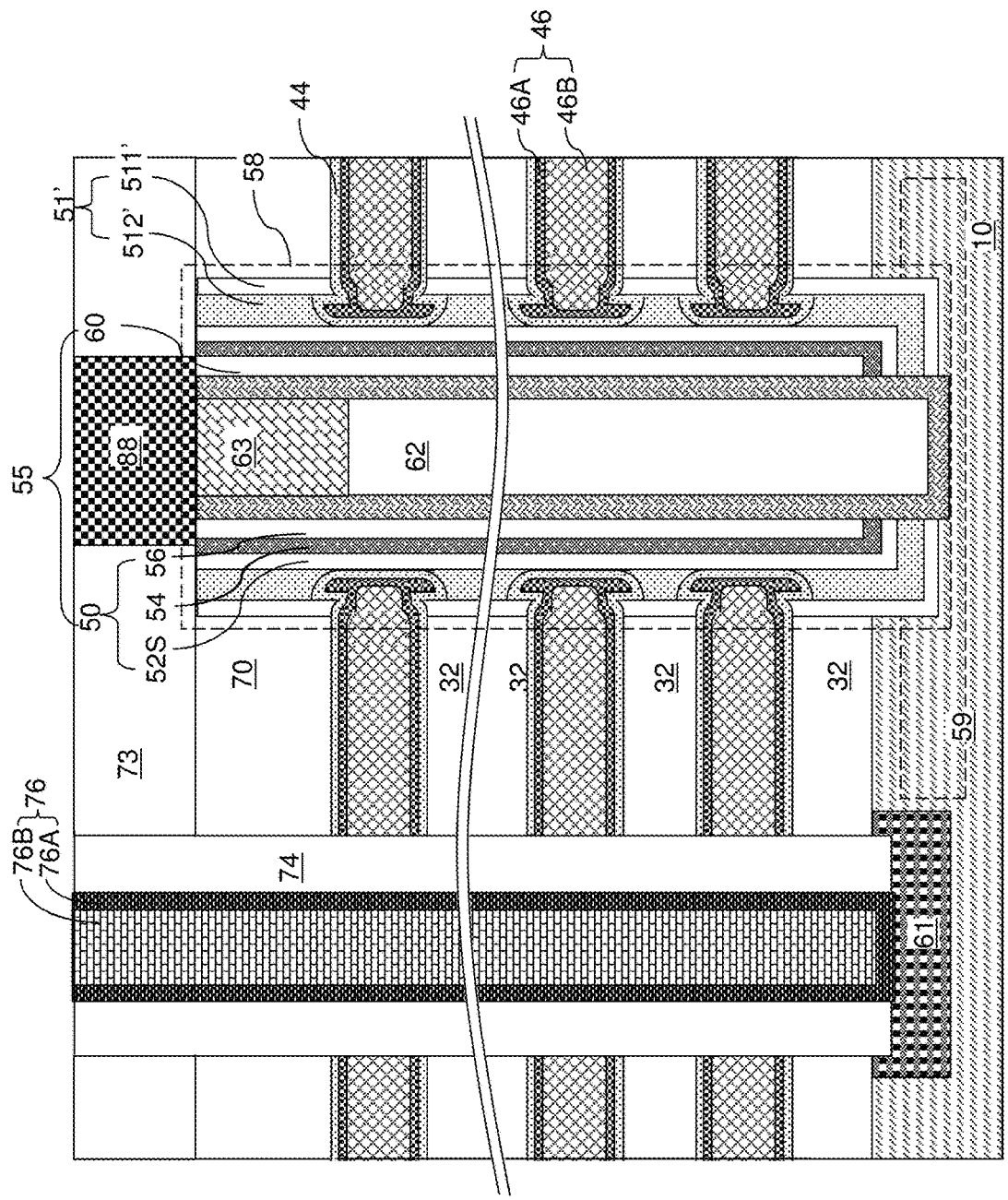

Referring to FIG. 18E, the processing steps of FIG. 10 can be performed to form an insulating spacer 74 and a backside contact via structure 76 in each of the backside trenches 79. The processing steps of FIGS. 11A and 11B can be performed to form various additional contact via structures (88, 86, 8P). For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring collectively to FIGS. 1-18E and according to various embodiments of the present disclosure, a semiconductor structure is provided, which comprises: an alternating stack of insulating layers 32 and electrically conductive layers 46; a memory opening 49 vertically extending through the alternating stack (32, 46); and a memory opening fill structure 58 located in the memory opening 49 and comprising a vertical semiconductor channel 60, a memory film 50 in contact with the vertical semiconductor channel 60, and a vertical stack of tubular composite dielectric spacers 51' laterally surrounding the memory film 50, wherein: each of the tubular composite dielectric spacers 51' comprises a respective tubular silicon oxide spacer 511' and a respective tubular dielectric metal oxide spacer 512'; and each of the electrically conductive layers 46 has a hammerhead-shaped vertical cross-sectional profile such that a vertical extent of each of the electrically conductive layers 46 has a local minimum LM within a cylindrical volume laterally bounded by outer sidewall segments of the memory opening fill structure 58.

The various embodiments of the present disclosure may be employed to provide control gate electrodes (i.e., portions of the electrically conductive layers 46) having decreased gate tip rounding and improved gate contact width. The memory cell diameter may be reduced and the memory cell shape may be controlled by the methods of the embodiments of the present disclosure. Furthermore, the bit density and effective gate length may be increased to improve device performance. Finally, the device yield and reliability may be improved by allowing a greater space between adjacent memory openings, which reduces defects caused by fluorine degassing during deposition of tungsten electrically conductive layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
    an alternating stack of insulating layers and electrically conductive layers;
    a memory opening vertically extending through the alternating stack; and
    a memory opening fill structure located in the memory opening and comprising a vertical semiconductor channel, a memory film in contact with the vertical semiconductor channel, and a vertical stack of tubular composite dielectric spacers laterally surrounding the memory film, wherein:
    each of the tubular composite dielectric spacers comprises a respective tubular silicon oxide spacer and a respective tubular dielectric metal oxide spacer; and
    each of the electrically conductive layers has a hammerhead-shaped vertical cross-sectional profile such that a vertical extent of each of the electrically conductive layers has a local minimum within a cylindrical volume laterally bounded by outer sidewall segments of the memory opening fill structure.

2. The semiconductor structure of claim 1, wherein the local minimum is located between a first cylindrical plane including outer sidewalls of the vertical stack of tubular composite dielectric spacers and a second cylindrical plane including inner sidewalls of the vertical stack of tubular composite dielectric spacers.

3. The semiconductor structure of claim 2, wherein the local minimum is located along a continuous closed shape that is equidistant from the first cylindrical plane in a plan view along a vertical direction.

4. The semiconductor structure of claim 2, wherein each tubular silicon oxide spacer within the vertical stack of tubular composite dielectric spacers has a variable vertical extent that increases with a lateral distance from the first cylindrical plane.

5. The semiconductor structure of claim 2, wherein each tubular dielectric metal oxide spacer within the vertical stack of tubular composite dielectric spacers has a variable vertical extent that increases with a lateral distance from the first cylindrical plane.

6. The semiconductor structure of claim 1, wherein each of the tubular composite dielectric spacers comprises a respective additional tubular silicon oxide spacer in contact with an outer sidewall of the memory film.

7. The semiconductor structure of claim 6, wherein the memory film comprises a layer stack including a tunneling dielectric layer in contact with the vertical semiconductor channel, a charge storage layer in contact with the tunneling dielectric layer, and a dielectric metal oxide blocking dielectric layer in contact with the charge storage layer and with the vertical stack of tubular composite dielectric spacers.

8. The semiconductor structure of claim 1, wherein each of the each of the tubular composite dielectric spacers is in contact with a respective first cylindrical segment of an outer sidewall of the memory film.

9. The semiconductor structure of claim 8, wherein each of the electrically conductive layers is spaced from the dielectric metal oxide blocking dielectric layer by a respective backside blocking dielectric layer that contacts a respective second cylindrical segment of the outer sidewall of the memory film.

10. The semiconductor structure of claim 1, wherein a vertical cross-sectional profile of a tubular composite dielectric spacer within the vertical stack of tubular composite dielectric spacers comprises:
    a serrated top surface including a concave top surface segment of a tubular silicon oxide spacer of the tubular silicon oxide spacers and a concave top surface segment of a tubular dielectric metal oxide spacer of the tubular dielectric metal oxide spacers; and
    a serrated bottom surface including a concave bottom surface segment of the tubular silicon oxide spacer and a concave bottom surface segment of the tubular dielectric metal oxide spacer.

11. The semiconductor structure of claim 10, wherein:
the serrated top surface comprises a first vertical surface segment of the tubular silicon oxide spacer connecting the concave top surface segment of the tubular silicon oxide spacer and the concave top surface segment of the tubular dielectric metal oxide spacer; and
the serrated bottom surface comprises a second vertical surface segment of the tubular silicon oxide spacer connecting the concave bottom surface segment of the tubular silicon oxide spacer and the concave bottom surface segment of the tubular dielectric metal oxide spacer.

12. The semiconductor structure of claim 1, wherein each of the electrically conductive layers is spaced from the dielectric metal oxide blocking dielectric layer by a respective backside blocking dielectric layer.

13. The semiconductor structure of claim 1, wherein the memory film comprises a layer stack including a tunneling dielectric layer in contact with the vertical semiconductor channel, a charge storage layer in contact with the tunneling dielectric layer, and a silicon oxide blocking dielectric layer in contact with the charge storage layer and with the vertical stack of tubular composite dielectric spacers.

14. The semiconductor structure of claim 1, wherein a maximum vertical extent of one of the electrically conductive layers within the cylindrical volume is greater than a vertical extent of a horizontally-extending portion of the one of the electrically conductive layers located outside the cylindrical volume and having a uniform thickness along a vertical direction.

* * * * *